(12) United States Patent
Kimura

(10) Patent No.: US 8,461,582 B2
(45) Date of Patent: Jun. 11, 2013

(54) SEMICONDUCTOR DEVICE AND METHOD FOR MANUFACTURING THE SAME

(75) Inventor: Hajime Kimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 478 days.

(21) Appl. No.: 12/711,674

(22) Filed: Feb. 24, 2010

(65) Prior Publication Data
US 2010/0224872 A1    Sep. 9, 2010

(30) Foreign Application Priority Data

Mar. 5, 2009 (JP) .................................. 2009-051857

(51) Int. Cl.
*H01L 29/10* (2006.01)

(52) U.S. Cl.
USPC ........................ 257/43; 257/347; 257/E21.462

(58) Field of Classification Search
USPC .................................... 257/43, 347, E21.462
See application file for complete search history.

(56) References Cited

U.S. PATENT DOCUMENTS

| | | | |
|---|---|---|---|
| 5,162,901 A | 11/1992 | Shimada et al. | |
| 5,731,856 A | 3/1998 | Kim et al. | |
| 5,744,864 A | 4/1998 | Cillessen et al. | |
| 5,818,549 A | 10/1998 | Maruyama et al. | |
| 5,847,410 A | 12/1998 | Nakajima | |
| 6,294,274 B1 | 9/2001 | Kawazoe et al. | |
| 6,469,317 B1 | 10/2002 | Yamazaki et al. | |
| 6,563,174 B2 | 5/2003 | Kawasaki et al. | |
| 6,586,346 B1 | 7/2003 | Yamazaki et al. | |
| 6,727,522 B1 | 4/2004 | Kawasaki et al. | |
| 6,737,306 B2 | 5/2004 | Yamazaki et al. | |
| 6,887,742 B2 | 5/2005 | Baek et al. | |
| 6,960,812 B2 | 11/2005 | Yamazaki et al. | |
| 7,038,740 B1 | 5/2006 | Katsuya | |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Jerome Jackson, Jr.
*Assistant Examiner* — Dale E Page
(74) *Attorney, Agent, or Firm* — Eric J. Robinson; Robinson Intellectual Property Law Office, P.C.

(57) ABSTRACT

A semiconductor device includes a substrate having an insulating surface; a light-transmitting first electrode provided over the substrate; a light-transmitting second electrode provided over the substrate; a light-transmitting semiconductor layer provided so as to be electrically connected to the first electrode and the second electrode; a first wiring electrically connected to the first electrode; an insulating layer provided so as to cover at least the semiconductor layer; a light-transmitting third electrode provided over the insulating layer in a region overlapping with the semiconductor layer; and a second wiring electrically connected to the third electrode.

17 Claims, 44 Drawing Sheets

U.S. PATENT DOCUMENTS

| | | |
|---|---|---|
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,301,211 B2 | 11/2007 | Yamazaki et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,456,430 B1 | 11/2008 | Yamazaki et al. |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,566 B2 | 10/2009 | Sakakura et al. |
| 7,674,650 B2 | 3/2010 | Akimoto et al. |
| 7,732,819 B2 | 6/2010 | Akimoto et al. |
| 7,741,641 B2 | 6/2010 | Bae et al. |
| 7,863,607 B2 | 1/2011 | Lee et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0250308 A1 | 11/2005 | Yamaguchi et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0102907 A1 | 5/2006 | Lee et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0146592 A1 | 6/2007 | Kimura |
| 2007/0152217 A1 | 7/2007 | Lai et al. |
| 2007/0172591 A1 | 7/2007 | Seo et al. |
| 2007/0187678 A1* | 8/2007 | Hirao et al. .................. 257/43 |
| 2007/0187760 A1 | 8/2007 | Furuta et al. |
| 2007/0194379 A1 | 8/2007 | Hosono et al. |
| 2007/0215945 A1 | 9/2007 | Tokunaga |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0203387 A1 | 8/2008 | Kang et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0065771 A1 | 3/2009 | Iwasaki et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0160741 A1 | 6/2009 | Inoue et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0025678 A1 | 2/2010 | Yamazaki et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0140613 A1 | 6/2010 | Kimura |
| 2010/0224878 A1 | 9/2010 | Kimura |
| 2010/0224880 A1 | 9/2010 | Kimura |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-082221 | 3/1990 |
| JP | 02-310536 | 12/1990 |
| JP | 03-231472 A | 10/1991 |
| JP | 05-251705 A | 9/1993 |
| JP | 06-095142 | 4/1994 |
| JP | 07-092491 | 4/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 | 4/2004 |
| JP | 2004-273614 A | 9/2004 |
| JP | 2004-273732 A | 9/2004 |
| JP | 2007-073703 A | 3/2007 |
| JP | 2007-081362 | 3/2007 |
| JP | 2007-096055 A | 4/2007 |
| JP | 2007-109918 | 4/2007 |
| JP | 2007-115807 | 5/2007 |
| JP | 2007-123700 | 5/2007 |
| JP | 2007-123861 A | 5/2007 |
| JP | 2007-133371 A | 5/2007 |
| JP | 2007-250983 A | 9/2007 |
| JP | 2007-299913 | 11/2007 |
| JP | 2008-243928 | 10/2008 |
| WO | WO-2004/114391 | 12/2004 |
| WO | WO-2007/119386 | 10/2007 |
| WO | WO-2007/119727 | 10/2007 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In-Ga-Zn-O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the $In_2O_3$-$Ga_2ZnO_4$-$ZnO$ system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$-$ZnGa_2O_4$-$ZnO$ System", Journal of Solid State Chemistry, Apr. 1, 1995, vol. 116, No. 1, pp. 170-178.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MoO3 As a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:the "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In-Ga-Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In-Ga-Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In-Ga-Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga-Zn-Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YbFe$_2$O$_4$, and Yb$_2$Fe$_3$O$_7$ Types of Structures for Compounds in the In$_2$O$_3$ and Sc$_2$O$_3$-A$_2$O$_3$-Bo Systems [A; Fe, Ga, or Al; B: Mg, Mn, Fe, Ni, Cu,Or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO$_4$,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO$_3$(ZnO)m (m<4):a Zn 4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO$_3$ With Sputtered Al$_2$O$_3$ Gate Insulator,", Appl. Phys. Lett.(Applied Physics Letters), Sep. 1, 2003, vol. 83, No. 9, pp. 1755-1757.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Nomura et al., "Thin-Film Transistor Fabricated in Single-Crystalline Transparent Oxide Semiconductor," Science, May 23, 2003, vol. 300, No. 5623, pp. 1269-1272.

Ito et al., "Application of Transparent Amorphous Oxide TFT to Electronic Paper," IDW '08: Proceedings of the 15th International Display Workshops, Dec. 3, 2008, pp. 1617-1620.

Ikeda et al., "The Effect of Introducing Metal Bus Electrode into Fully Transparent TFT Array for Color Electronic Paper," IDW '08: Proceedings of the 15th International Display Workshops, Dec. 3, 2008, pp. 231-232.

* cited by examiner

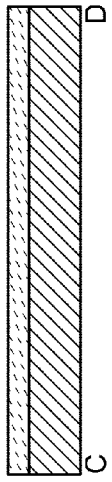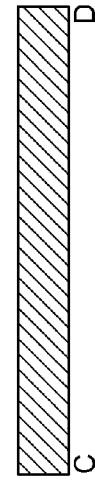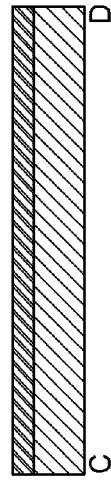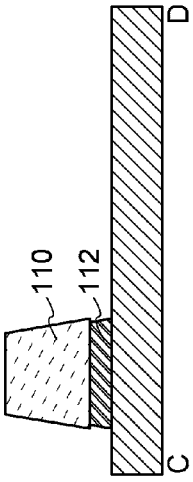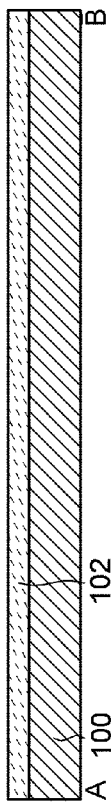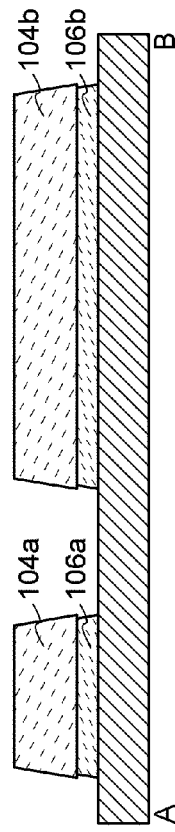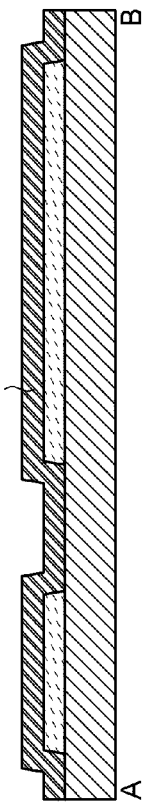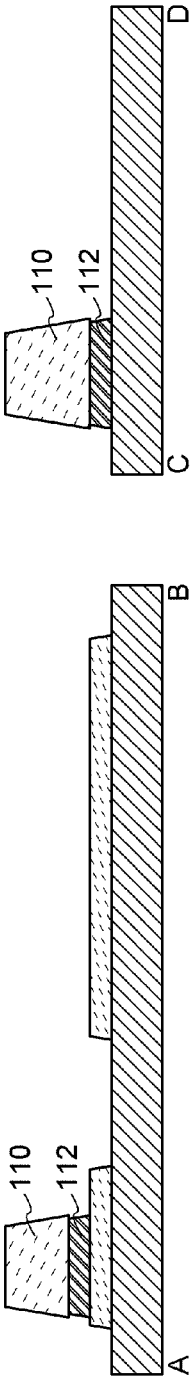

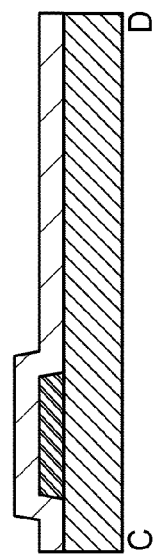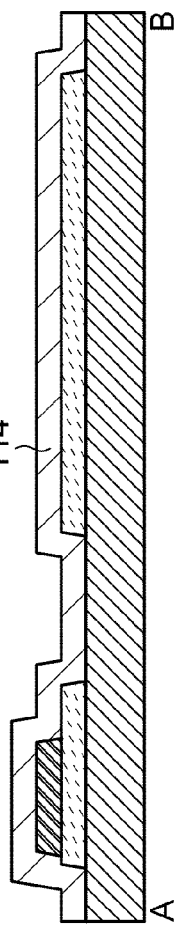
FIG. 3A2
FIG. 3A1
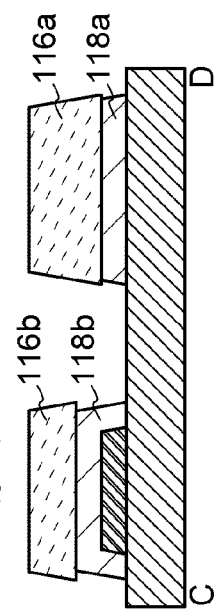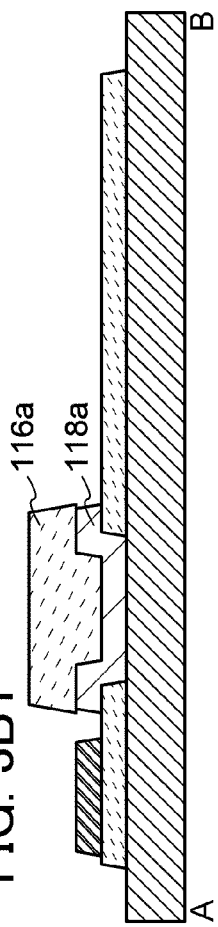
FIG. 3B2
FIG. 3B1
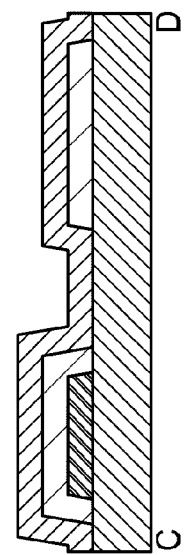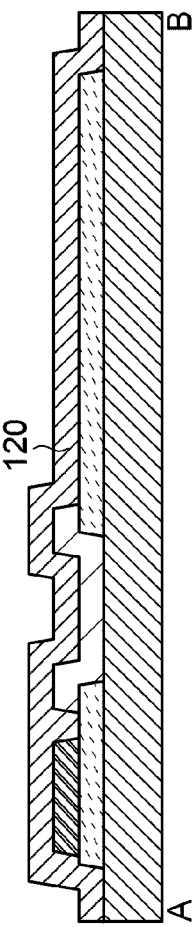
FIG. 3C2
FIG. 3C1
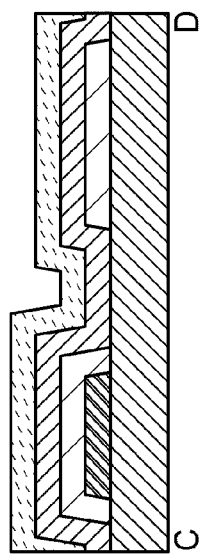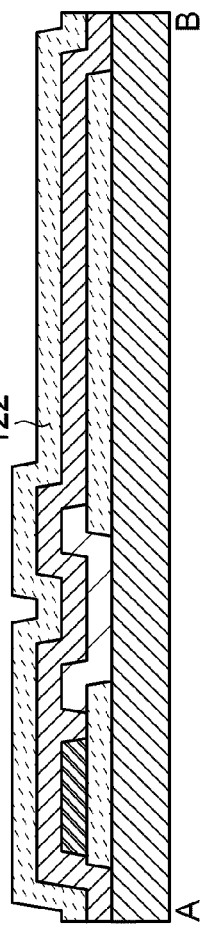
FIG. 3D2
FIG. 3D1

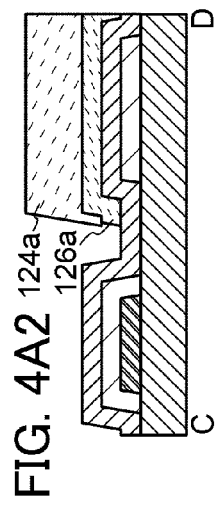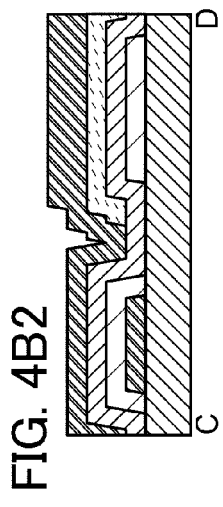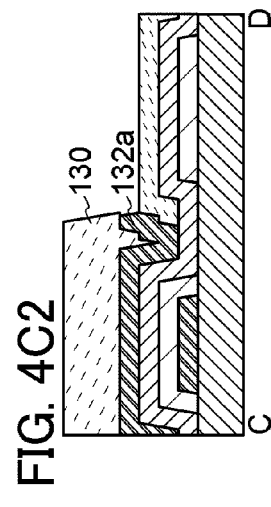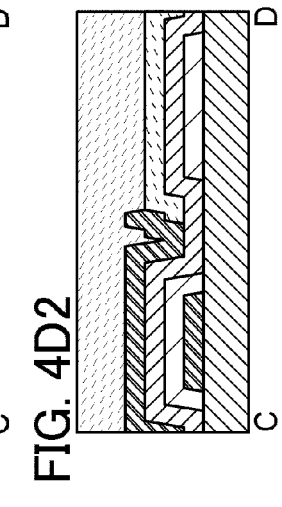

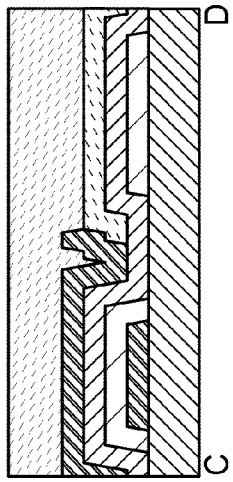
FIG. 5A1
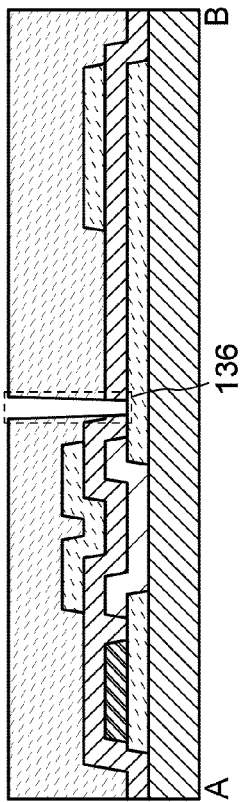
FIG. 5A2
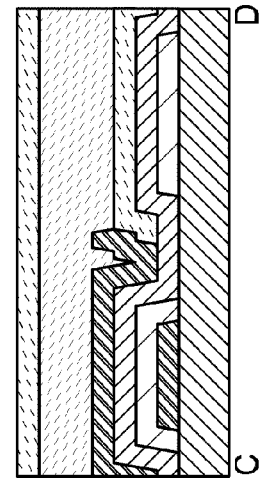
FIG. 5B1
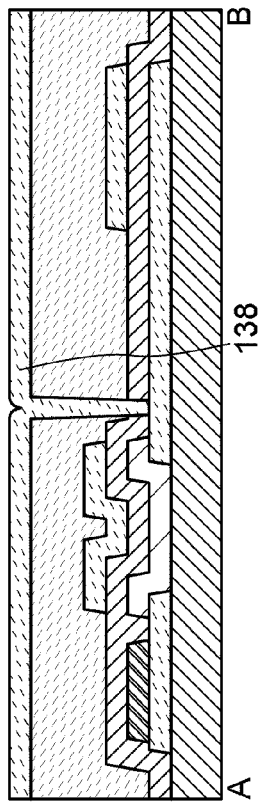
FIG. 5B2
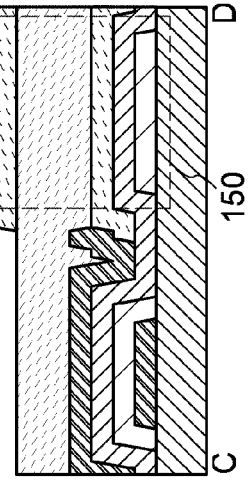
FIG. 5C1
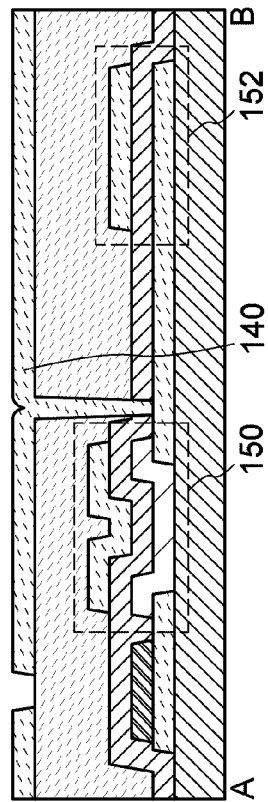
FIG. 5C2

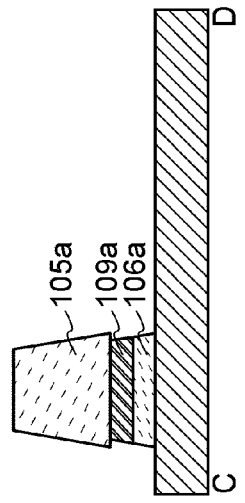
FIG. 13A2
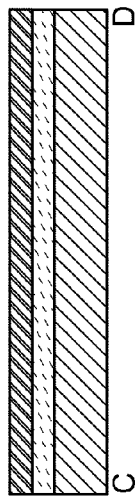
FIG. 13A1
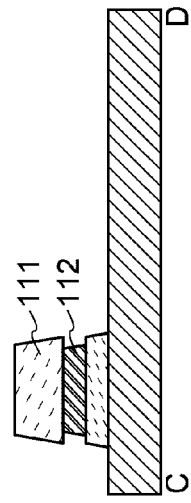
FIG. 13B2
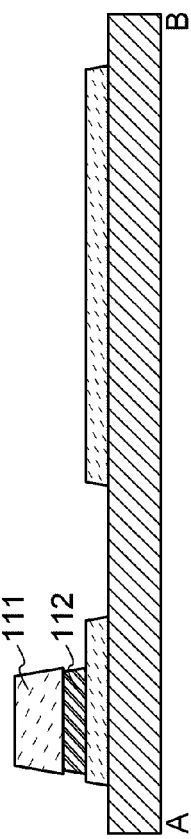
FIG. 13B1
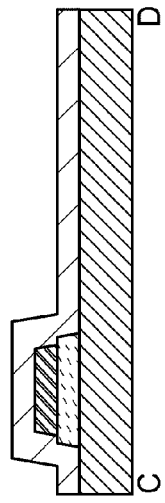
FIG. 13C2
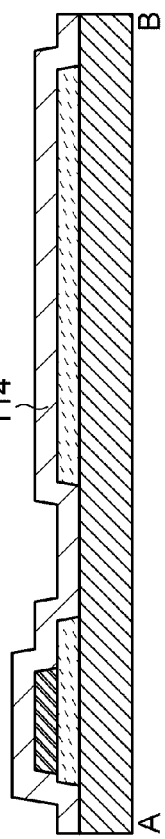
FIG. 13C1
FIG. 13D2
FIG. 13D1
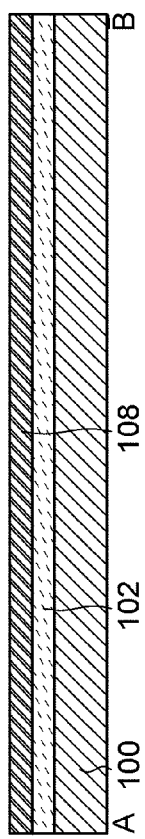
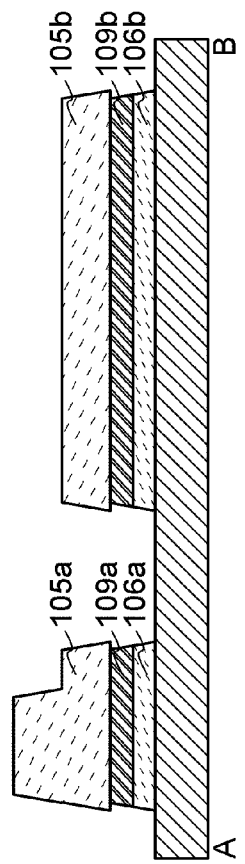

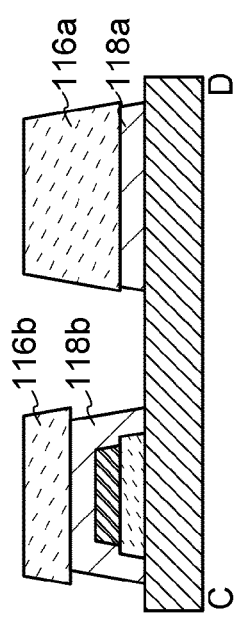
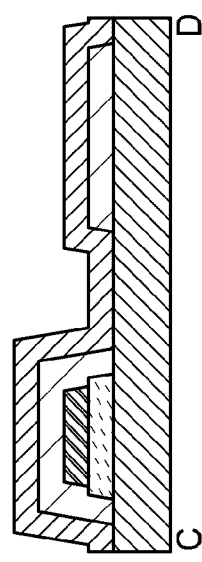
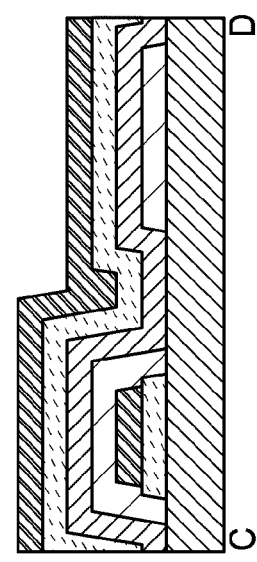
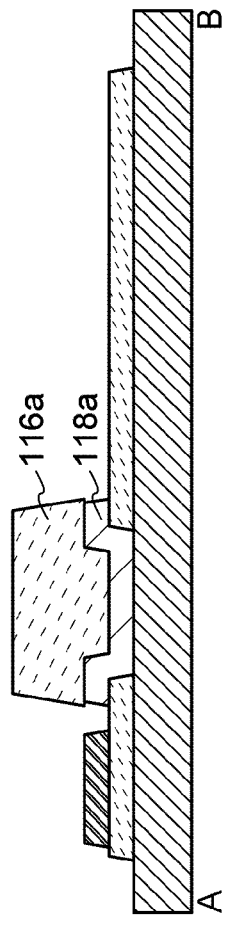
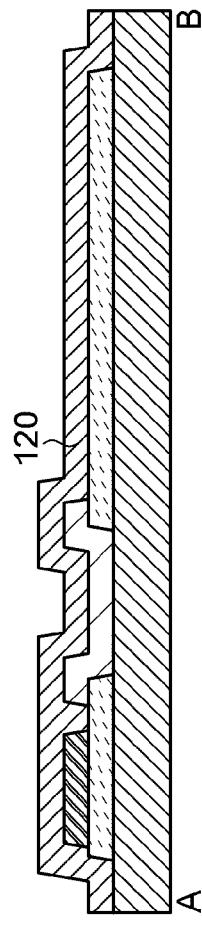
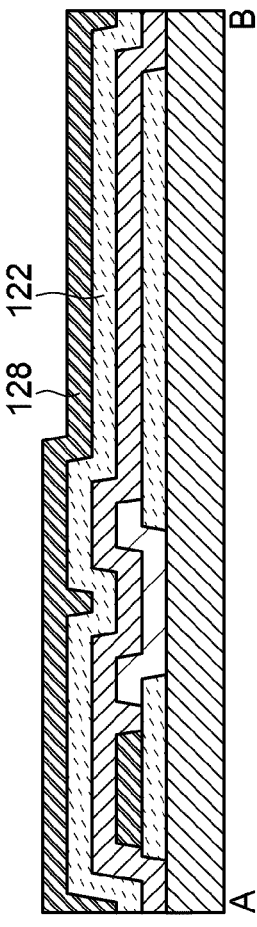

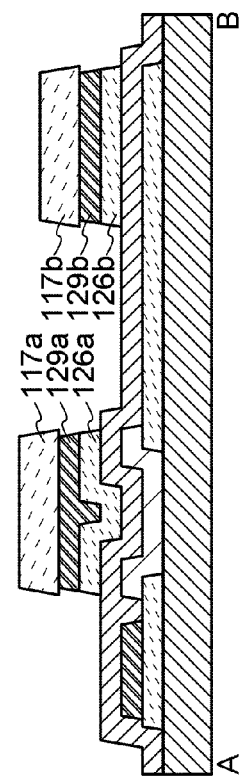
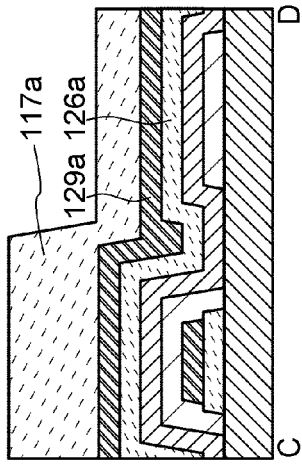
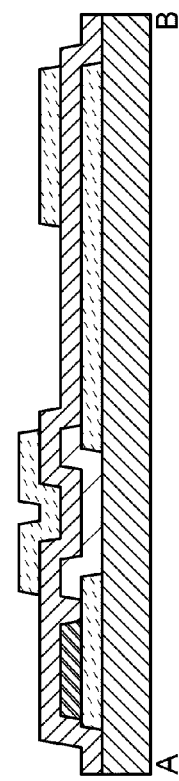
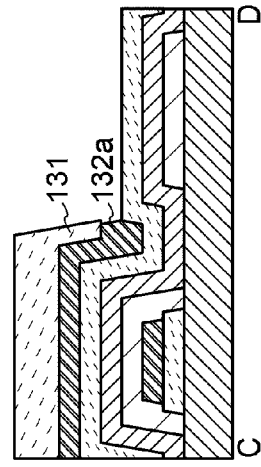
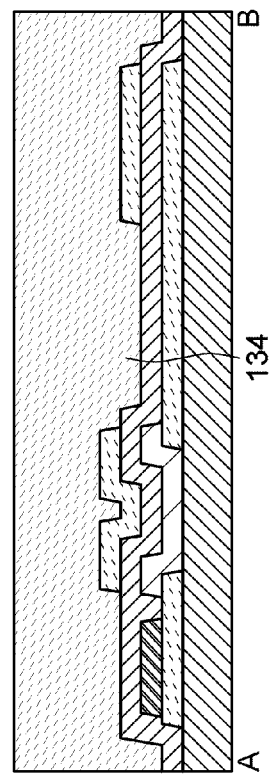
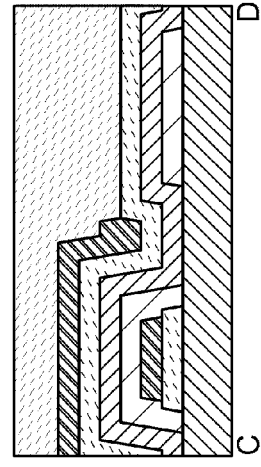

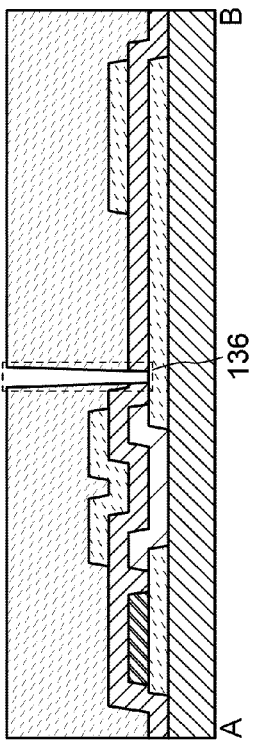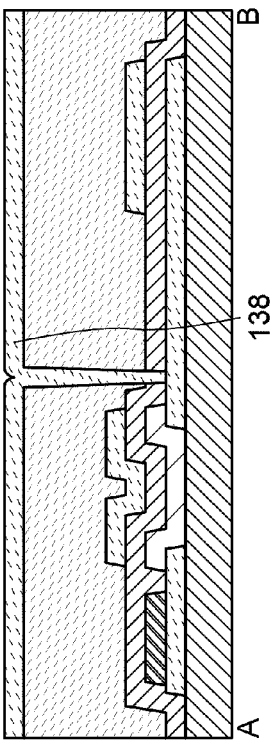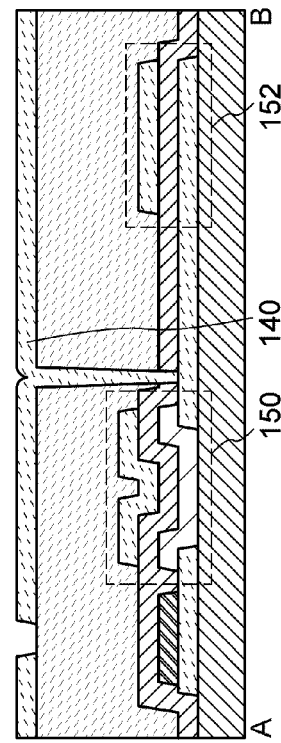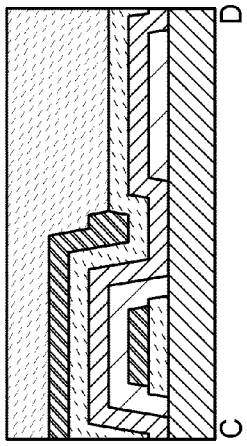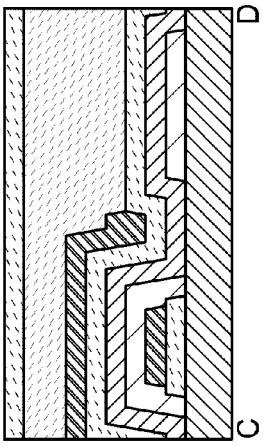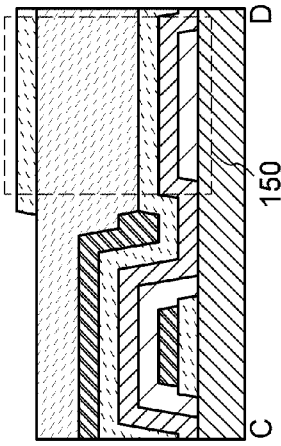

FIG. 17A1
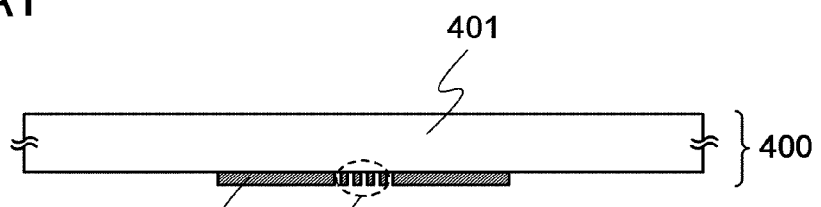
FIG. 17A2
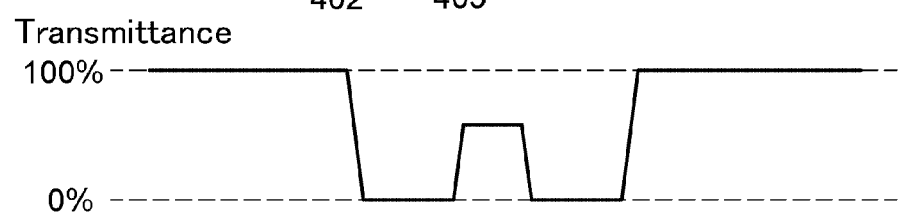
FIG. 17B1
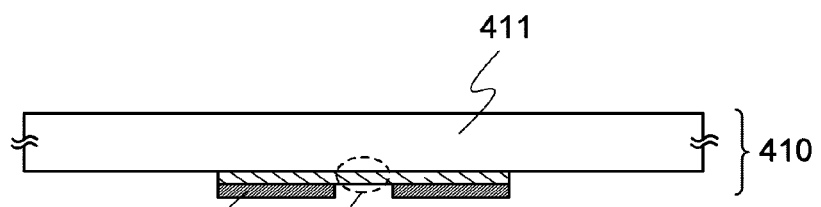
FIG. 17B2
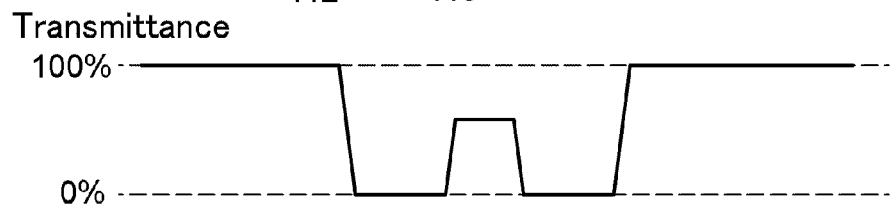

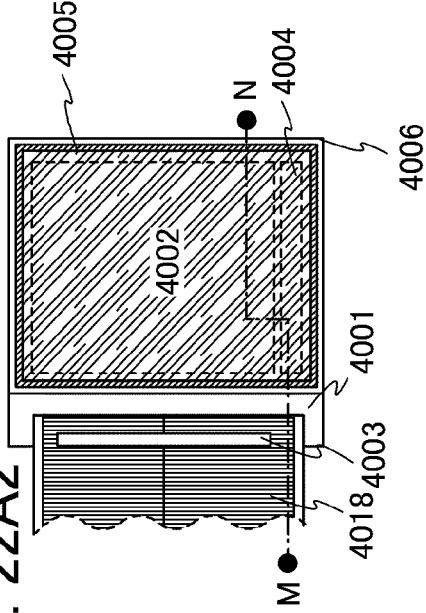
FIG. 22A1
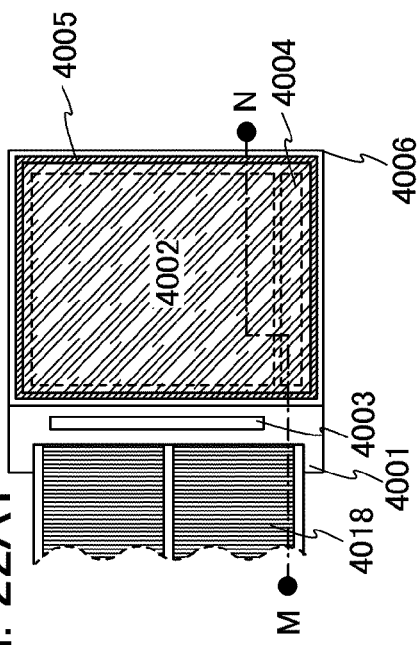
FIG. 22A2
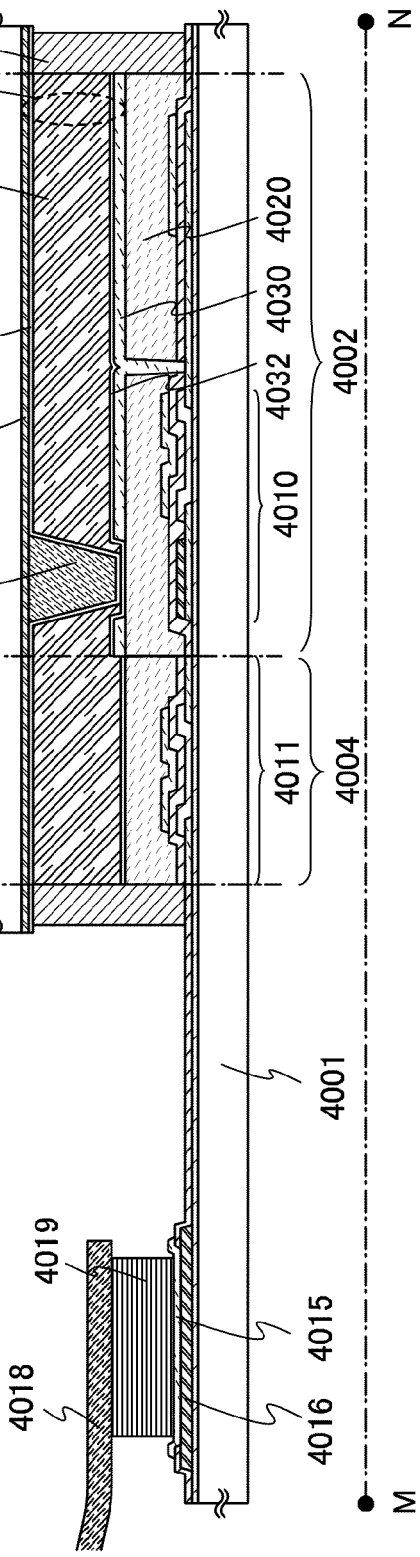
FIG. 22B

Transistor in Driver Circuit Portion | Transistor in Pixel Portion

Transistor in Driver Circuit Portion | Transistor in Pixel Portion 134a 134b

140

SEMICONDUCTOR DEVICE AND METHOD FOR MANUFACTURING THE SAME

BACKGROUND OF THE INVENTION

1. Field of the Invention

The technical field relates to a semiconductor device, a display device, a light-emitting device, and a method for manufacturing these devices. The technical field particularly relates to a semiconductor device including a thin film transistor (hereinafter also referred to as a TFT) using an oxide semiconductor.

2. Description of the Related Art

In recent years, thin film transistors (TFTs) in which a silicon layer of amorphous silicon or the like is used as a channel layer have been widely used as switching elements in display devices typified by liquid crystal display devices. Although the field-effect mobility is low, a thin film transistor using amorphous silicon has an advantage in responding to increase in size of glass substrate.

Moreover, attention has been recently drawn to a technique by which a thin film transistor is manufactured using a metal oxide with semiconductor characteristics and such a transistor is applied to an electronic device or an optical device. For example, it is known that some metal oxides such as tungsten oxide, tin oxide, indium oxide, and zinc oxide have semiconductor characteristics. A thin film transistor in which a transparent semiconductor layer formed of such a metal oxide is used as a channel formation region is disclosed (e.g., see Patent Document 1).

Furthermore, a technique has been considered to increase the aperture ratio in such a manner that a channel layer of a transistor is formed of a light-transmitting oxide semiconductor layer and a gate electrode, a source electrode, and a drain electrode are formed of a transparent conductive film with a light-transmitting property (e.g., see Patent Document 2).

Increase in aperture ratio increases the light use efficiency, and reduction in power and size of a display device can be achieved. Meanwhile, in terms of increase in size and application to portable devices of display devices, further reduction in power consumption as well as increase in aperture ratio is required.

As a method for placing a metal auxiliary wiring for a transparent electrode of an electro-optic element, a method is known in which a metal auxiliary wiring and a transparent electrode are placed to overlap with each other so that the auxiliary wiring is brought into conduction with the transparent electrode above or below the transparent electrode (e.g., see Patent Document 3).

A structure is known in which an additional capacitance electrode provided for an active matrix substrate is formed of a transparent conductive film of ITO, $SnO_2$, or the like and an auxiliary wiring formed of a metal film is provided in contact with the additional capacitance electrode in order to reduce the electric resistance of the additional capacitance electrode (e.g., see Patent Document 4).

It is known that in an electric-field transistor using an amorphous oxide semiconductor film, a transparent electrode formed of indium tin oxide (ITO), indium zinc oxide, ZnO, $SnO_2$, or the like; a metal electrode formed of Al, Ag, Cr, Ni, Mo, Au, Ti, Ta, or the like; a metal electrode formed of an alloy containing any of the above elements; or the like can be used for a gate electrode, a source electrode, and a drain electrode, and two or more of such materials may be stacked to reduce the contact resistance or to increase the interface intensity (e.g., see Patent Document 5).

It is known that a metal such as indium (In), aluminum (Al), gold (Au), or silver (Ag); or an oxide material such as indium oxide ($In_2O_3$), tin oxide ($SnO_2$), zinc oxide (ZnO), cadmium oxide (CdO), indium cadmium oxide ($CdIn_2O_4$), cadmium tin oxide ($Cd_2SnO_4$), or zinc tin oxide ($Zn_2SnO_4$) can be used as materials for a source electrode, a drain electrode, and a gate electrode of a transistor using an amorphous oxide semiconductor and an auxiliary capacitance electrode, and the materials for the gate electrode, the source electrode, and the drain electrode may be the same or different from each other (e.g., see Patent Documents 6 and 7).

REFERENCE

Patent Document 1: Japanese Published Patent Application No. 2004-103957
Patent Document 2: Japanese Published Patent Application No. 2007-081362
Patent Document 3: Japanese Published Patent Application No. H2-082221
Patent Document 4: Japanese Published Patent Application No. H2-310536
Patent Document 5: Japanese Published Patent Application No. 2008-243928
Patent Document 6: Japanese Published Patent Application No. 2007-109918
Patent Document 7: Japanese Published Patent Application No. 2007-115807

SUMMARY OF THE INVENTION

In view of the above, an object of one embodiment of the invention disclosed in this specification and the like (at least including the specification, the scope of claims, and the drawings) is to provide a semiconductor device with high aperture ratio, to provide a semiconductor device with low power consumption, to provide a semiconductor device with low wiring resistance, to provide a semiconductor device in which distortion of signal waveforms is reduced, to provide a wiring with high conductivity, to provide a semiconductor device with high transmittance, to provide a semiconductor device having a large screen, to provide a semiconductor device in which increase in the number of steps for a process is suppressed, to provide a semiconductor device with high contrast, to provide a semiconductor device with high layout flexibility, or to provide a semiconductor device with low subthreshold swing value. Note that these objects do not deny the existence of other objects. Further, one embodiment of the disclosed invention is not necessary to achieve all the above objects.

In one embodiment of the invention disclosed in this specification and the like, a transistor is formed using a light-transmitting material. Further details are as follows.

One embodiment of the invention disclosed in this specification and the like is a semiconductor device including a substrate having an insulating surface; a first electrode (a source electrode) that has a light-transmitting property and is provided over the substrate; a second electrode (a drain electrode) that has a light-transmitting property and is provided over the substrate; a semiconductor layer that has a light-transmitting property and is provided so as to be electrically connected to the first electrode and the second electrode; a first wiring (a source wiring) electrically connected to the first electrode; an insulating layer (a gate insulating layer) provided so as to cover at least the semiconductor layer; a third electrode (a gate electrode) that has a light-transmitting property and is provided over the insulating layer in a region overlapping with the semiconductor layer; and a second wiring (a gate wiring) electrically connected to the third electrode.

Another embodiment of the invention disclosed in this specification and the like is a method for manufacturing a semiconductor device, including the steps of: stacking a first conductive layer having a light-transmitting property and a second conductive layer over a substrate having an insulating surface; forming a first mask over the second conductive layer; etching the first conductive layer to form a first electrode and a second electrode and etching the second conductive layer to form a third conductive layer, by using the first mask; recessing the first mask to form a second mask; etching the third conductive layer by using the second mask to form a first wiring; forming a semiconductor layer that has a light-transmitting property and is electrically connected to the first electrode and the second electrode; forming an insulating layer so as to cover the semiconductor layer; stacking a fourth conductive layer having a light-transmitting property and a fifth conductive layer over the insulating layer; forming a third mask over the fifth conductive layer; etching the fourth conductive layer to form a third electrode and etching the fifth conductive layer to form a sixth conductive layer, by using the third mask; recessing the third mask to form a fourth mask; and etching the sixth conductive layer by using the fourth mask to form a second wiring.

Note that in the above, a fourth electrode (a pixel electrode) that has a light-transmitting property and is electrically connected to the second electrode may be provided. Moreover, a fifth electrode (a capacitor electrode) which is provided in a region overlapping with part of the second electrode with the insulating layer therebetween and is formed by using the same layer as the third electrode; and a third wiring (a capacitor wiring) which is electrically connected to the fifth electrode and is formed by using the same layer as the second wiring may be provided.

In addition, in the above, the semiconductor layer is preferably formed using an oxide semiconductor containing indium, gallium, and zinc. Further, each of the first electrode, the second electrode, and the third electrode is preferably formed using any of indium tin oxide, indium tin oxide containing silicon oxide, organoindium, organotin, zinc oxide, titanium nitride, indium zinc oxide containing zinc oxide, a material obtained by adding gallium to zinc oxide, tin oxide, indium oxide containing tungsten oxide, indium zinc oxide containing tungsten oxide, indium oxide containing titanium oxide, and indium tin oxide containing titanium oxide.

Note that in the above, the first wiring and the second wiring preferably have a light-shielding property. Moreover, a layer formed by using the same layer as the semiconductor layer is provided at an intersection of the first wiring and the second wiring. Accordingly, the capacitance generated because wirings intersect each other can be reduced, so that distortion of signal waveforms can be suppressed. This is particularly effective in large semiconductor devices.

Note that an example of an oxide semiconductor which can be used in the invention disclosed in this specification and the like is an oxide semiconductor represented by $InMO_3(ZnO)_m$ (m>0). Here, M denotes one or more of metal elements selected from gallium (Ga), iron (Fe), nickel (Ni), manganese (Mn), and cobalt (Co). For example, the case where Ga is selected as M includes the case where only Ga is used and the case where the above metal element other than Ga is contained in addition to Ga, for example, a combination of Ga and Ni or a combination of Ga and Fe is used. Moreover, in the above oxide semiconductor, in some cases, a transition metal element such as Fe or Ni or an oxide of the transition metal is contained as an impurity element in addition to a metal element contained as M. In this specification and the like, among the above oxide semiconductors, an oxide semiconductor including at least gallium as M is referred to as an In—Ga—Zn—O-based oxide semiconductor and a thin film using the material is referred to as an In—Ga—Zn—O-based non-single-crystal film in some cases.

Further, in the above, by using a multi-tone mask, a light-transmitting region (a region with high transmittance) and a region without a light-transmitting property (a region with low transmittance) can be formed with one mask (reticle). Thus, increase in the number of masks can be suppressed.

Note that a semiconductor device in this specification and the like indicates general devices capable of functioning by utilizing semiconductor characteristics. Semiconductor circuits, display devices, electro-optic devices, light-emitting display devices, and electronic devices are all included in the category of the semiconductor device.

In addition, a display device in this specification and the like refers to an image display device, a light-emitting device, or a light source (including a lighting device).

Further, the display device also includes the following modules in its category: a module to which a connector such as an FPC (flexible printed circuit), a TAB (tape automated bonding) tape, or a TCP (tape carrier package) is attached; a module provided with a printed wiring board at an end of a TAB tape or a TCP; a module in which an integrated circuit (IC) is directly mounted on a display element by a COG (chip on glass) method, and the like.

Note that various types of switches can be used as a switch. Examples are an electrical switch and a mechanical switch. That is, there is no particular limitation on the kind of switch as long as it can control the flow of current. For example, a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), or the like can be used as a switch. Alternatively, a logic circuit combining such elements can be used as a switch.

As examples of mechanical switches, there is a switch formed by a micro electro mechanical system (MEMS) technology, such as a digital micromirror device (DMD). Such a switch includes an electrode which can be moved mechanically, and operates to control electrical connection or non-electrical-connection with the movement of the electrode.

When a transistor is used as a switch, the polarity (conductivity type) of the transistor is not particularly limited because it operates as a mere switch. Note that a transistor of polarity with smaller off-state current is preferably used when the off-state current should be small. Examples of a transistor with smaller off-state current are a transistor provided with an LDD region and a transistor with a multi-gate structure. Further, an n-channel transistor is preferably used when the transistor operates with a potential of a source terminal closer to a potential of a low potential side power supply (e.g., Vss, GND, or 0 V). On the other hand, a p-channel transistor is preferably used when the transistor operates with a potential of a source terminal close to a potential of a high potential side power supply (e.g., Vdd). This is because when the n-channel transistor operates with the potential of the source terminal close to a low potential side power supply or the p-channel transistor operates with the potential of the source terminal close to a high potential side power supply, an absolute value of a gate-source voltage can be increased; thus, the transistor can more precisely operate as a switch. Moreover, this is because reduction in output voltage does not often occur because the transistor does not often perform a source follower operation.

Note that a CMOS switch may be employed as a switch by using both n-channel and p-channel transistors. By employing a CMOS switch, the transistor can more precisely operate as a switch because a current can flow when either the p-channel transistor or the n-channel transistor is turned on. For example, even when a voltage of an input signal to a switch is high or low, an appropriate voltage can be output. Further, since a voltage amplitude value of a signal for turning on or off the switch can be made small, power consumption can be reduced.

Note that when a transistor is employed as a switch, the switch includes an input terminal (one of a source terminal and a drain terminal), an output terminal (the other of the source terminal and the drain terminal), and a terminal for controlling electrical conduction (a gate terminal). On the other hand, when a diode is employed as a switch, the switch does not have a terminal for controlling electrical conduction in some cases. Therefore, when a diode is used as a switch, the number of wirings for controlling terminals can be reduced as compared to the case of using a transistor.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, another element may be provided between elements having a connection relation illustrated in drawings and texts, without limitation on a predetermined connection relation, for example, the connection relation illustrated in the drawings and the texts.

For example, in the case where A and B are electrically connected, one or more elements which enable electrical connection between A and B (e.g., a switch, a transistor, a capacitor, an inductor, a resistor, and/or a diode) may be connected between A and B. In the case where A and B are functionally connected, one or more circuits which enable functional connection between A and B (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a dc-dc converter, a step-up dc-dc converter, or a step-down dc-dc converter) or a level shifter circuit for changing a potential level of a signal; a voltage source; a current source; a switching circuit; an amplifier circuit such as a circuit which can increase signal amplitude, the amount of current, or the like, an operational amplifier, a differential amplifier circuit, a source follower circuit, or a buffer circuit; a signal generation circuit; a memory circuit; and/or a control circuit) may be connected between A and B. For example, in the case where a signal output from A is transmitted to B even when another circuit is provided between A and B, A and B are functionally connected.

Note that when it is explicitly described that "A and B are electrically connected", the case where A and B are electrically connected (i.e., the case where A and B are connected with another element or another circuit therebetween), the case where A and B are functionally connected (i.e., the case where A and B are functionally connected with another circuit therebetween), and the case where A and B are directly connected (i.e., the case where A and B are connected without another element or another circuit therebetween) are included therein. That is, when it is explicitly described that "A and B are electrically connected", the description is the same as the case where it is explicitly only described that "A and B are connected".

Note that a display element, a display device which is a device including a display element, a light-emitting element, and a light-emitting device which is a device including a light-emitting element can employ a variety of modes and include a variety of elements. For example, a display element, a display device, a light-emitting element, and a light-emitting device can include a display medium whose contrast, luminance, reflectivity, transmittance, or the like changes by electromagnetic action, such as an EL (electroluminescence) element (e.g., an EL element containing organic and inorganic materials, an organic EL element, or an inorganic EL element), an LED (e.g., a white LED, a red LED, a green LED, or a blue LED), a transistor (a transistor which emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube. Note that examples of display devices using an EL element are an EL display; examples of display devices using an electron emitter are a field emission display (FED) and an SED (surface-conduction electron-emitter display) flat panel display; examples of display devices using a liquid crystal element are a liquid crystal display (e.g., a transmissive liquid crystal display, a transflective liquid crystal display, a reflective liquid crystal display, a direct-view liquid crystal display, and a projection liquid crystal display); and examples of display devices using electronic ink or an electrophoretic element are electronic paper.

An EL element is an element including an anode, a cathode, and an EL layer placed between the anode and the cathode. The EL layer can be, for example, a layer utilizing emission from a singlet exciton (fluorescence) or a triplet exciton (phosphorescence), a layer utilizing emission from a singlet exciton (fluorescence) and emission from a triplet exciton (phosphorescence), a layer containing an organic material or an inorganic material, a layer containing an organic material and an inorganic material, a layer containing a high molecular material or a low molecular material, and a layer containing a low molecular material and a high molecular material. Note that the EL element can include a variety of layers without limitation to those described above.

An electron emitter is an element in which electrons are extracted by high electric field concentration on a cathode. For example, the electron emitter can be any one of a Spindt-type, a carbon nanotube (CNT) type, a metal-insulator-metal (MIM) type including a stack of a metal, an insulator, and a metal, a metal-insulator-semiconductor (MIS) type including a stack of a metal, an insulator, and a semiconductor, a MOS type, a silicon type, a thin film diode type, a diamond type, a surface conductive emitter SCD type, a thin film type in which a metal, an insulator, a semiconductor, and a metal are stacked, a HEED type, an EL type, a porous silicon type, a surface-conduction electron-emitter (SCD) type, and the like. Note that various elements can be used as an electron emitter without limitation to those described above.

A liquid crystal element is an element that controls transmission or non-transmission of light by an optical modulation action of liquid crystal, and includes a pair of electrodes and liquid crystal. The optical modulation action of liquid crystal is controlled by an electric field (including a lateral electric field, a vertical electric field, and a diagonal electric field) applied to the liquid crystal. The following liquid crystal can be used for a liquid crystal element: nematic liquid crystal, cholesteric liquid crystal, smectic liquid crystal, discotic liquid crystal, thermotropic liquid crystal, lyotropic liquid crystal, low molecular liquid crystal, high molecular liquid crystal, polymer dispersed liquid crystal (PDLC), ferroelectric liquid crystal, anti-ferroelectric liquid crystal, main chain type liquid crystal, side chain type polymer liquid crystal, plasma addressed liquid crystal (PALC), and banana-shaped liquid crystal. Moreover, the following methods can be used for driving the liquid crystal, for example: a TN (twisted nematic) mode, an STN (super twisted nematic) mode, an IPS (in-plane-switching) mode, an FFS (fringe field switching) mode, an MVA (multi-domain vertical alignment) mode, a PVA (patterned vertical alignment) mode, an ASV (advanced super view) mode, an ASM (axially symmetric aligned microcell) mode, an OCB (optically compensated birefringence) mode, an ECB (electrically controlled birefringence) mode, an FLC (ferroelectric liquid crystal) mode, an AFLC (anti-ferroelectric liquid crystal) mode, a PDLC (polymer dispersed liquid crystal) mode, a guest-host mode, and a blue phase mode. Note that various kinds of liquid crystal elements and driving methods can be used without limitation on those described above.

Electronic paper corresponds to devices that display images by molecules which utilize optical anisotropy, dye molecular orientation, or the like; by particles which utilize electrophoresis, particle movement, particle rotation, phase change, or the like; by moving one end of a film; by using coloring properties or phase change of molecules; by using optical absorption by molecules; and by using self-light emission by combining electrons and holes. For example, the following can be used for the electronic paper: microcapsule electrophoresis, horizontal electrophoresis, vertical electrophoresis, a spherical twisting ball, a magnetic twisting ball, a columnar twisting ball, a charged toner, electro liquid powder, magnetic electrophoresis, a magnetic thermosensitive type, an electrowetting type, a light-scattering (transparent-opaque change) type, cholesteric liquid crystal and a photoconductive layer, a cholesteric liquid crystal device, bistable nematic liquid crystal, ferroelectric liquid crystal, a liquid crystal dispersed type with a dichroic dye, a movable film, coloring and decoloring properties of a leuco dye, a photochromic material, an electrochromic material, an electrodeposition material, flexible organic EL, and the like. Note that various types of electronic papers can be used without limitation to those described above. By using microcapsule electrophoresis, problems of electrophoresis, that is, aggregation or precipitation of electrophoretic particles can be solved. Electro liquid powder has advantages such as high-speed response, high reflectivity, wide viewing angle, low power consumption, and memory properties.

A plasma display panel includes a substrate having a surface provided with an electrode, and a substrate having a surface provided with an electrode and a minute groove in which a phosphor layer is formed. In the plasma display panel, the substrates are opposite to each other with a narrow interval, and a rare gas is sealed therein. Alternatively, a plasma display panel can have a structure in which a plasma tube is placed between film-shaped electrodes. A plasma tube is such that a discharge gas, fluorescent materials for RGB, and the like are sealed in a glass tube. Display can be performed by applying a voltage between the electrodes to generate an ultraviolet ray so that the fluorescent materials emit light. Note that the plasma display panel may be a DC type PDP or an AC type PDP. As a method for driving the plasma display panel, AWS (address while sustain) driving, ADS (address display separated) driving in which a subframe is divided into a reset period, an address period, and a sustain period, CLEAR (high-contrast, low energy address and reduction of false contour sequence) driving, ALIS (alternate lighting of surfaces) method, TERES (technology of reciprocal sustainer) driving, and the like can be used. Note that various method for driving a plasma display panel can be used without limitation to those described above.

Electroluminescence, a cold cathode fluorescent lamp, a hot cathode fluorescent lamp, an LED, a laser light source, a mercury lamp, or the like can be used for a light source of a display device in which a light source is needed, such as a liquid crystal display device (a transmissive liquid crystal display, a transflective liquid crystal display, a reflective liquid crystal display, a direct-view liquid crystal display, and a projection type liquid crystal display), a display device using a grating light valve (GLV), and a display device using a digital micromirror device (DMD). Note that a variety of light sources can be used without limitation to those described above.

Note that as a transistor, various types of transistors can be used without being limited to a certain type. For example, a thin film transistor (TFT) including a non-single-crystal semiconductor film typified by amorphous silicon, polycrystalline silicon, microcrystalline (also referred to as microcrystal, nanocrystal, or semi-amorphous) silicon, or the like can be used. The use of such TFTs has various advantages. For example, since TFTs can be formed at temperature lower than those using single crystalline silicon, manufacturing costs can be reduced or a manufacturing device can be made larger. Since the manufacturing device can be made larger, the TFTs can be formed using a large substrate. Therefore, a plurality of display devices can be formed at the same time, so that manufacturing costs can be reduced. In addition, since the manufacturing temperature is low, a substrate having low heat resistance can be used. Accordingly, the transistor can be formed over a light-transmitting substrate such as a glass substrate. Moreover, transmission of light in a display element can be controlled by using the transistors formed using the light-transmitting substrate. Further, part of a film included in the transistor can transmit light because the transistor is thin. Accordingly, the aperture ratio can be increased.

When polycrystalline silicon is formed, the use of a catalyst (e.g., nickel) enables further improvement in crystallinity and formation of a transistor with excellent electrical characteristics. Accordingly, a gate driver circuit (a scan line driver circuit), a source driver circuit (a signal line driver circuit), and a signal processing circuit (e.g., a signal generation circuit, a gamma correction circuit, or a DA converter circuit) can be formed over one substrate.

In addition, when microcrystalline silicon is formed, the use of a catalyst (e.g., nickel) enables further improvement in crystallinity and formation of a transistor with excellent electrical characteristics. At this time, the crystallinity can be improved by applying heat without laser irradiation. Thus, part of a source driver circuit (e.g., an analog switch) and a gate driver circuit (a scan line driver circuit) can be formed over one substrate. Further, when laser irradiation for crystallization is not performed, unevenness of silicon crystallinity can be suppressed. Accordingly, images with improved quality can be displayed.

Note that polycrystalline silicon and microcrystalline silicon can be formed without using a catalyst (e.g., nickel).

The crystallinity of silicon is preferably enhanced to polycrystallinity or microcrystallinity in the entire panel, but not limited thereto. The crystallinity of silicon may be increased only in part of the panel. The selective increase in crystallinity can be achieved by selective laser irradiation or the like. For example, only a peripheral driver circuit region excluding pixels may be irradiated with laser light. Alternatively, only a region of a gate driver circuit, a source driver circuit, or the like may be irradiated with laser light. Further alternatively, only part of a source driver circuit (e.g., an analog switch) may be irradiated with laser light. Accordingly, the crystallinity of silicon only in a region in which a circuit needs to operate at high speed can be increased. Since a pixel region does not especially need to operate at high speed, the pixel circuit can operate without problems even if the crystallinity is not increased. A region whose crystallinity is increased is small, whereby manufacturing steps can be reduced, the throughput can be increased, and manufacturing costs can be reduced. Since the number of manufacturing devices needed is small, it is possible to reduce (not to increase) manufacturing costs.

A transistor can be formed using a semiconductor substrate, an SOI substrate, or the like. Accordingly, a transistor with few variations in characteristics, sizes, shapes, or the like, with high current supply capability, and with a small size can be formed. By using such transistors, power consumption of a circuit can be reduced or a circuit can be highly integrated.

Alternatively, a transistor including a compound semiconductor or an oxide semiconductor, such as ZnO, a-InGaZnO, IZO, ITO, SnO, TiO, AlZnSnO (AZTO), and a thin film transistor or the like obtained by thinning such a compound semiconductor or oxide semiconductor can be used. Accordingly, the manufacturing temperature can be lowered and for example, such a transistor can be formed at room temperature. Thus, the transistor can be formed directly on a substrate having low heat resistance, such as a plastic substrate or a film substrate. Note that such a compound semiconductor or oxide semiconductor can be used for not only a channel portion of a transistor but also for other applications. For example, such a compound semiconductor or oxide semiconductor can be used for a resistor, a pixel electrode, or a light-transmitting electrode. Further, since such an element can be formed at the same time as the transistor, the costs can be reduced. Alternatively, a semiconductor such as SiGe or GaAs may be used.

Transistors or the like formed by an inkjet method or a printing method can also be used. Accordingly, transistors can be formed at room temperature, can be formed at a low vacuum, or can be formed using a large substrate. Since such transistors can be formed without a mask (a reticle), the layout of the transistors can be easily changed. Moreover, since it is not necessary to use a resist, the material costs are reduced and the number of steps can be reduced. Further, since a film is formed where needed, the material is not wasted compared to a manufacturing method in which etching is performed after a film is formed over the entire surface, so that the costs can be reduced.

Further, transistors or the like including an organic semiconductor or a carbon nanotube can be used. Such transistors can be formed over a flexible substrate. A semiconductor device using such a substrate can resist a shock.

In addition, various types of transistors can be used. For example, a MOS transistor, a junction transistor, a bipolar transistor, or the like can be employed. Since a MOS transistor has a small size, a large number of transistors can be mounted. The use of a bipolar transistor can allow a large current to flow; thus, a circuit can operate at high speed.

Further, a MOS transistor, a bipolar transistor, and the like may be formed over one substrate. Thus, low power consumption, reduction in size, and high-speed operation can be achieved.

Furthermore, various transistors other than the above transistors can be used.

A transistor can be formed using various types of substrates. The type of a substrate is not limited to a certain type. As the substrate, a single crystalline substrate (e.g., a silicon substrate), an SOI substrate, a glass substrate, a quartz substrate, a plastic substrate, a metal substrate, a stainless steel substrate, a substrate including a stainless steel foil, a tungsten substrate, a substrate including a tungsten foil, or a flexible substrate can be used, for example. Examples of the glass substrate are barium borosilicate glass and aluminoborosilicate glass. Examples of the flexible substrate are flexible synthetic resin such as plastics typified by polyethylene terephthalate (PET), polyethylene naphthalate (PEN), and polyethersulfone (PES), and acrylic. Alternatively, an attachment film (formed using polypropylene, polyester, vinyl, polyvinyl fluoride, polyvinyl chloride, or the like), paper including a fibrous material, a base material film (polyester, polyamide, polyimide, an inorganic vapor deposition film, paper, or the like), or the like can be used. Alternatively, the transistor may be formed using one substrate, and then, the transistor may be transferred to another substrate. As a substrate to which the transistor is transferred, a single crystal substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used. A skin (e.g., epidermis or corium) or hypodermal tissue of an animal such as a human being may be used as a substrate to which the transistor is transferred. Alternatively, the transistor may be formed using one substrate and the substrate may be thinned by polishing. As a substrate to be polished, a single crystal substrate, an SOI substrate, a glass substrate, a quartz substrate, a plastic substrate, a stainless steel substrate, a substrate including a stainless steel foil, or the like can be used. By using such a substrate, a transistor with excellent properties or low power consumption can be formed, a device with high durability or high heat resistance can be provided, or reduction in weight or thickness can be achieved.

Note that a structure of a transistor can employ various modes without being limited to a specific structure. For example, a multi-gate structure having two or more gate electrodes can be used. When the multi-gate structure is used, a structure where a plurality of transistors are connected in series is provided because channel regions are connected in series. With the multi-gate structure, the off-state current can be reduced and the withstand voltage of the transistor can be increased (the reliability can be increased). Further, by employing the multi-gate structure, a drain-source current does not change much even if a drain-source voltage changes when the transistor operates in a saturation region; thus, the slope of voltage-current characteristics can be flat. By utilizing the characteristics that the slope of the voltage-current characteristics is flat, an ideal current source circuit or an active load having an extremely high resistance value can be provided. Accordingly, a differential circuit or a current mirror circuit which has excellent properties can be provided.

As another example, a structure where gate electrodes are formed above and below a channel can be used. By employing the structure where gate electrodes are formed above and below the channel, a channel region is enlarged; thus, a current value can be increased. Alternatively, by employing the structure where gate electrodes are formed above and below the channel, a depletion layer is easily formed, so that subthreshold swing (S value) can be improved. When the gate electrodes are formed above and below the channel, a structure where a plurality of transistors are connected in parallel is provided.

Further, a structure where a gate electrode is formed above or below a channel, a staggered structure, an inverted staggered structure, a structure where a channel region is divided into a plurality of regions, a structure where channel regions are connected in parallel or in series can also be employed. In addition, a source electrode or a drain electrode may overlap with a channel region (or part of it). By using the structure where the source electrode or the drain electrode may overlap with the channel region (or part of it), unstable operation due to electric charge accumulated in part of the channel region can be prevented. Further, an LDD region can be provided. By providing the LDD region, the off-state current can be reduced or the withstand voltage of the transistor can be increased (the reliability can be increased). Alternatively, by providing the LDD region, a drain-source current does not change much even if a drain-source voltage changes when a transistor operates in the saturation region, so that a slope of voltage-current characteristics can be flat.

Note that a variety of transistors can be used, and the transistor can be formed using a variety of substrates. Accordingly, all the circuits which are necessary to realize a predetermined function can be formed using one substrate. For example, all the circuits which are necessary to realize the predetermined function can be formed using a glass substrate, a plastic substrate, a single crystal substrate, an SOI substrate, or any other substrate. When all of the circuits which are necessary to realize the predetermined function are formed using one substrate, the number of components can be reduced to cut the costs or the number of connections between circuit components can be reduced to increase the reliability. Alternatively, some of the circuits which are necessary to realize the predetermined function can be formed using one substrate and other circuits which are necessary to realize the predetermined function can be formed using another substrate. That is, not all the circuits which are necessary to realize the predetermined function need to be formed using one substrate. For example, some of the circuits which are necessary to realize the predetermined function can be formed by transistors using a glass substrate, other circuits which are necessary to realize the predetermined function can be formed using a single crystal substrate, and an IC chip including transistors formed using the single crystal substrate can be connected to the glass substrate by COG (chip on glass) so that the IC chip is provided over the glass substrate. Alternatively, the IC chip can be connected to the glass substrate by TAB (tape automated bonding) or a printed wiring board. When part of the circuits are formed using the same substrate in such a manner, the number of the components can be reduced to cut the costs or the number of connections between the circuit components can be reduced to increase the reliability. In addition, circuits in a portion with high driving voltage or a portion with high driving frequency consume large power. Accordingly, when the circuits in such portions are formed using a single crystalline substrate, for example, instead of using the same substrate, and an IC chip formed by the circuit is used, increase in power consumption can be prevented.

Note that one pixel corresponds to one element whose brightness can be controlled. For example, one pixel corresponds to one color element, and brightness is expressed with one color element. Accordingly, in a color display device having color elements of R (red), G (green) and B (blue), the minimum unit of an image is composed of three pixels of an R pixel, a G pixel, and a B pixel. Note that the color elements are not limited to three colors, and color elements of more than three colors may be used and/or a color other than RGB may be used. For example, it is possible to add white so that RGBW (W means white) are used. Alternatively, RGB added with one or more colors of yellow, cyan, magenta, emerald green, vermilion, and the like can be used. Further, a color similar to at least one of R, G, and B can be added to RGB. For example, R, G, B1, and B2 may be employed. Although both B1 and B2 are blue, they have slightly different frequencies. Similarly, R1, R2, G, and B can be used. By using such color elements, display which is closer to a real object can be performed, and power consumption can be reduced. As another example, when brightness of one color element is controlled by a plurality of regions, one region can correspond to one pixel. For example, when area ratio grayscale display is performed or when a subpixel is included, a plurality of regions which control brightness are provided in one color element and a gray level is expressed with all of the regions, and one region which controls brightness can correspond to one pixel. In that case, one color element is formed of a plurality of pixels. Alternatively, even when a plurality of regions which control brightness are provided in one color element, one color element including these regions may be collectively considered as one pixel. In that case, one color element is formed of one pixel. In addition, when brightness of one color element is controlled by a plurality of regions, the size of regions which contribute to display sometimes vary depending on pixels. Alternatively, in a plurality of regions which control brightness in one color element, signals supplied to respective regions may slightly vary to widen a viewing angle. That is, potentials of pixel electrodes included in the plurality of regions in one color element can be different from each other. Accordingly, voltages applied to liquid crystal molecules vary depending on the pixel electrodes. Thus, the viewing angle can be widened.

Note that when it is explicitly described as one pixel (for three colors), it corresponds to the case where three pixels of R, G, and B are considered as one pixel. Meanwhile, when it is explicitly described as one pixel (for one color), it corresponds to the case where a plurality of regions provided in one color element are collectively considered as one pixel.

Note that pixels are provided (arranged) in matrix in some cases. Here, the description that pixels are provided (arranged) in matrix includes the case where the pixels are arranged in a straight line or a jagged line in the longitudinal direction or the lateral direction. Therefore, when full color display with three color elements (e.g., RGB) is performed, the following cases are included therein: the case where the pixels are arranged in stripes, the case where dots of the three color elements are arranged in a delta pattern, and the case where dots of the three color elements are provided in Bayer arrangement. Further, the sizes of display regions may be different between respective dots of color elements. Thus, power consumption can be reduced or the life of a display element can be prolonged.

An active matrix method in which an active element is included in a pixel or a passive matrix method in which an active element is not included in a pixel can be used.

In the active matrix method, as an active element (a non-linear element), a variety of active elements (non-linear elements) such as a metal-insulator-metal (MIM) and a thin film diode (TFD) can be used in addition to a transistor. Since such an element needs a smaller number of manufacturing steps, manufacturing costs can be reduced or the yield can be increased. Further, since the size of such an element is small, the aperture ratio can be increased, so that power consumption can be reduced and higher luminance can be achieved.

As a method other than the active matrix method, the passive matrix method in which an active element (a non-linear element) is not used can also be used. Since an active element (a non-linear element) is not used, the manufacturing steps are fewer, so that manufacturing costs can be reduced or the yield can be increased. Further, since an active element (a non-linear element) is not used, the aperture ratio can be increased, so that power consumption can be reduced and higher luminance can be achieved.

Note that a transistor is an element having at least three terminals of a gate, a drain, and a source. The transistor includes a channel region between a drain region and a source region, and current can flow through the drain region, the channel region, and the source region. Here, since the source and the drain of the transistor change depending on the structure, operating condition, and the like of the transistor, it is difficult to define which is a source or a drain. Thus, a region which serves as a source or a drain is not referred to as a source or a drain in some cases. In such a case, one of the source and the drain may be referred to as a first terminal and the other of the source and the drain may be referred to as a second terminal, for example. Alternatively, one of the source and the drain may be referred to as a first electrode and the other thereof may be referred to as a second electrode. Further alternatively, one of the source and the drain may be referred to as a first region and the other thereof may be referred to as a second region.

Note that a transistor may be an element having at least three terminals of a base, an emitter, and a collector. In this case also, the emitter and the collector may be referred to as a first terminal and a second terminal, for example.

A gate corresponds to all or some of a gate electrode and a gate wiring (also called a gate line, a gate signal line, a scan line, a scan signal line, or the like). A gate electrode corresponds to part of a conductive film that overlaps with a semiconductor which forms a channel region with a gate insulating film therebetween. Note that in some cases, part of the gate electrode overlaps with an LDD (lightly doped drain) region or a source region (or a drain region) with the gate insulating film therebetween. A gate wiring corresponds to a wiring for connecting gate electrodes of transistors to each other, a wiring for connecting gate electrodes in pixels to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be called either a gate electrode or a gate wiring. That is, there is a region where a gate electrode and a gate wiring cannot be clearly distinguished from each other. For example, when a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be called either a gate electrode or a gate wiring.

Note that a portion (a region, a conductive film, a wiring, or the like) which is formed using the same material as a gate electrode, forms the same island as the gate electrode, and is connected to the gate electrode may be referred to as a gate electrode. Similarly, a portion (a region, a conductive film, a wiring, or the like) which is formed using the same material as a gate wiring, forms the same island as the gate wiring, and is connected to the gate wiring may be referred to as a gate wiring. In a strict sense, such a portion (a region, a conductive film, a wiring, or the like) does not overlap with a channel region or does not have a function of connecting the gate electrode to another gate electrode in some cases. However, there is a portion (a region, a conductive film, a wiring, or the like) which is formed using the same material as a gate electrode or a gate wiring, forms the same island as the gate electrode or the gate wiring, and is connected to the gate electrode or the gate wiring because of specifications or the like in manufacturing. Thus, such a portion (a region, a conductive film, a wiring, or the like) may be referred to as either a gate electrode or a gate wiring.

Note that in a multi-gate transistor, for example, a gate electrode is often connected to another gate electrode by using a conductive film which is formed using the same material as the gate electrode. Since such a portion (a region, a conductive film, a wiring, or the like) is a portion (a region, a conductive film, a wiring, or the like) for connecting the gate electrode to another gate electrode, the portion may be referred to as a gate wiring, or the portion may be referred to as a gate electrode because a multi-gate transistor can be considered as one transistor. That is, a portion (a region, a conductive film, a wiring, or the like) which is formed using the same material as a gate electrode or a gate wiring, forms the same island as the gate electrode or the gate wiring, and is connected to the gate electrode or the gate wiring may be referred to as either a gate electrode or a gate wiring. Further, for example, part of a conductive film which connects the gate electrode and the gate wiring and is formed using a material which is different from that of the gate electrode or the gate wiring may be referred to as either a gate electrode or a gate wiring.

Note that a gate terminal corresponds to part of a portion (a region, a conductive film, a wiring, or the like) of a gate electrode or part of a portion (a region, a conductive film, a wiring, or the like) which is electrically connected to the gate electrode.

In the case where a wiring is referred to as a gate wiring, a gate line, a gate signal line, a scan line, a scan signal line, or the like, a gate of a transistor is not connected to the wiring in some cases. In this case, the gate wiring, the gate line, the gate signal line, the scan line, or the scan signal line sometimes corresponds to a wiring formed in the same layer as the gate of the transistor, a wiring formed using the same material as the gate of the transistor, or a wiring formed at the same time as the gate of the transistor. Examples are a wiring for a storage capacitor, a power supply line, and a reference potential supply line.

A source corresponds to all or some of a source region, a source electrode, and a source wiring (also referred to as a source line, a source signal line, a data line, a data signal line, or the like). A source region corresponds to a semiconductor region containing a large amount of p-type impurities (e.g., boron or gallium) or n-type impurities (e.g., phosphorus or arsenic). Therefore, a region containing a small amount of p-type impurities or n-type impurities, that is, an LDD (lightly doped drain) region is not included in the source region. A source electrode is part of a conductive layer which is formed using a material different from that of a source region and is electrically connected to the source region. Note that a source electrode and a source region are collectively referred to as a source electrode in some cases. A source wiring corresponds to a wiring for connecting source electrodes of transistors to each other, a wiring for connecting source electrodes of pixels to each other, or a wiring for connecting a source electrode to another wiring.

However, there is a portion (a region, a conductive film, a wiring, or the like) which serves as both a source electrode and a source wiring. Such a portion (a region, a conductive film, a wiring, or the like) may be referred to as either a source electrode or a source wiring. That is, there is a region in which a source electrode and a source wiring cannot be clearly distinguished from each other. For example, in the case where a source region overlaps with part of an extended source wiring, the overlapped portion (region, conductive film, wiring, or the like) serves as both a source wiring and a source electrode. Thus, such a portion (a region, a conductive film, a wiring, or the like) may be referred to as either a source electrode or a source wiring.

Note that a portion (a region, a conductive film, a wiring, or the like) which is formed using the same material as a source electrode, forms the same island as the source electrode, and is connected to the source electrode; or a portion (a region, a conductive film, a wiring, or the like) which connects a source electrode and another source electrode may be referred to as a source electrode. Further, a portion which overlaps with a source region may be referred to as a source electrode. Similarly, a region which is formed using the same material as a source wiring, forms the same island as the source wiring, and is connected to the source wiring may be referred to as a source wiring. In a strict sense, such a portion (a region, a conductive film, a wiring, or the like) does not have a function of connecting the source electrode to another source electrode in some cases. However, there is a portion (a region, a conductive film, a wiring, or the like) which is formed using the same material as a source electrode or a source wiring, forms the same island as the source electrode or the source wiring, and is connected to the source electrode or the source wiring because of specifications or the like in manufacturing. Thus, such a portion (a region, a conductive film, a wiring, or the like) may be referred to as either a source electrode or a source wiring.

For example, part of a conductive film which connects the source electrode and the source wiring and is formed using a material which is different from that of the source electrode or the source wiring may be referred to as either a source electrode or a source wiring.

A source terminal corresponds to part of a source region, part of a source electrode, or part of a portion (a region, a conductive film, a wiring, or the like) which is electrically connected to the source electrode.

In the case where a wiring is referred to as a source wiring, a source line, a source signal line, a data line, a data signal line, or the like, a source (a drain) of a transistor is not connected to the wiring in some cases. In that case, the source wiring, the source line, the source signal line, the data line, or the data signal line sometimes corresponds to a wiring formed in the same layer as the source (the drain) of the transistor, a wiring formed using the same material as the source (the drain) of the transistor, or a wiring formed at the same time as the source (the drain) of the transistor. Examples are a wiring for a storage capacitor, a power supply line, and a reference potential supply line.

Note also that the same can be said for a drain.

A semiconductor device corresponds to a device having a circuit including a semiconductor element (e.g., a transistor, a diode, or a thyristor). The semiconductor device may be general devices that can function by utilizing semiconductor characteristics. Alternatively, devices including a semiconductor material are also referred to as semiconductor devices.

A display device corresponds to a device including a display element. A display device may include a plurality of pixels including a display element. Moreover, a display device may include a peripheral driver circuit for driving a plurality of pixels. The peripheral driver circuit for driving a plurality of pixels may be formed over the same substrate as the plurality of pixels. A display device may also include a peripheral driver circuit provided over a substrate by wire bonding or bump bonding, that is, an IC chip connected by chip on glass (COG), TAB, or the like. Further, a display device may include a flexible printed circuit (FPC) to which an IC chip, a resistor, a capacitor, an inductor, a transistor, or the like is attached. A display device may include a printed wiring board (PWB) which is connected through a flexible printed circuit (FPC) and to which an IC chip, a resistor, a capacitor, an inductor, a transistor, or the like is attached. A display device may also include an optical sheet such as a polarizing plate or a retardation plate. A display device may also include a lighting device, a housing, an audio input/output device, a light sensor, or the like.

A lighting device may include a backlight unit, a light guide plate, a prism sheet, a diffusion sheet, a reflective sheet, a light source (e.g., an LED or a cold cathode fluorescent lamp), a cooling device (e.g., a water cooling device or an air cooling device), or the like.

A light-emitting device corresponds to a device including a light-emitting element or the like. A light-emitting device including a light-emitting element as a display element is a specific example of display devices.

A reflective device corresponds to a device including a light-reflecting element, a light diffraction element, a light-reflecting electrode, or the like.

A liquid crystal display device corresponds to a display device including a liquid crystal element. Liquid crystal display devices include a direct-view liquid crystal display, a projection type liquid crystal display, a transmissive liquid crystal display, a reflective liquid crystal display, a transflective liquid crystal display, and the like in their categories.

A driving device corresponds to a device including a semiconductor element, an electric circuit, an electronic circuit, or the like. Examples of the driving device are a transistor which controls input of a signal from a source signal line to a pixel (also referred to as a selection transistor, a switching transistor, or the like), a transistor which supplies voltage or current to a pixel electrode, and a transistor which supplies voltage or current to a light-emitting element. Moreover, examples of the driving device are a circuit which supplies a signal to a gate signal line (also referred to as a gate driver, a gate line driver circuit, or the like) and a circuit which supplies a signal to a source signal line (also referred to as a source driver, a source line driver circuit, or the like).

Note that categories of a display device, a semiconductor device, a lighting device, a cooling device, a light-emitting device, a reflective device, a driving device, and the like overlap with each other in some cases. For example, a display device includes a semiconductor device and a light-emitting device in some cases. Alternatively, a semiconductor device includes a display device and a driving device in some cases.

Note that when it is explicitly described that B is formed on or over A, it does not necessarily mean that B is formed in direct contact with A. The description includes the case where A and B are not in direct contact with each other, that is, the case where another object is placed between A and B. Here, each of A and B is an object (e.g., a device, an element, a circuit, a wiring, an electrode, a terminal, a conductive film, or a layer).

Accordingly, for example, when it is explicitly described that a layer B is formed on (or over) a layer A, it includes both the case where the layer B is formed in direct contact with the layer A; and the case where another layer (e.g., a layer C or a layer D) is formed in direct contact with the layer A, and the layer B is formed in direct contact with the layer C or the layer D. Note that another layer (e.g., the layer C or the layer D) may be a single layer or a plurality of layers.

Similarly, when it is explicitly described that B is formed above A, it does not necessarily mean that B is formed in direct contact with A, and another object may be placed between A and B. Accordingly, the case where a layer B is formed above a layer A includes the case where the layer B is formed in direct contact with the layer A and the case where another layer (e.g., a layer C and a layer D) is formed in direct contact with the layer A and the layer B is formed in direct contact with the layer C or the layer D. Note that another layer (e.g., the layer C or the layer D) may be a single layer or a plurality of layers.

Note that when it is explicitly described that B is formed over, on, or above A, it includes the case where B is formed obliquely over/above A.

Note that the same can be said when it is explicitly described that B is formed below or under A.

Explicit singular forms preferably mean singular forms. However, embodiments of the present invention are not limited thereto, and such singular forms can include plural forms. Similarly, explicit plural forms preferably mean plural forms. However, embodiments of the present invention are not limited thereto, and such plural forms can include singular forms.

Note that the size, the thickness of layers, and regions in diagrams are sometimes exaggerated for simplicity. Therefore, embodiments of the present invention are not limited to such scales.

Note that a diagram schematically illustrates an ideal example, and embodiments of the present invention are not limited to the shape or the value illustrated in the diagram. For example, the following can be included: variation in shape due to a manufacturing technique or dimensional deviation; or variation in signal, voltage, or current due to noise or difference in timing.

Technical terms are used in order to describe a specific embodiment or the like in many cases, and there are no limitations on terms.

Terms which are not defined (including terms used for science and technology, such as technical terms and academic parlance) can be used as the terms which have a meaning equivalent to a general meaning that an ordinary person skilled in the art understands. It is preferable that the term defined by dictionaries or the like be construed as a consistent meaning with the background of related art.

The terms such as first, second, and third are used for distinguishing various elements, members, regions, layers, and areas from others. Therefore, the terms such as first, second, and third do not limit the number of elements, members, regions, layers, areas, or the like. Further, for example, "first" can be replaced with "second", "third", or the like.

Terms for describing spatial arrangement, such as "over", "above", "under", "below", "laterally", "right", "left", "obliquely", "back", and "front", are often used for briefly showing, with reference to a diagram, a relation between an element and another element or between some characteristics and other characteristics. Note that embodiments of the present invention are not limited thereto, and such terms for describing spatial arrangement can indicate not only the direction illustrated in a diagram but also another direction. For example, when it is explicitly described that "B is over A", it does not necessarily mean that B is placed over A, and can include the case where B is placed under A because a device in a diagram can be inverted or rotated by 180°. Accordingly, "over" can refer to the direction described by "under" in addition to the direction described by "over". Note that embodiments of the present invention are not limited thereto, and "over" can refer to other directions described by "laterally", "right", "left", "obliquely", "back", and "front" in addition to the directions described by "over" and "under" because a device in a diagram can be rotated in a variety of directions.

In one embodiment of the invention disclosed in this specification and the like, a light-transmitting material is used for at least part of a transistor and part of a storage capacitor. Accordingly, light can pass through a region where the transistor and the storage capacitor are provided, so that the aperture ratio can be increased. Further, when a wiring for connecting a transistor and another element (e.g., another transistor) or a wiring for connecting a capacitor and another element (e.g., another capacitor) is formed using a material with low resistivity (with high conductivity), distortion of signal waveforms can be reduced and a voltage drop due to wiring resistance can be reduced. Thus, power consumption of a semiconductor device can be reduced. Moreover, the size of the semiconductor device (the size of a screen) can be easily increased.

BRIEF DESCRIPTION OF THE DRAWINGS

In the accompanying drawings:

FIGS. 2A1 to 2D1 and 2A2 to 2D2 are cross-sectional views illustrating a method for manufacturing a semiconductor device;

FIGS. 3A1 to 3D1 and 3A2 to 3D2 are cross-sectional views illustrating a method for manufacturing a semiconductor device;

FIGS. 4A1 to 4D1 and 4A2 to 4D2 are cross-sectional views illustrating a method for manufacturing a semiconductor device;

FIGS. 5A1 to 5C1 and 5A2 to 5C2 are cross-sectional views illustrating a method for manufacturing a semiconductor device;

FIGS. 13A1 to 13D1 and 13A2 to 13D2 are cross-sectional views illustrating a method for manufacturing a semiconductor device;

FIGS. 14A1 to 14C1 and 14A2 to 14C2 are cross-sectional views illustrating a method for manufacturing a semiconductor device;

FIGS. 15A1 to 15C1 and 15A2 to 15C2 are cross-sectional views illustrating a method for manufacturing a semiconductor device;

FIGS. 16A1 to 16C1 and 16A2 to 16C2 are cross-sectional views illustrating a method for manufacturing a semiconductor device;

FIGS. 17A1, 17A2, 17B1, and 17B2 each illustrate a structure of a multi-tone mask;

FIGS. 22A1 and 22A2 are plan views and FIG. 22B is a cross-sectional view of a semiconductor device;

DETAILED DESCRIPTION OF THE INVENTION

Figure 1A:
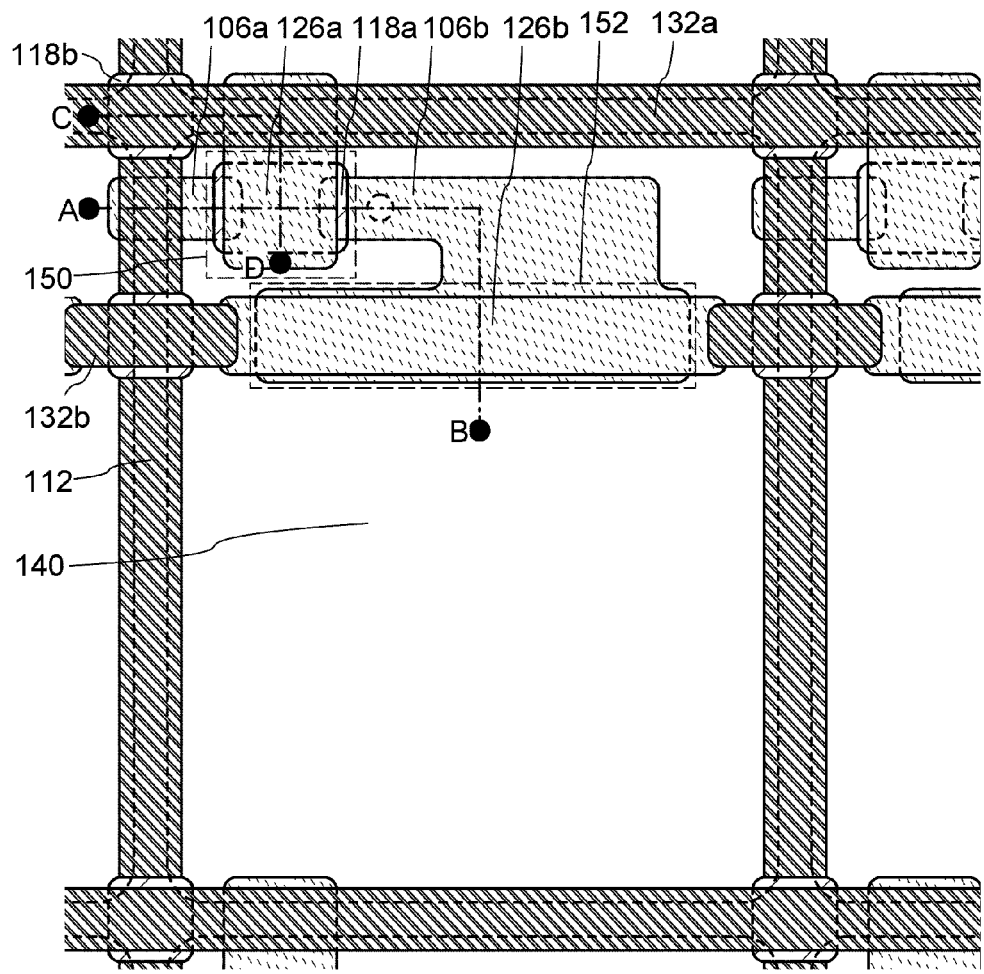
FIG. 1A is a plan view and FIG. 1B is a cross-sectional view of a semiconductor device.

Embodiments of the present invention will be described below with reference to the accompanying drawings. Note that the present invention is not limited to the description of the embodiments, and it is apparent to those skilled in the art that modes and details can be modified in various ways without departing from the spirit of the invention disclosed in this specification and the like. In addition, the structures in different embodiments can be implemented in combination as appropriate. Note that the same portions or portions having similar functions are denoted by the same reference numerals in the structure of the invention described below, and the description thereof is repeated.

Note that what is described (or part thereof) in one embodiment can be applied to, combined with, or exchanged with another content in the same embodiment and/or what is described (or part thereof) in another embodiment or other embodiments.

Note that in each embodiment, what is described in the embodiment is a content described with reference to a variety of diagrams or a content described with texts disclosed in this specification.

In addition, by combining a diagram (or part thereof) described in one embodiment with another part of the diagram, a different diagram (or part thereof) described in the same embodiment, and/or a diagram (or part thereof) described in one or a plurality of different embodiments, much more diagrams can be formed.

Note that in a diagram or a text described in one embodiment, it is possible to take out part of the diagram or the text and constitute an embodiment of the invention. Accordingly, in the case where a diagram or a text related to a certain portion is described, the context taken out from part of the diagram or the text is also disclosed as one embodiment of the invention and can constitute one embodiment of the invention. Therefore, for example, in a diagram (e.g., a cross-sectional view, a plan view, a circuit diagram, a block diagram, a flow chart, a process diagram, a perspective view, a cubic diagram, a layout diagram, a timing chart, a structure diagram, a schematic view, a graph, a list, a ray diagram, a vector diagram, a phase diagram, a waveform chart, a photograph, or a chemical formula) or a text in which one or more active elements (e.g., transistors or diodes), wirings, passive elements (e.g., capacitors or resistors), conductive layers, insulating layers, semiconductor layers, organic materials, inorganic materials, components, substrates, modules, devices, solids, liquids, gases, operating methods, manufacturing methods, or the like are described, it is possible to take out part of the diagram or the text and constitute one embodiment of the invention.

Embodiment 1

In this embodiment, a semiconductor device and a method for manufacturing the semiconductor device will be described with reference to FIGS. 1A and 1B, FIGS. 2A1 to 2D1 and 2A2 to 2D2, FIGS. 3A1 to 3D1 and 3A2 to 3D2, FIGS. 4A1 to 4D1 and 4A2 to 4D2, FIGS. 5A1 to 5C1 and 5A2 to 5C2, FIGS. 6A and 6B, FIGS. 7A and 7B, FIGS. 8A and 8B, FIGS. 9A and 9B, FIGS. 10A and 10B, and FIGS. 11A and 11B.

Figure 1B:
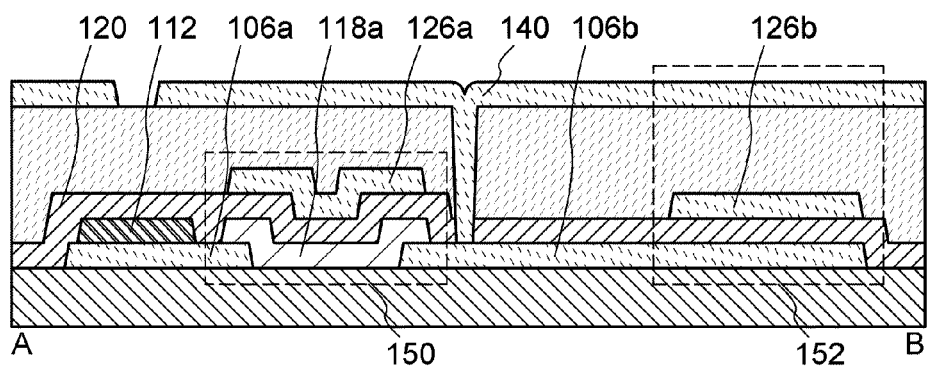
Figure 6A:
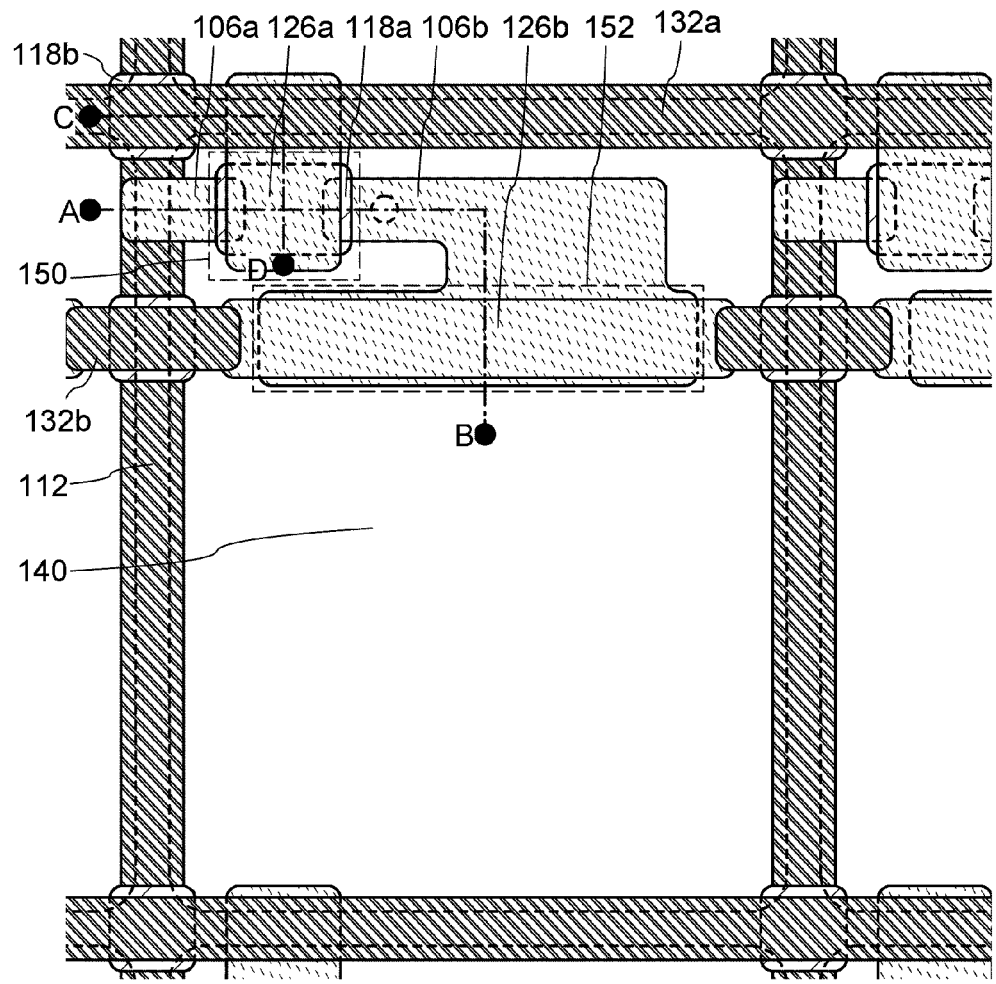
FIG. 6A is a plan view and FIG. 6B is a cross-sectional view of a semiconductor device.
Figure 6B:
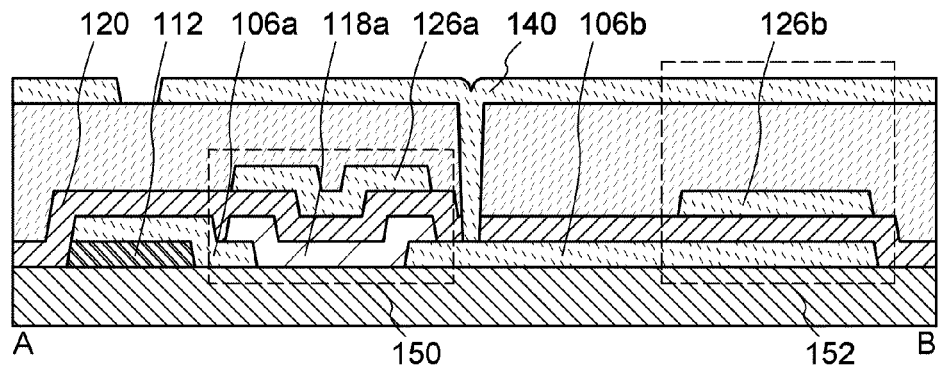

FIGS. 1A and 1B illustrate an example of a structure of a semiconductor device according to this embodiment. A liquid crystal display device is specifically described as a semiconductor device in this embodiment. However, the disclosed invention is not limited to a liquid crystal display device. The disclosed invention can be applied to an electroluminescent display device (an EL display device), a display device using an electrophoretic element (i.e., a so-called electronic paper), and the like and also applied to a semiconductor device other than a display device. FIG. 1A is a plan view, and FIG. 1B is a cross-sectional view along A-B in FIG. 1A.

The semiconductor device illustrated in FIG. 1A includes a pixel portion including a conductive layer 112 functioning as a source wiring; a conductive layer 132a and a conductive layer 132b which intersect the conductive layer 112 and function as a gate wiring and a capacitor wiring, respectively; a transistor 150 near the intersection of the conductive layer 132a and the conductive layer 112; and a storage capacitor 152 electrically connected to the conductive layer 132b (see FIGS. 1A and 1B). Note that in this specification and the like, the pixel portion refers to a region surrounded by a conductive layer functioning as a gate wiring and a conductive layer functioning as a source wiring. In FIG. 1A, the conductive layer 112 and the conductive layers 132a and 132b intersect at 90°; however, the disclosed invention is not limited to this structure. That is, the conductive layer 112 and the conductive layers 132a and 132b may intersect at an angle other than 90°.

The transistor 150 is a so-called top-gate transistor including a conductive layer 106a functioning as a source electrode, a conductive layer 106b functioning as a drain electrode, a semiconductor layer 118a, a gate insulating layer 120, and a conductive layer 126a functioning as a gate electrode (see FIGS. 1A and 1B). The storage capacitor 152 includes the conductive layer 106b, the gate insulating layer 120, a conductive layer 126b, and a conductive layer 140. Specifically, the capacitance is formed between the conductive layer 106b and the conductive layer 126b, and between the conductive layer 126b and the conductive layer 140. Note that since functions of the source electrode and the drain electrode of the transistor are sometimes replaced with each other depending on the direction in which carriers flow, the terms "source electrode" and "drain electrode" are used only for convenience. In other words, a function of each conductive layer should not be construed as being limited to the above terms.

Here, the conductive layer 106a, the conductive layer 106b, the semiconductor layer 118a, and the conductive layer 126a which are included in the transistor 150, and the conductive layer 126b included in the storage capacitor 152 are formed using a light-transmitting material. Accordingly, the aperture ratio of a pixel can be increased.

The conductive layer 112 electrically connected to the conductive layer 106a and the conductive layer 132a electrically connected to the conductive layer 126a are formed using a low resistance material. Accordingly, wiring resistance can be reduced, and power consumption can be reduced. Moreover, the conductive layer 112 and the conductive layer 132a are formed using a material with a light-shielding property. Thus, a portion between pixels can be shielded from light.

Note that in the above description, the term "light-transmitting" means that the light transmittance in the visible range (approximately 400 nm to 800 nm) is higher than at least that of the conductive layer 112 and the conductive layer 132a.

Next, an example of a method for manufacturing the semiconductor device will be described.

First, a conductive layer 102 is formed over a substrate 100 having an insulating surface (see FIGS. 2A1 and 2A2).

As the substrate 100 having the insulating surface, a glass substrate with a visible light-transmitting property, which is used for a liquid crystal display device or the like, can be used, for example. The glass substrate is preferably a non-alkali glass substrate. For the non-alkali glass substrate, a glass material such as aluminosilicate glass, aluminoborosilicate glass, or barium borosilicate glass is used, for example. Moreover, as the substrate 100 having the insulating surface, an insulating substrate formed of an insulator, such as a ceramic substrate, a quartz substrate, or a sapphire substrate; a semiconductor substrate which is formed using a semiconductor material such as silicon and has a surface covered with an insulating material; a conductive substrate which is formed using a conductive material such as metal or stainless steel and has a surface covered with an insulating material; or the like can be used. A flexible synthetic resin typified by polyethylene terephthalate (PET), polyethylene naphthalate (PEN), and polyether sulfone (PES) may be used.

Although not shown, a base film is preferably provided over the substrate 100 having the insulating surface. The base film has a function of preventing diffusion of alkali metal (e.g., Li, Cs, or Na), alkaline earth metal (e.g., Ca or Mg), or other impurities from the substrate 100. In other words, by providing the base film, the object of improving the reliability of the semiconductor device can be achieved. The base film can be formed using one or a plurality of insulating layers such as a silicon nitride film, a silicon oxide film, a silicon nitride oxide film, a silicon oxynitride an aluminum oxide film, an aluminum nitride film, an aluminum oxynitride film, or an aluminum nitride oxide film. For example, the base film preferably has a structure in which a silicon nitride film and a silicon oxide film are sequentially stacked from the substrate side. This is because the silicon nitride film is highly effective in blocking impurities. Meanwhile, since defects might occur in the case where the silicon nitride film is in contact with a semiconductor, a silicon oxide film is preferably formed as a film in contact with the semiconductor.

Note that in this specification and the like, an oxynitride refers to a substance containing a larger amount (number of atoms) of oxygen than nitrogen. For example, a silicon oxynitride contains oxygen, nitrogen, silicon, and hydrogen at concentration ranging from 50 at. % to 70 at. %, 0.5 at. % to 15 at. %, 25 at. % to 35 at. %, and 0.1 at. % to 10 at. %, respectively. Further, a nitride oxide refers to a substance containing a larger amount (number of atoms) of nitrogen than oxygen. For example, a nitride oxide contains oxygen, nitrogen, silicon, and hydrogen at concentrations ranging from 5 at. % to 30 at. %, 20 at. % to 55 at. %, 25 at. % to 35 at. %, and 10 at. % to 25 at. %, respectively. Note that the above ranges are obtained by using Rutherford backscattering spectrometry (RBS) or hydrogen forward scattering (HFS). Moreover, the total of the content ratio of the constituent elements does not exceed 100 at. %.

The conductive layer 102 is preferably formed using a material with a light-transmitting property (a visible light-transmitting property), such as indium tin oxide (ITO), indium tin oxide containing silicon oxide (ITSO), organoindium, organotin, zinc oxide (ZnO), or titanium nitride. Alternatively, indium zinc oxide (IZO) containing zinc oxide, a material obtained by adding gallium (Ga) to zinc oxide, tin oxide ($SnO_2$), indium oxide containing tungsten oxide, indium zinc oxide containing tungsten oxide, indium oxide containing titanium oxide, indium tin oxide containing titanium oxide, or the like may be used. The conductive layer 102 may have a signal-layer structure or a layered structure. When a layered structure is employed, the conductive layer 102 is preferably formed so as to have a sufficiently high light transmittance. Note that a sputtering method is preferably used as a method for forming the conductive layer 102; however, this embodiment is not limited thereto.

Next, a resist mask 104a and a resist mask 104b are formed over the conductive layer 102, and the conductive layer 102 is selectively etched using the resist masks 104a and 104b, so that the conductive layer 106a and the conductive layer 106b are formed (see FIGS. 2B1 and 2B2). As the etching, either dry etching or wet etching may be used. After the etching, the resist masks 104a and 104b are removed. In order to improve the coverage of the conductive layers 106a and 106b with an insulating layer and the like which are formed later and prevent disconnection, it is preferable to form the conductive layers 106a and 106b with their end portions tapered. By forming the conductive layers to be tapered in such a manner, the object of increasing the yield of the semiconductor device can be achieved.

The conductive layer 106a functions as the source electrode of the transistor. The conductive layer 106b functions as the drain electrode of the transistor and an electrode (a capacitor electrode) of the storage capacitor. Note that a function of each conductive layer should not be construed as being limited to the term "source electrode" or "drain electrode".

Next, a conductive layer 108 is formed so as to cover the conductive layers 106*a* and 106*b* (see FIGS. 2C1 and 2C2). Note that the conductive layer 108 is formed so as to cover the conductive layers 106*a* and 106*b* here; however, the disclosed invention is not limited thereto.

The conductive layer 108 can be formed to have a single-layer structure or a layered structure using a metal element such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), niobium (Nb), chromium (Cr), or cerium (Ce); an alloy material containing such metal materials as main components; or a nitride containing such a metal material. For example, the conductive layer 108 is preferably formed using a low resistance material such as aluminum.

In the case where the conductive layer 108 is formed over the conductive layer 106*a*, these conductive layers might react with each other. For example, when ITO is used for the conductive layer 106*a* and aluminum is used for the conductive layer 108, chemical reaction might be caused. In order to prevent such reaction, the conductive layer 108 may have a layered structure of a high melting point material and a low resistance material. Specifically, for the layered structure of the conductive layer 108, it is preferable that a region which is in contact with the conductive layer 106*a* be formed using a high melting point material and a region which is not in contact with the conductive layer 106*a* be formed using a low resistance material, for example.

Examples of the high melting point material are molybdenum, titanium, tungsten, tantalum, and chromium. Examples of the low resistance material are aluminum, copper, and silver.

It is needless to say that the conductive layer 108 may have a layered structure of three or more layers. In that case, a layered structure in which molybdenum, aluminum, molybdenum are used for a first layer, a second layer, and a third layer, respectively; or a layered structure in which molybdenum, aluminum containing a small amount of neodymium, and molybdenum are used for a first layer, a second layer, and a third layer, respectively can be used. When the conductive layer 108 has such a layered structure, generation of hillocks can be prevented. Accordingly, the object of improving the reliability of the semiconductor device can be achieved.

Then, a resist mask 110 is formed over the conductive layer 108, and the conductive layer 108 is selectively etched using the resist mask 110, so that the conductive layer 112 is formed (see FIGS. 2D1 and 2D2). Note that the conductive layer 112 functions as the source wiring. Moreover, since the conductive layer 112 is formed using a material with a light-shielding property, the conductive layer 112 has a function of shielding light. The resist mask 110 is removed after the conductive layer 112 is formed.

Note that the steps for forming the conductive layer 112 after the conductive layers 106*a* and 106*b* are formed are described in this embodiment; however, the disclosed invention should not be construed as being limited thereto. For example, the order of formation of the conductive layers 106*a* and 106*b* and formation of the conductive layer 112 may be changed. That is, the conductive layer 106*a* functioning as the source electrode and the conductive layer 106*b* can be formed after the conductive layer 112 functioning as the source wiring is formed (see FIGS. 6A and 6B). Note that although the order of formation of the conductive layers 126*a* and 126*b* and formation of the conductive layers 132*a* and 132*b* is not changed in FIGS. 6A and 6B, the order may be changed.

Figure 7A:
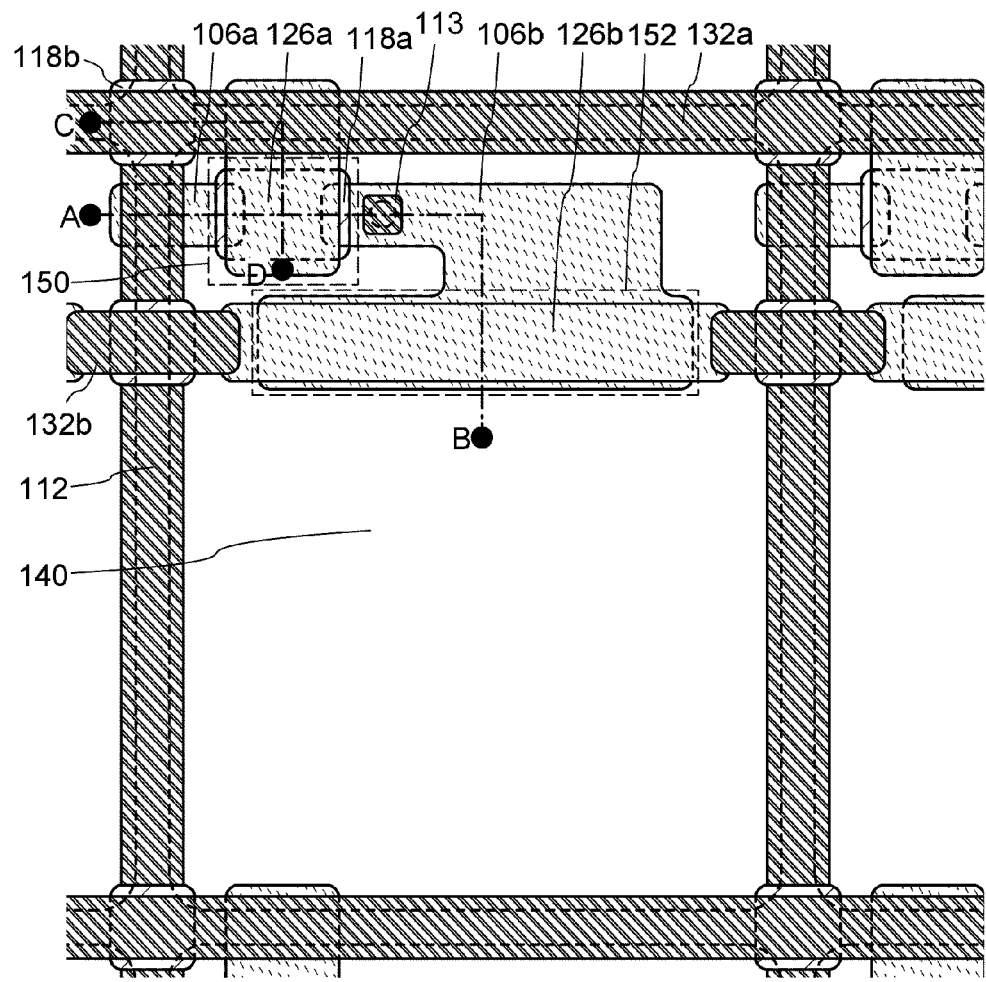
FIG. 7A is a plan view and FIG. 7B is a cross-sectional view of a semiconductor device.
Figure 7B:
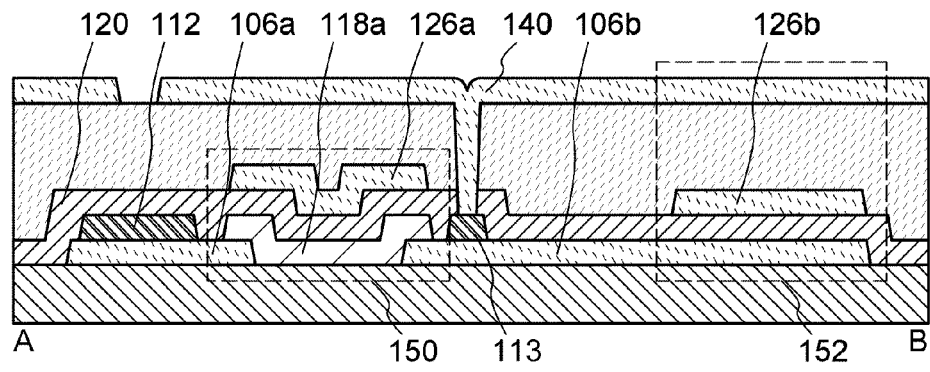
Figure 8A:
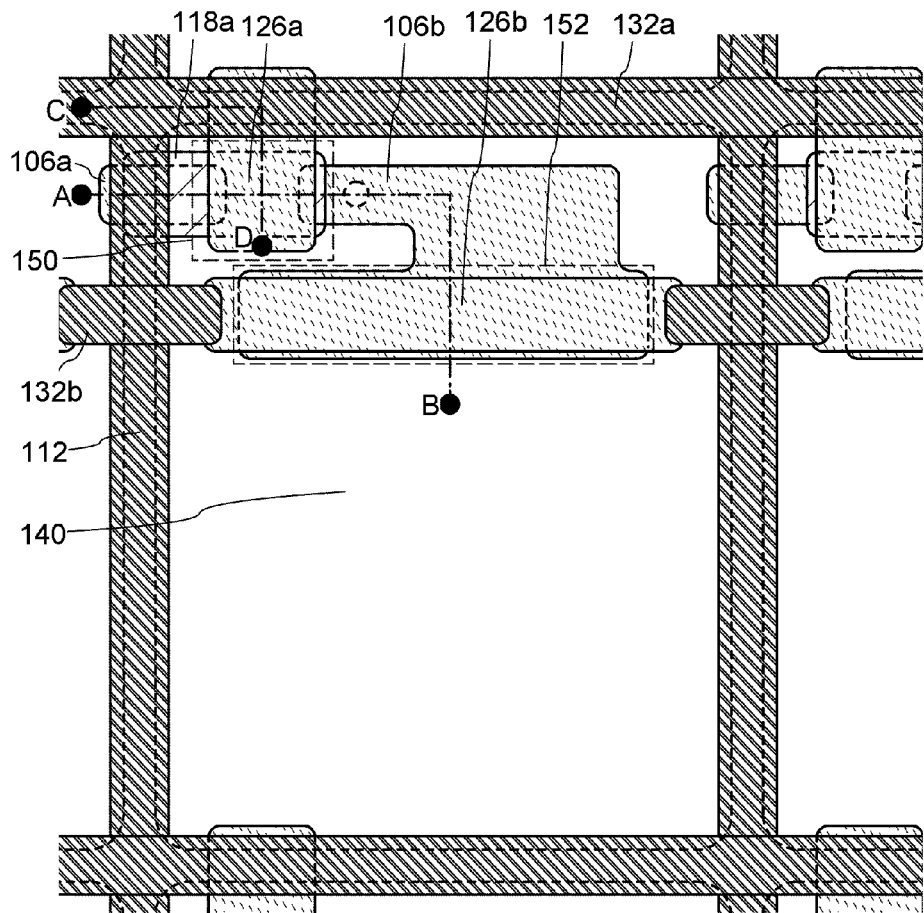
FIG. 8A is a plan view and FIG. 8B is a cross-sectional view of a semiconductor device.
Figure 8B:
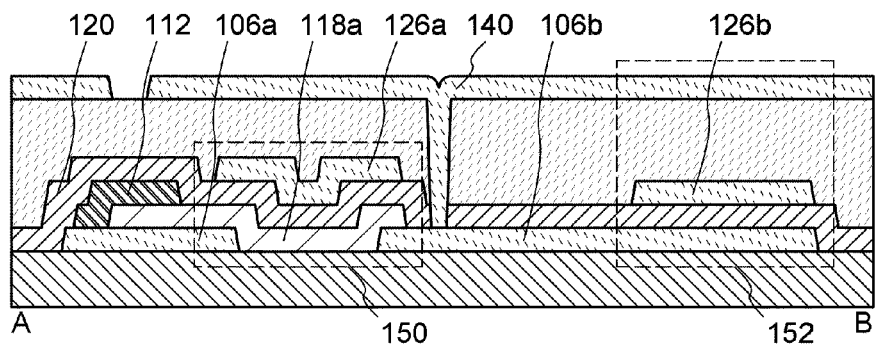

When the conductive layer 112 is formed by etching of the conductive layer 108, a conductive layer 113 may be formed in a region where a contact hole is formed later (see FIGS. 7A and 7B). By employing such a structure, the region where a contact hole is formed can be shielded from light. Accordingly, display defects due to unevenness of a surface of an electrode (a pixel electrode) in a contact region can be reduced, whereby the effect of increasing the contrast and reducing light leakage can be obtained. That is, the object of improving display characteristics can be achieved. Note that although this structure is particularly effective in a liquid crystal display device, it is needless to say that this structure can be applied to other semiconductor devices. In that case, the conductive layer 113 may be formed as appropriate in a region where light needs to be blocked.

Next, a semiconductor layer 114 is formed so as to cover at least the conductive layers 106*a* and 106*b* (see FIGS. 3A1 and 3A2). In this embodiment, the semiconductor layer 114 is formed over the substrate 100 so as to cover the conductive layers 106*a* and 106*b* and the conductive layer 112.

The semiconductor layer 114 can be formed using an In—Ga—Zn—O-based oxide semiconductor material or various kinds of oxide semiconductor materials such as an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, and a Zn—O-based oxide semiconductor. Alternatively, other materials can be used. For example, the semiconductor layer 114 formed using an In—Ga—Zn—O-based oxide semiconductor material can be formed by a sputtering method using an oxide semiconductor target containing In, Ga, and Zn ($In_2O_3$:$Ga_2O_3$:$ZnO$=1:1:1). The condition of sputtering can be set as follows, for example: the distance between the substrate 100 and the target is 30 mm to 500 mm, the pressure is 0.1 Pa to 2.0 Pa, the direct current (DC) power supply is 0.25 kW to 5.0 kW (when a target of 8 inches in diameter is used), and the atmosphere is an argon atmosphere, an oxygen atmosphere, or a mixed atmosphere of argon and oxygen. Note that a ZnO-based non-single-crystal film may be used as the semiconductor layer 114. The semiconductor layer 114 may have a thickness of approximately 5 nm to 200 nm.

As the above sputtering method, an RF sputtering method using a high frequency power supply for a power supply for sputtering, a DC sputtering method, a pulsed DC sputtering method in which a DC bias is applied in a pulse manner, or the like can be employed. Note that a pulsed direct current (DC) power supply is preferably used because dust can be reduced and thickness distribution becomes uniform. In that case, the object of increasing the yield and the reliability of the semiconductor device can be achieved.

Alternatively, a multi-source sputtering apparatus in which a plurality of targets of different materials can be set may be used. In the multi-source sputtering apparatus, a plurality of films can be formed in the same chamber, or one film can be formed by sputtering plural kinds of materials in one chamber at the same time. Moreover, a method of using a magnetron sputtering apparatus in which a magnetic field generating system is provided inside a chamber (a magnetron sputtering method), an ECR sputtering method in which plasma generated by using microwaves is used, or the like may be employed. Furthermore, a reactive sputtering method in which a target substance and a sputtering gas component chemically react with each other during deposition to form a compound, a bias sputtering method in which voltage is also applied to a substrate during deposition, or the like may be used.

Before the semiconductor layer 114 is formed, plasma treatment may be performed on a surface over which the semiconductor layer 114 is to be formed (e.g., surfaces of the conductive layers 106a and 106b and, in the case where the base film is formed, a surface of the base film). With the plasma treatment, dust attached to the surface over which the semiconductor layer 114 is to be formed can be removed. Moreover, by forming the semiconductor layer 114 without exposure to air after the plasma treatment is performed, the conductive layers 106a and 106b can be electrically connected to the semiconductor layer 114 in a favorable manner. In other words, the object of increasing the yield and the reliability of the semiconductor device can be achieved.

In this embodiment, the case where an oxide semiconductor material is used for the semiconductor layer 114 is described; however, one embodiment of the disclosed invention is not limited thereto. If a semiconductor material other than an oxide semiconductor material, a compound semiconductor material, or the like is used, the semiconductor layer can have light transmittance in some cases when its thickness is made smaller. Accordingly, another semiconductor material may be used instead of an oxide semiconductor material. Examples of another semiconductor material are various kinds of inorganic semiconductor materials such as silicon, gallium, and gallium arsenide; an organic semiconductor material such as a carbon nanotube; and a material in which such materials are mixed. Such a material with a variety of modes such as single crystallinity, polycrystallinity, microcrystallinity (including microcrystal state and nanocrystal state), and amorphous state can be used for the semiconductor layer 114.

Next, a resist mask 116a and a resist mask 116b are formed over the semiconductor layer 114, and the semiconductor layer 114 is selectively etched using the resist masks 116a and 116b, so that the semiconductor layer 118a and the semiconductor layer 118b are formed (see FIGS. 3B1 and 3B2). The semiconductor layers 118a and 118b are formed in island shapes. Here, the semiconductor layer 118a serves as an active layer of the transistor. The semiconductor layer 118b serves to reduce the parasitic resistance between wirings. Note that the case where the semiconductor layer 118b is formed is described in this embodiment; however, the semiconductor layer 118b is not necessarily formed.

The resist mask may be formed by a spin coating method or the like. When a droplet discharging method, a screen printing method, or the like is used, the resist mask can be selectively formed. In that case, the object of increasing the productivity can be achieved.

Wet etching or dry etching can be used for etching of the semiconductor layer 114. Here, an unnecessary portion of the semiconductor layer 114 is removed by wet etching using a mixed solution of acetic acid, nitric acid, and phosphoric acid; thus, the semiconductor layers 118a and 118b are formed. After the etching, the resist masks 116a and 116b are removed. An etchant (an etchant solution) used for the wet etching is not limited to the above solution as long as the semiconductor layer 114 can be etched using the etchant.

In the case of performing dry etching, a gas containing chlorine or a gas containing chlorine to which oxygen is added is preferably used. This is because the etching selectivity of the semiconductor layer 114 to the conductive layer and the base film is likely to be high by using a gas containing chlorine and oxygen.

As an etching apparatus used for the dry etching, an etching apparatus using a reactive ion etching method (an RIE method), or a dry etching apparatus using a high-density plasma source such as ECR (electron cyclotron resonance) or ICP (inductively coupled plasma) can be used. Moreover, an etching apparatus with an ECCP (enhanced capacitively coupled plasma) mode may be used, by which electric discharge is likely to be homogeneous in a larger area as compared to the case of an ICP etching apparatus. The ECCP mode etching apparatus can be applied even when a substrate of the tenth generation or later is used.

Note that when the semiconductor layer 118a is formed over the conductive layer 106a functioning as the source electrode of the transistor and the conductive layer 106b functioning as the drain electrode of the transistor, the semiconductor layer 118a is easily thinned as shown in this embodiment. This is because, in the case where the semiconductor layer 118a is placed over the conductive layers 106a and 106b, unlike in the case where the semiconductor layer 118a is placed below the conductive layers 106a and 106b, the semiconductor layer 118a is not removed by over-etching at the time when the conductive layer is etched. Reduction in thickness of the semiconductor layer 118a is realized in such a manner, whereby depletion can be easily realized at the time of applying voltage, and the S value can be reduced. Moreover, the off-state current can be reduced. In other words, the object of realizing higher performance of the semiconductor device can be achieved. Note that the semiconductor layer 118a is preferably formed thinner than the conductive layer 112 functioning as the source wiring, the conductive layer 106a functioning as the source electrode, the conductive layer 132a functioning as the gate wiring, the conductive layer 126a functioning as the gate electrode, and the like.

After that, heat treatment at 200° C. to 600° C., typically 300° C. to 500° C., is preferably performed. Here, heat treatment is performed at 350° C. for an hour in a nitrogen atmosphere. With the heat treatment, semiconductor characteristics of the semiconductor layers 118a and 118b can be improved. Note that there is no particular limitation on the timing of the heat treatment as long as the heat treatment is performed after the semiconductor layers 118a and 118b are formed.

Note that the steps in which the conductive layer 112 is formed after the conductive layers 106a and 106b are formed, and then the semiconductor layer 118a is formed are described in this embodiment; however, the disclosed invention should not be construed as being limited thereto. For example, after the conductive layers 106a and 106b are formed, the semiconductor layer 118a may be formed and then the conductive layer 112 may be formed (see FIGS. 8A and 8B). This structure is effective in reducing the contact resistance with the semiconductor layer 118a.

Note that the conductive layers 106a and 106b are preferably formed thinner than the conductive layer 112. It is advantageous to make the conductive layers 106a and 106b thinner because, although the resistance is increased, the transmittance can be further increased. It is needless to say that one embodiment of the disclosed invention should not be construed as being limited thereto.

Next, the gate insulating layer 120 is formed so as to cover the semiconductor layers 118a and 118b (see FIGS. 3C1 and 3C2).

The gate insulating layer 120 can be formed to have a single-layer structure or a layered structure of a silicon oxide film, a silicon oxynitride film, a silicon nitride film, a silicon nitride oxide film, an aluminum oxide film, an aluminum nitride film, an aluminum oxynitride film, an aluminum nitride oxide film, or a tantalum oxide film. The gate insulating layer 120 can be formed to a thickness of 50 nm to 250 nm by a sputtering method, a CVD method, or the like. Here, as the gate insulating layer 120, a silicon oxide film is formed to a thickness of 100 nm by a sputtering method. Note that the gate insulating layer 120 preferably has a light-transmitting property.

Then, a conductive layer 122 is formed over the gate insulating layer 120 (see FIGS. 3D1 and 3D2). The conductive layer 122 can be formed using a material and a method which are similar to those of the conductive layer 102. Since the description of the conductive layer 102 can be referred to for the details of the conductive layer 122, the description is not repeated. Note that the conductive layer 122 preferably has a light-transmitting property.

When the conductive layer 102 and the conductive layer 122 are formed using the same material, it becomes easy to use a material and a manufacturing device in common, which contributes to reduction in cost, increase in throughput, and the like. Needless to say, it is not essential that the conductive layer 102 and the conductive layer 122 are formed using the same material.

Next, a resist mask 124a and a resist mask 124b are formed over the conductive layer 122, and the conductive layer 122 is selectively etched using the resist masks 124a and 124b, so that the conductive layer 126a and the conductive layer 126b are formed (see FIGS. 4A1 and 4A2). As the etching, either dry etching or wet etching may be used. After the etching, the resist masks 124a and 124b are removed. The conductive layer 126a functions as the gate electrode of the transistor. The conductive layer 126b functions as the electrode (the capacitor electrode) of the storage capacitor.

Note that the area of a region where the conductive layer 106b and the conductive layer 126b overlap with each other can be changed as appropriate. Since the conductive layers 106b and 126b are formed using a light-transmitting material as shown in this embodiment, the aperture ratio is not reduced even when the area of the region where the conductive layers overlap with each other is increased to increase the capacitance value. That is, the object of increasing the capacitance value can be achieved without reduction in aperture ratio.

Figure 9A:
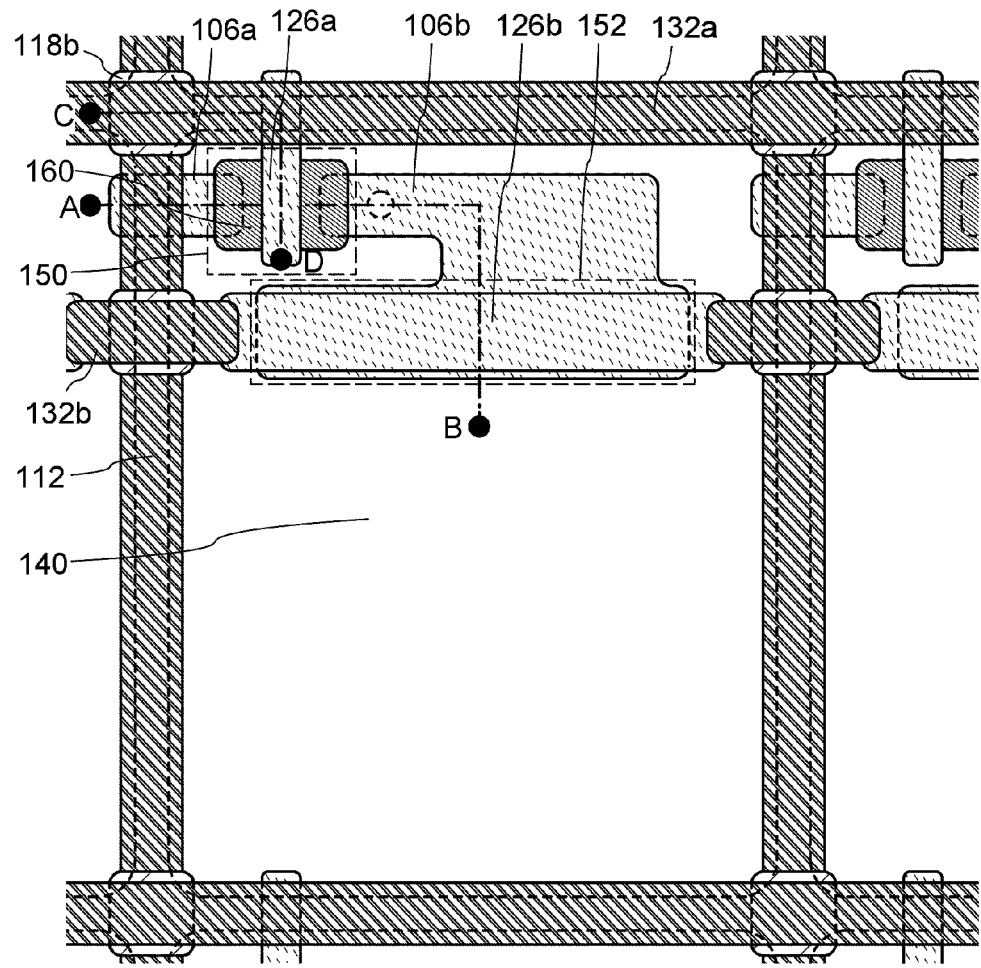
FIG. 9A is a plan view and FIG. 9B is a cross-sectional view of a semiconductor device.
Figure 9B:
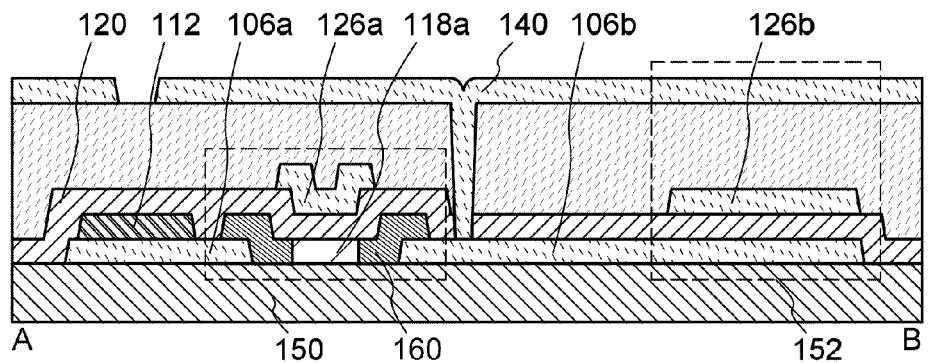
Figure 10A:
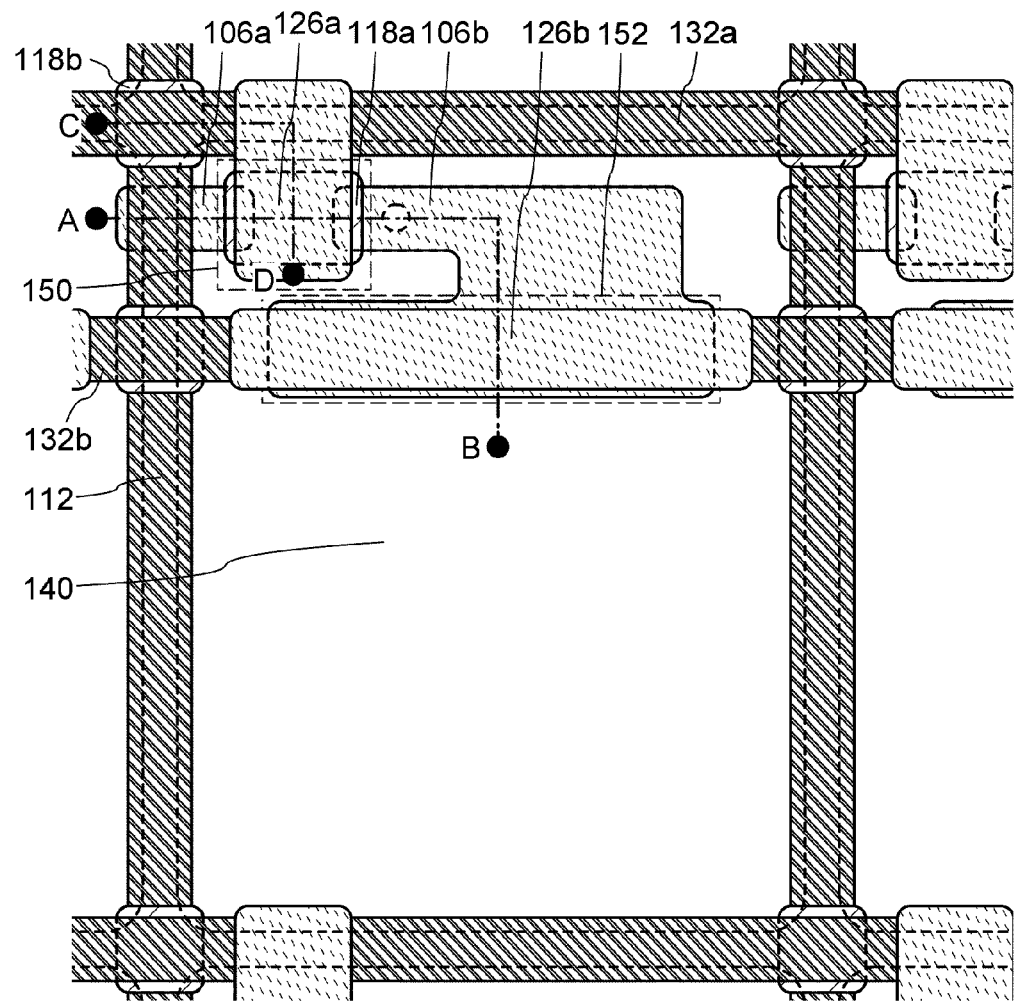
FIG. 10A is a plan view and FIG. 10B is a cross-sectional view of a semiconductor device.
Figure 10B:
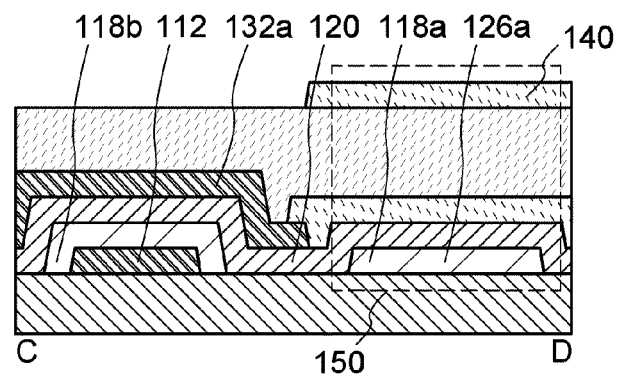

In this embodiment, the conductive layers 106a, 106b, and 126b are formed so that the conductive layer 106a functioning as the source electrode and the conductive layer 106b functioning as the drain electrode overlap with part of the conductive layer 126a functioning as the gate electrode. Alternatively, in the case where the conductivity of part of the semiconductor layer 118a can be increased, a structure may be employed in which the conductive layer 106a or the conductive layer 106b does not overlap with the conductive layer 126a (see FIGS. 9A and 9B). In that case, the conductivity of at least a region 160 in which the conductive layer 106a or the conductive layer 106b does not overlap with the conductive layer 126a is increased. In FIGS. 9A and 9B, the region 160 corresponds to a region of the semiconductor layer 118a, which is adjacent to the conductive layer 106a or the conductive layer 106b. Note that the region 160 may overlap or does not have to overlap with the conductive layer 126a. Moreover, the region 160 preferably overlaps with the conductive layer 106a or the conductive layer 106b; however, this embodiment is not limited thereto.

As a method for increasing the conductivity of the region 160 in the case where an oxide semiconductor material is used for the semiconductor layer 118a, a method where hydrogen is selectively added is used, for example. When an oxide semiconductor material is not used for the semiconductor layer, a method for increasing the conductivity may be selected depending on a material for the semiconductor layer. For example, when the semiconductor layer 118a is formed using a silicon-based material, an impurity element imparting given conductivity, such as phosphorus or boron, may be added.

With the structure in which the conductive layer 106a or the conductive layer 106b does not overlap with the conductive layer 126a in such a manner, the storage capacitance caused by the overlap between the conductive layer 106a (or the conductive layer 106b) and the conductive layer 126a can be reduced. In other words, the object of improving the characteristics of the semiconductor device can be achieved.

Figure 34A:
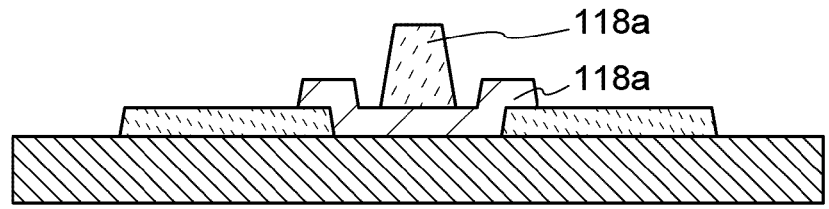
FIGS. 34A to 34C are cross-sectional views illustrating a method for manufacturing a semiconductor device.
Figure 34B:
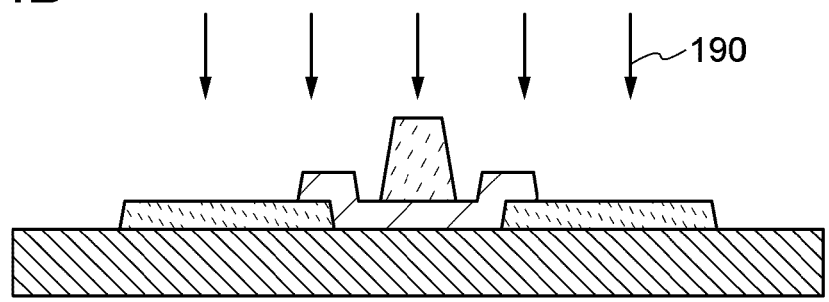
Figure 34C:
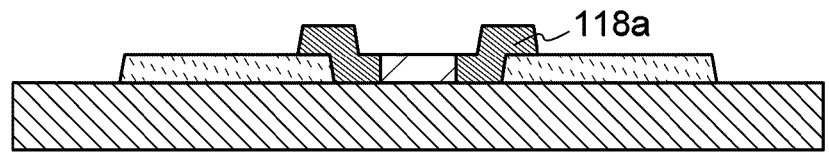
Figure 35A:
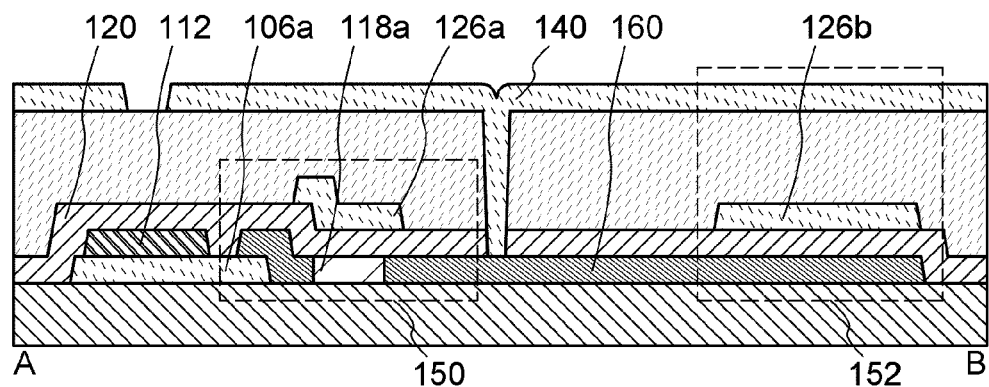
FIGS. 35A and 35B are cross-sectional views each illustrating a semiconductor device.
Figure 35B:
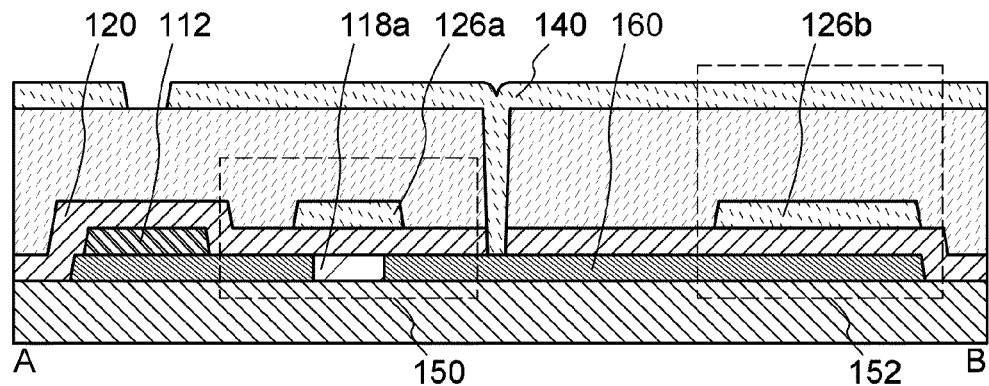

Note that the addition of hydrogen can be performed after any of the following steps, for example: the step of forming the semiconductor layer 114, the step of forming the semiconductor layer 118a, the step of forming the insulating layer 120, or the step of forming the conductive layer 126a. For example, when hydrogen is added after the semiconductor layer 118 is formed, a resist mask 170 is selectively formed over the semiconductor layer 118a (see FIG. 34A), and hydrogen 190 is added (see FIG. 34B), whereby the region 160 can be formed (see FIG. 34C). In that case, the semiconductor device can have a structure illustrated in FIG. 35A or FIG. 35B. This is because the conductivity of the region 160 is increased, so that the need for additional provision of the conductive layer 106b or the like is reduced. FIG. 35A illustrates a structure in which the conductive layer 106b is not provided. FIG. 35B illustrates a structure in which the conductive layers 106a and 106b are not provided. Note that when hydrogen is added after the conductive layer 126a is formed, hydrogen can be added in a self-aligned manner by using the conductive layer 126a as a mask.

Next, a conductive layer 128 is formed so as to cover the conductive layers 126a and 126b (see FIGS. 4B1 and 4B2). The conductive layer 128 can be formed using a material and a method which are similar to those of the conductive layer 108. Since the description of the conductive layer 108 can be referred to for the details of the conductive layer 128, the description is not repeated. In that case also, it is preferable to form the conductive layer 108 and the conductive layer 128 using the same material because reduction in cost, increase in throughput, and the like can be achieved.

Then, a resist mask 130 is formed over the conductive layer 128, and the conductive layer 128 is selectively etched using the resist mask 130, so that the conductive layers 132a and 132b are formed (see FIGS. 4C1 and 4C2, refer to FIG. 1A for the conductive layer 132b). The conductive layer 132a functions as the gate wiring, and the conductive layer 132b functions as the capacitor wiring. Since the conductive layer 132a is formed using a material with a light-shielding property, the conductive layer 132a has a function of shielding light. The resist mask 130 is removed after the conductive layers 132a and 132b are formed.

Note that the steps in which the conductive layers 132a and 132b are formed after the conductive layers 126a and 126b are formed are described in this embodiment; however, the disclosed invention should not be construed as being limited thereto. For example, the order of formation of the conductive layers 126a and 126b and formation of the conductive layers 132a and 132b may be changed. That is, the conductive layer 126a functioning as the gate electrode and the conductive layer 126b functioning as the electrode of the storage capacitor can be formed after the conductive layer 132a functioning as the gate wiring and the conductive layer 132b functioning as the capacitor wiring are formed (see FIGS. 10A and 10B). Note that although the order of formation of the conductive layers 106a and 106b and formation of the conductive layer 112 is not changed in FIGS. 10A and 10B, the order may be changed.

Note that the conductive layers 126a and 126b are preferably formed thinner than the conductive layer 132a or the like. It is advantageous to make the conductive layers 126a and 126b thinner because, although the resistance is increased, the transmittance can be further increased. It is needless to say that one embodiment of the disclosed invention should not be construed as being limited thereto.

Figure 11A:
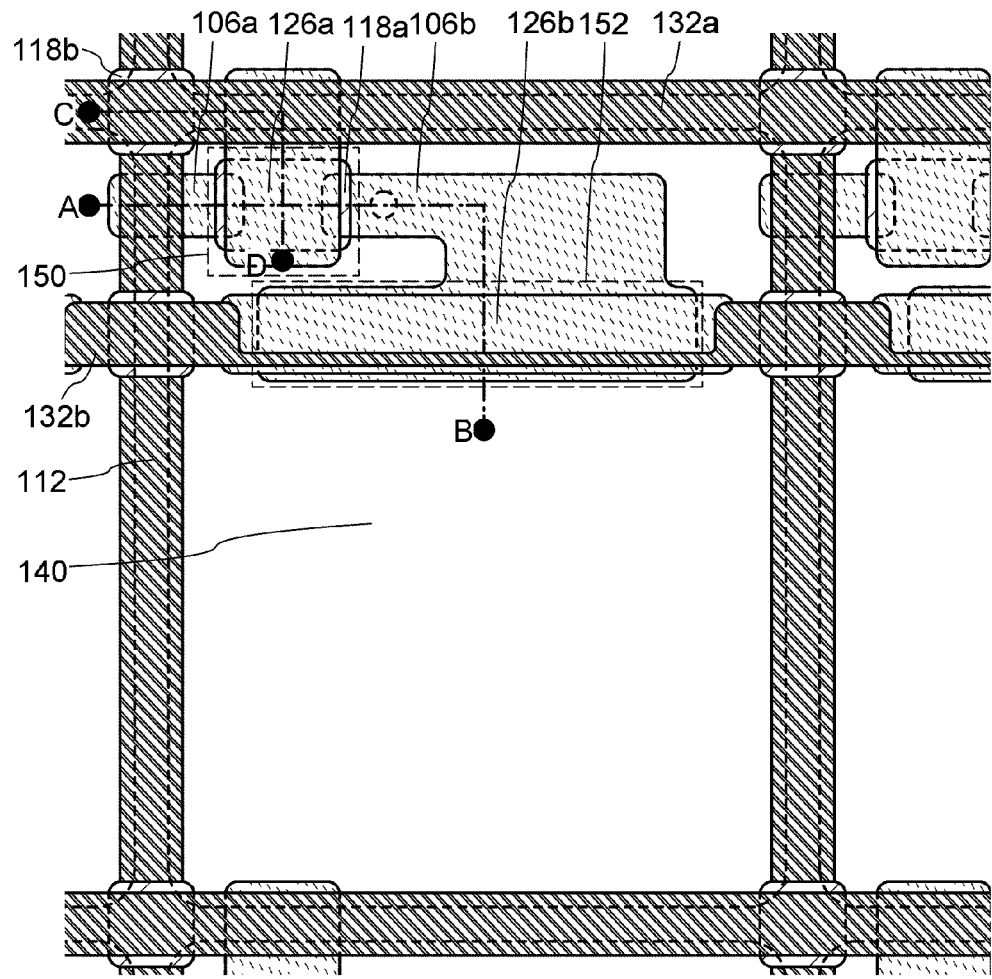
FIG. 11A is a plan view and FIG. 11B is a cross-sectional view of a semiconductor device.
Figure 11B:
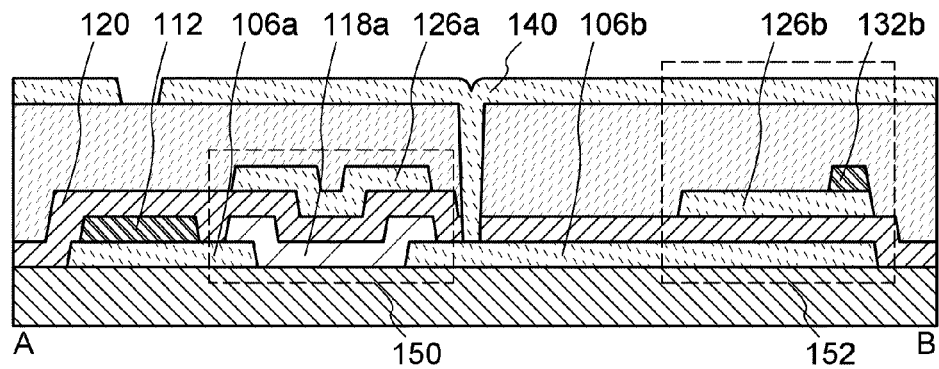

Alternatively, the conductive layer 132b may be formed so as to remain over the conductive layer 126b (see FIGS. 11A and 11B). By forming the conductive layer 132b in such a manner, the wiring resistance of the capacitor wiring can be reduced. Note that it is preferable that the width of the conductive layer 132b over the conductive layer 126b be sufficiently smaller than that of the conductive layer 126b. By forming the conductive layer 132b in this manner, the object of reducing the wiring resistance of the capacitor wiring can be achieved without substantial reduction in aperture ratio.

Next, an insulating layer 134 is formed so as to cover the gate insulating layer 120, the conductive layers 126a and 126b, and the conductive layers 132a and 132b (see FIGS. 4D1 and 4D2). A surface of the insulating layer 134 is preferably made flat because an electrode (the pixel electrode) is formed later on the surface. In particular, in one embodiment of the disclosed invention, a variety of elements can be formed using a light-transmitting material, so that a region where these elements are formed can be used as a display region (an opening region). Accordingly, it is extremely useful to form the insulating layer 134 so that unevenness caused by an element and a wiring is reduced.

The insulating layer 134 can be formed to have a single-layer structure or a layered structure of an insulating film formed using a material containing oxygen and/or nitrogen, such as silicon oxide, silicon nitride, silicon oxynitride, or silicon nitride oxide; a film containing carbon such as a diamond-like carbon (DLC); a film formed using an organic material such as epoxy, polyimide, polyamide, polyvinylphenol, benzocyclobutene, or acrylic or a siloxane material such as a siloxane resin. For example, a film containing silicon nitride is preferably used to increase the reliability of the element because the film containing silicon nitride is highly effective in blocking impurities. Moreover, a film containing an organic material is preferably used to improve the characteristics of the element because the film containing the organic material can effectively reduce unevenness. Note that when the insulating layer 134 has a layered structure of a film containing silicon nitride and a film containing an organic material, it is preferable that the film containing silicon nitride be arranged on the lower side (on the side nearer to the element) in the drawing and the film containing the organic material be arranged on the upper side (on the side of the surface where the pixel electrode is formed). The insulating layer 134 preferably has a sufficient light-transmitting property.

Figure 36A:
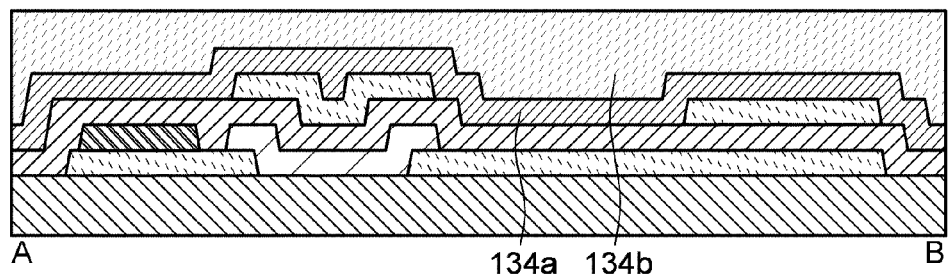
FIGS. 36A to 36C are cross-sectional views illustrating a method for manufacturing a semiconductor device.
Figure 36B:
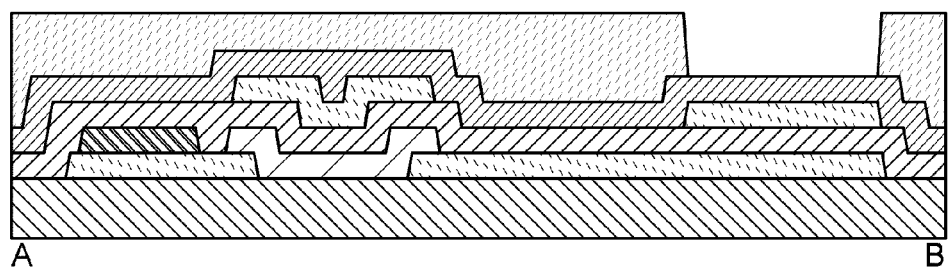
Figure 36C:
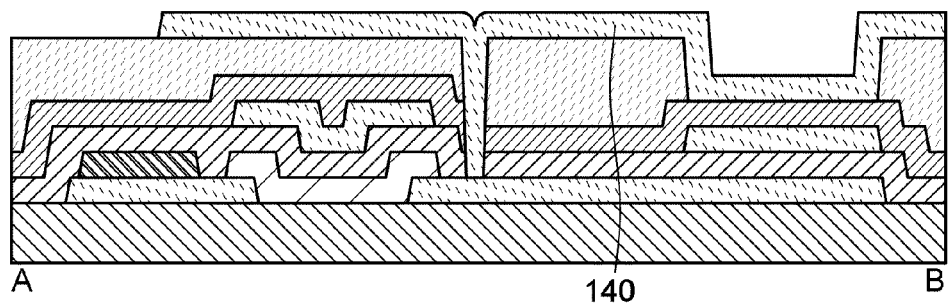

When the insulating layer 134 has a two-layer structure of an insulating layer 134a and an insulating layer 134b (see FIG. 36A), a region of the insulating layer 134b, which overlaps with the conductive layer 126b, is removed by etching (see FIG. 36B), so that it is possible to increase the capacitance value of a capacitor formed between the conductive layer 126b and the conductive layer 140 which is formed later (see FIG. 36C). Note that one embodiment of the disclosed invention is not limited to the above, and the insulating layer 134 may have a multi-layer structure of three layers or more.

The insulating layer 134 may be formed to have a function of a color filter. When a color filter is thus formed over a substrate where the element is formed, alignment in attaching a counter substrate or the like becomes easy. It is needless to say that the insulating layer 134 does not necessarily have a function of a color filter, and a layer functioning as a color filter may be additionally formed over the substrate 100. Note that in one embodiment of the disclosed invention, the source wiring, the gate wiring, and the like are formed using a material with a light-shielding property. Accordingly, a portion between pixels can be shielded from light without additionally forming a black mask (a black matrix). That is, a high-performance semiconductor device can be provided while a process can be simplified as compared to the case where a black mask is additionally formed. It is needless to say that one embodiment of the disclosed invention should not be construed as being limited thereto, and a black mask may be additionally formed.

Note that in the case where great inconvenience is not caused without the insulating layer 134, a structure in which the insulating layer 134 is not formed can be employed. In that case, there is an advantage in that a process can be simplified.

After that, a contact hole 136 which reaches the conductive layer 106b is formed in the insulating layer 134, and part of the surface of the conductive layer 106b is exposed (see FIGS. 5A1 and 5A2).

Then, a conductive layer 138 is formed so as to cover the insulating layer 134 (see FIGS. 5B1 and 5B2). Since the contact hole is formed in the insulating layer 134, the conductive layer 106b and the conductive layer 138 are electrically connected to each other.

The conductive layer 138 can be formed using a material and a method which are similar to those of the conductive layers 102 and 122. Since the description of the conductive layers 102 and 122 can be referred to for the details of the conductive layer 138, the description is not repeated. Note that the conductive layer 138 preferably has a light-transmitting property. In that case also, it is preferable to form the conductive layers 102, 122, and 138 using the same material because reduction in cost, increase in throughput, and the like can be achieved.

Next, a resist mask is formed over the conductive layer 138, and the conductive layer 138 is selectively etched using the resist mask, so that the conductive layer 140 is formed (see FIGS. 5C1 and 5C2). Here, the conductive layer 140 functions as the pixel electrode.

Note that the conductive layer 140 is preferably formed so that an end portion of the conductive layer 140 overlaps with the conductive layer 112 or the conductive layer 132a. By forming the conductive layer 140 in such a manner, the aperture ratio of a pixel can be maximized and unnecessary light leakage or the like can be reduced. Accordingly, the effect of increasing the contrast can be obtained. That is, the object of improving the characteristics of a display device can be achieved.

Although not illustrated, the source wiring, the source electrode, the gate wiring, the gate electrode, the capacitor wiring, the capacitor electrode, and the like can be connected to each other by using a conductive layer formed of the conductive layer 138. In other words, the conductive layer formed of the conductive layer 138 can function as a variety of wirings.

Thus, a semiconductor device including the transistor 150 with a light-transmitting property and the storage capacitor 152 with a light-transmitting property can be formed (see FIGS. 5C1 and 5C2).

The transistor 150 and the storage capacitor 152 are formed using a light-transmitting material as described above, so that light can pass a region where the source electrode, the drain electrode, the gate electrode, and the like are formed; thus, the aperture ratio of a pixel can be increased. The conductive layer functioning as the source wiring, the gate wiring, or the capacitor wiring is formed using a low resistance material, whereby the wiring resistance can be reduced and power consumption can be increased. Moreover, distortion of waveforms of signals can be reduced, and a voltage drop due to wiring resistance can be suppressed. Further, the source wiring, the gate wiring, and the like are formed using a material with a light-shielding property, so that a portion between pixels can be shielded from light without additionally forming a black mask (a black matrix). That is, a high-performance semiconductor device can be provided while a process can be simplified as compared to the case where a black mask is additionally formed.

In addition, the capacitor electrode is formed using a light-transmitting material, whereby the area of the capacitor electrode can be increased sufficiently. That is, the capacitance value of the storage capacitor can be increased sufficiently. Accordingly, a potential holding property of the pixel electrode is improved, and the display quality is improved. Moreover, a feed-through potential can be reduced. Further, crosstalk can be reduced. Furthermore, flickers can be reduced.

Since the transistor 150 is formed using a material with a light-transmitting property, the degree of freedom in setting the channel length (L) and the channel width (W) of the transistor 150 is high (i.e., the degree of freedom for the layout is high). This is because the aperture ratio is not affected by the channel length and the channel width. Note that when the element is used for an object which does not need the transmittance, such as a driver circuit, the element may be formed using a material without a light-transmitting property. In that case, an element used in a pixel portion and an element used in other regions (e.g., a driver circuit) can be separately formed.

Figure 37A:
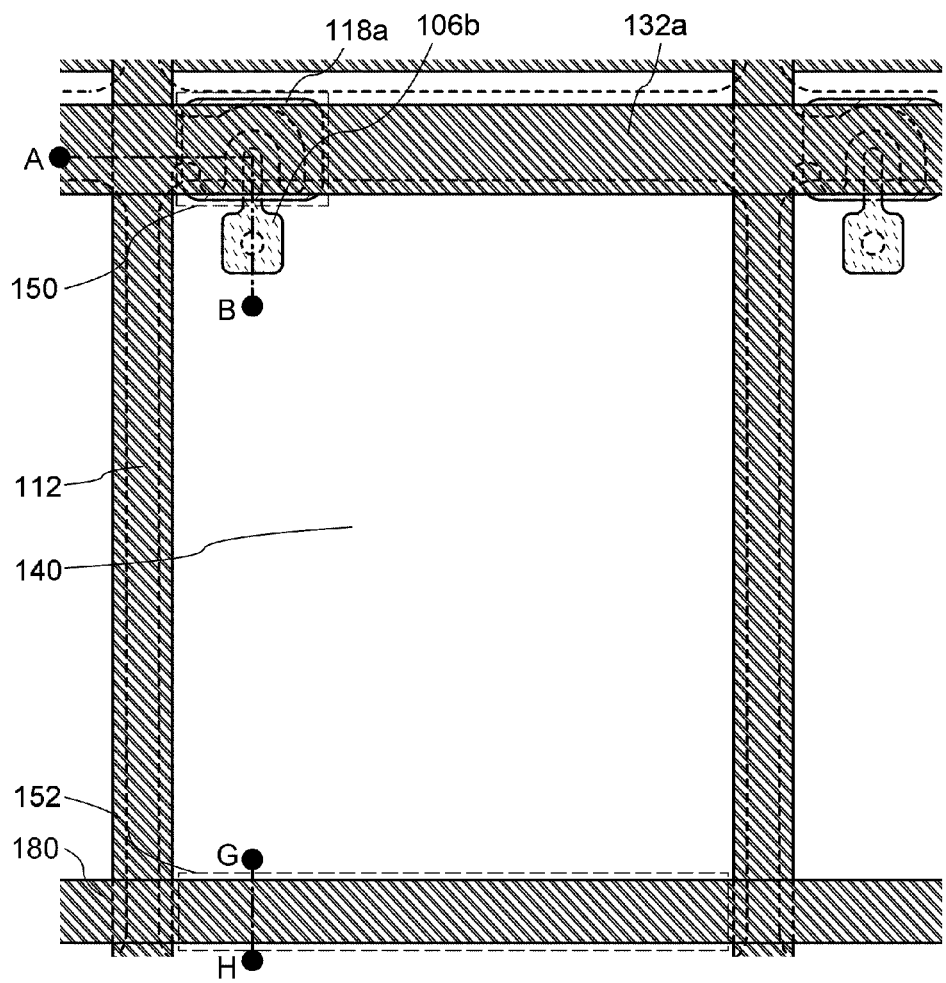
FIG. 37A is a plan view and FIG. 37B is a cross-sectional view of a semiconductor device.
Figure 37B:
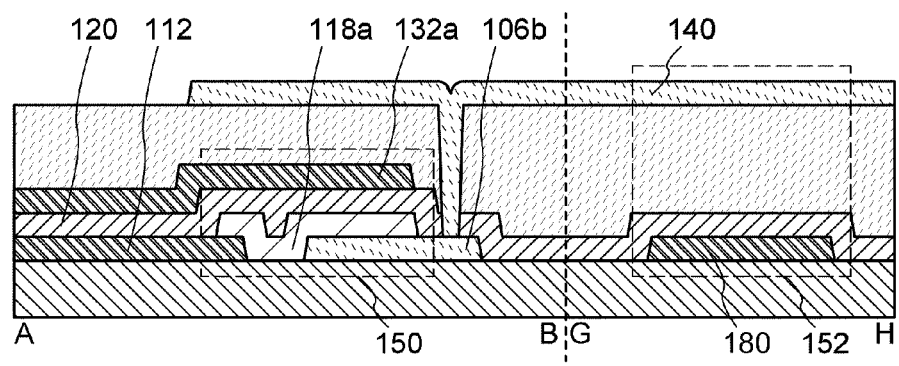
Figure 38A:
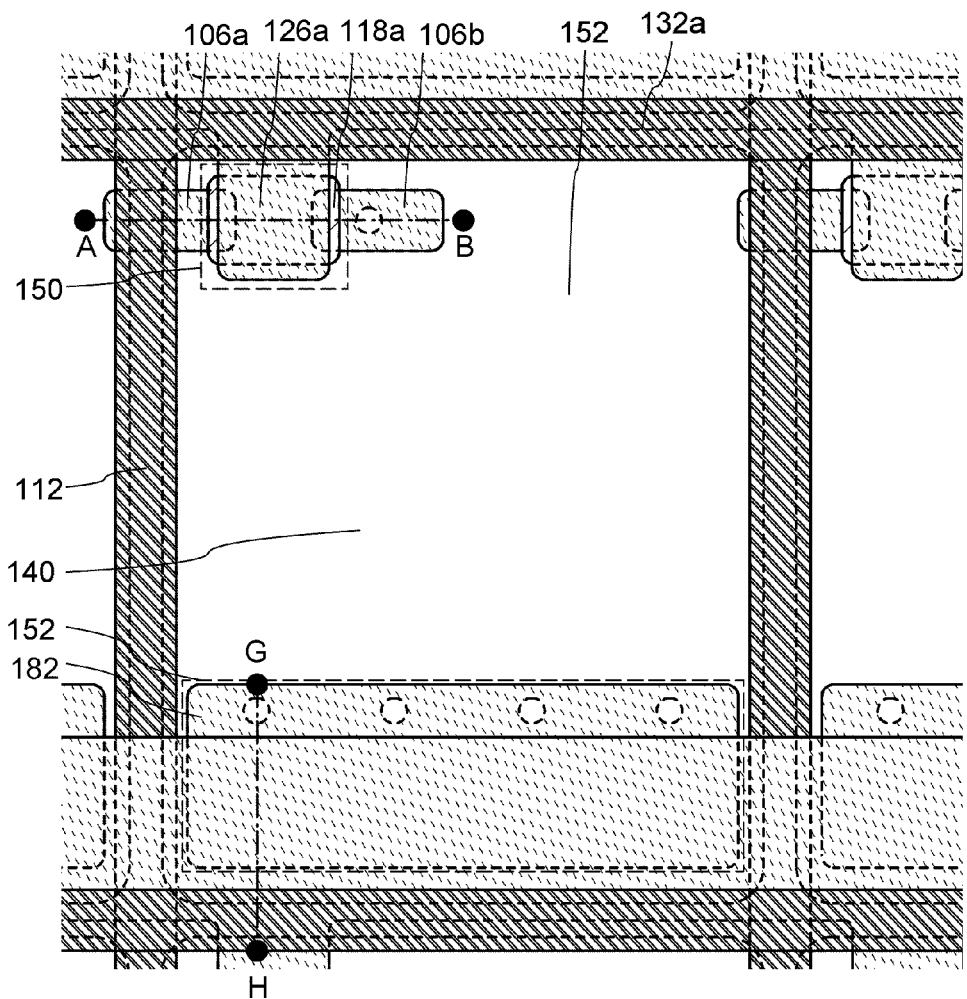
FIG. 38A is a plan view and FIG. 38B is a cross-sectional view of a semiconductor device.
Figure 38B:
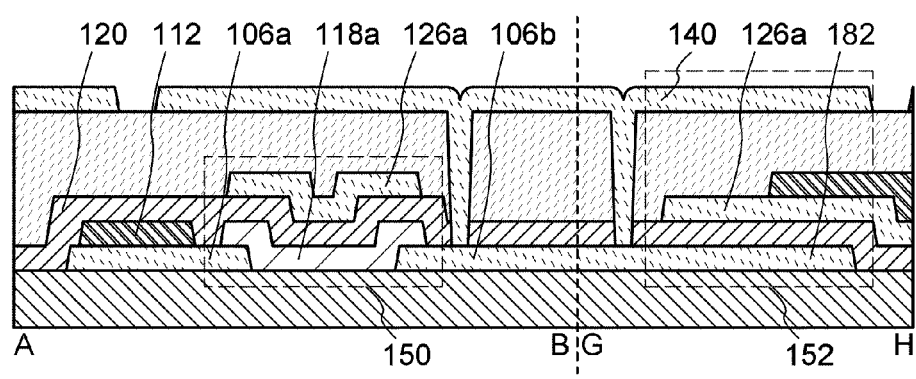

FIGS. 37A and 37B and FIGS. 38A and 38B illustrate other examples of a structure of a semiconductor device. FIGS. 37A and 37B illustrate an example in which the conductive layer 112 functioning as the source wiring has a function of the source electrode, and the conductive layer 132a functioning as the gate wiring has a function of the gate electrode. Here, the conductive layers 112 and 132a can be formed using a material with high conductivity. On the other hand, the conductive layer 106b functioning as the drain electrode is preferably formed using a material with a light-transmitting property. Note that a conductive layer 180 functioning as the capacitor wiring may be formed using a material with high conductivity or a material with a light-transmitting property. FIGS. 38A and 38B illustrate an example in which the conductive layer 126a functioning as the gate electrode has a function of one electrode of the storage capacitor. That is, a conductive layer functioning as a gate wiring of the previous stage or the next stage (corresponding to the conductive layer 132a) has a function of the capacitor wiring. Here, a conductive layer 182 formed in the same step as the conductive layer 106a or the conductive layer 106b has a function of the other electrode of the storage capacitor. Since the conductive layer 182 is formed in a region overlapping with the pixel portion, the conductive layer 182 is preferably formed using a material with a light-transmitting property.

Note that the channel length (L) and the channel width (W) of the transistor can be larger than the width of the conductive layer 132a or the like. This is because the semiconductor layer 118a is formed using a light-transmitting material, so that the aperture ratio does not depend on the size of the semiconductor layer 118a. However, one embodiment of the disclosed invention is not construed as being limited thereto. A plurality of transistors may be arranged in series or in parallel. Accordingly, the number of transistors can be increased.

This embodiment can be implemented in combination with any of the other embodiments as appropriate.

Embodiment 2

In this embodiment, another example of a method for manufacturing a semiconductor device will be described with reference to FIGS. 12A and 12B, FIGS. 13A1 to 13D1 and 13A2 to 13D2, FIGS. 14A1 to 14C1 and 14A2 to 14C2, FIGS. 15A1 to 15C1 and 15A2 to 15C2, and FIGS. 16A1 to 16C1 and 16A2 to 16C2. Note that the method for manufacturing the semiconductor device according to this embodiment has a lot in common with the manufacturing method according to Embodiment 1. Therefore, in the following description, the description of the same structures, the same reference numerals, and the like are not repeated.

Figure 12A:
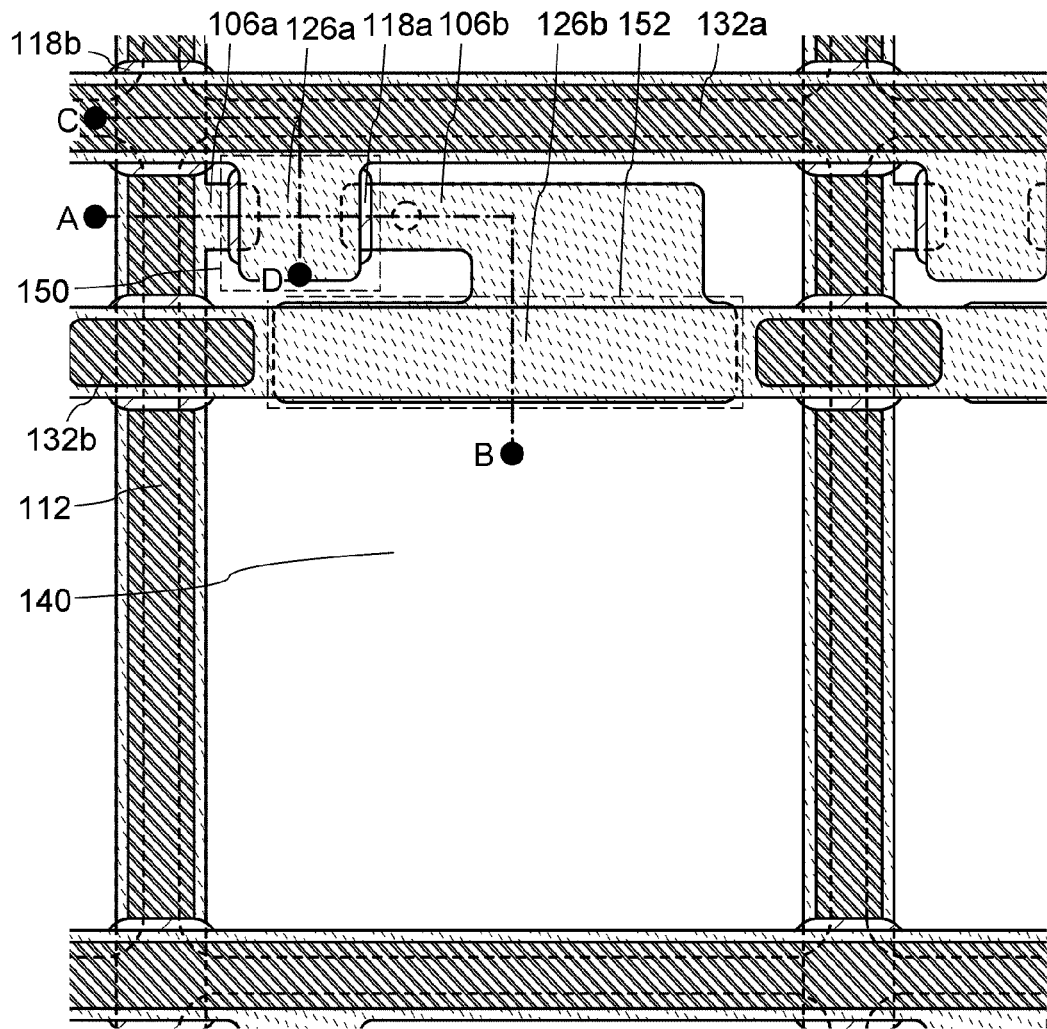
FIG. 12A is a plan view and FIG. 12B is a cross-sectional view of a semiconductor device.
Figure 12B:
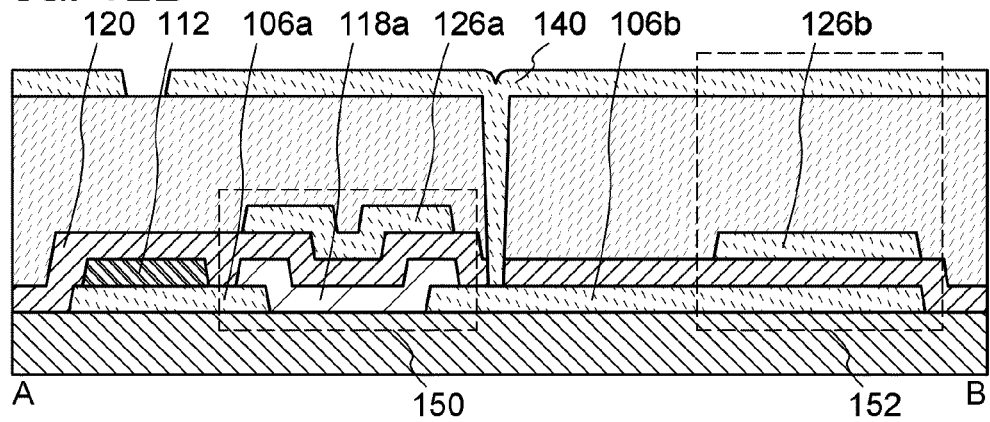

FIGS. 12A and 12B illustrate an example of a structure of a semiconductor device according to this embodiment. In the structure in FIGS. 12A and 12B, the conductive layers with a light-transmitting property (e.g., the conductive layers 106a, 126a, and 126b) are placed below the conductive layers with a light-shielding property (e.g., the conductive layers 112, 132a, and 132b) (see FIGS. 12A and 12B). FIG. 12A is a plan view, and FIG. 12B is a cross-sectional view along A-B in FIG. 12A.

Next, an example of a method for manufacturing the semiconductor device will be described.

First, the conductive layer 102 and the conductive layer 108 are sequentially stacked over the substrate 100 having the insulating surface (see FIGS. 13A1 and 13A2). It is possible to refer to Embodiment 1 for the details of the substrate 100 having the insulating surface, the conductive layer 102, and the conductive layer 108.

Although not shown, a base film is preferably provided over the substrate 100 having the insulating surface. It is possible to refer to Embodiment 1 for the details of the base film. Note that one embodiment of the disclosed invention is not limited to formation of the base film.

Next, a resist mask 105a and a resist mask 105b are formed over the conductive layer 108, and the conductive layers 102 and 108 are selectively etched using the resist masks 105a and 105b, so that the conductive layer 106a, the conductive layer 106b, a conductive layer 109a, and a conductive layer 109b are formed (see FIGS. 13B1 and 13B2).

One of the differences between the method for manufacturing the semiconductor device according to this embodiment and that according to Embodiment 1 is an etching step of the conductive layer 102 and the conductive layer 108. In this embodiment, the resist masks 105a and 105b used in the etching step are formed using a multi-tone mask.

A multi-tone mask is a mask capable of light exposure with multi-level amount of light. With the use of a multi-tone mask, light exposure is performed with three levels of light amount to provide an exposed region, a half-exposed region, and an unexposed region. That is, a multi-tone photomask makes it possible to form a resist mask with plural thicknesses (typically, two levels of thicknesses) by one-time exposure and development. Accordingly, by using a multi-tone mask, the number of photomasks to be used can be reduced.

Typical examples of a multi-tone mask are a gray-tone mask and a half-tone mask. The gray-tone mask includes a light-shielding portion formed over a light-transmitting substrate by using a material layer with a light-shielding property, and a slit portion provided in the material layer with a light-shielding property. The slit portion has slits (including dots, meshes, and the like) that are provided at intervals which are less than or equal to the resolution limit of light used for light exposure, so that the slit portion has a function of controlling the light transmittance. Note that the slit portion can have slits at regular intervals or irregular intervals. The half-tone mask includes a light-shielding portion formed over a light-transmitting substrate by using a material layer with a light-shielding property, and a semi-transmissive portion formed using a material layer with a predetermined light-transmitting property. The semi-transmissive portion has light transmittance depending on a material and the thickness of the material layer. The light transmittance of the semi-transmissive portion is approximately in the range of 10% to 70%.

FIGS. 17A1 and 17B1 each illustrate a cross section of a typical multi-tone mask. FIG. 17A1 shows a gray-tone mask 400. FIG. 17B1 shows a half-tone mask 410.

The gray-tone mask 400 illustrated in FIG. 17A1 includes a light-shielding portion 402 formed over a light-transmitting substrate 401 by using a material layer with a light-shielding property, and a slit portion 403 formed using patterns of the material layer with a light-shielding property.

The slit portion 403 has slits provided at intervals which are less than or equal to the resolution limit of light used for light exposure. For the light-transmitting substrate 401, a quartz substrate or the like can be used. The light-shielding layer forming the light-shielding portion 402 and the slit portion 403 may be formed using a metal film, and is preferably formed using chromium, chromium oxide, or the like. When light is emitted to the gray-tone mask 400 illustrated in FIG. 17A1, the light transmittance illustrated in FIG. 17A2 is obtained.

The half-tone mask 410 illustrated in FIG. 17B1 includes a light-shielding portion 412 formed over a light-transmitting substrate 411 by using a material layer with a light-shielding property, and a semi-transmissive portion 413 formed using a material layer with a predetermined light-transmitting property.

The semi-transmissive portion 413 can be formed using a material layer of MoSiN, MoSi, MoSiO, MoSiON, CrSi, or the like. The light-shielding portion 412 may be formed using a material similar to that for the light-shielding portion of the gray-tone mask. Note that in FIG. 17B1, the light-shielding portion 412 has a layered structure of the material layer with a predetermined light-transmitting property and the material layer with a light-shielding property. When light is emitted to the half-tone mask 410 illustrated in FIG. 17B1, the light transmittance illustrated in FIG. 17B2 is obtained.

Light exposure and development are performed using the above-described multi-tone mask, whereby the resist mask 105a having regions with different thicknesses can be formed.

Wet etching or dry etching may be used for etching of the conductive layers 102 and 108. Note that at this stage, both the conductive layer 102 and the conductive layer 108 need to be etched. This etching determines the shape of the conductive layer 106a, which functions as the source electrode of the transistor, and the conductive layer 106b, which functions as the drain electrode of the transistor and the electrode of the storage capacitor.

Next, the resist mask 105a is recessed to form a resist mask 111 and the resist mask 105b is removed, and the conductive layer 109a is selectively etched using the resist mask 111 to form the conductive layer 112 and the conductive layer 109b is removed (see FIGS. 13C1 and 13C2). An example of a method for recessing the resist mask 105a (and a method for removing the resist mask 105b) is ashing treatment using oxygen plasma. Note that the method is not limited thereto.

Either wet etching or dry etching may be used for etching the conductive layer 109a and removing the conductive layer 109b. Note that at this stage, etching is performed in a condition that high selectivity of the conductive layer 109a (the conductive layer 109b) to the conductive layer 106a (the conductive layer 106b) is obtained. In other words, it is important that the shape of the conductive layers 106a and 106b be not changed much by the etching. This etching determines the shape of the conductive layer 112, which functions as the source wiring of the transistor. Here, since the conductive layer 112 is formed using a material with a light-shielding property, the conductive layer 112 has a function of shielding light.

Note that the resist mask 111 is removed after the etching. In order to improve the coverage of the above conductive layers with an insulating layer and the like which are formed later and prevent disconnection, it is preferable to form the conductive layers with their end portions tapered. By forming the conductive layers to be tapered in such a manner, the object of increasing the yield of the semiconductor device can be achieved. Eventually, increase in manufacturing costs of the semiconductor device can be suppressed.

Alternatively, when the conductive layer 112 is formed by etching of the conductive layer 109a, a conductive layer may be formed in a region where a contact hole is formed later (which corresponds to FIGS. 7A and 7B in Embodiment 1). By employing such a structure, the region where a contact hole is formed can be shielded from light. Accordingly, display defects due to unevenness of a surface of an electrode (a pixel electrode) in a contact region can be reduced, whereby the contrast can be increased. That is, the object of improving display characteristics can be achieved. Note that although this structure is particularly effective in a liquid crystal display device, it is needless to say that this structure can be applied to other semiconductor devices. In that case, a conductive layer may be formed as appropriate in a region where light needs to be blocked.

Next, the semiconductor layer 114 is formed so as to cover at least the conductive layers 106a and 106b (see FIGS. 13D1 and 13D2). In this embodiment, the semiconductor layer 114 is formed over the substrate 100 so as to cover the conductive layers 106a, 106b, and 112. It is possible to refer to Embodiment 1 for the details of the semiconductor layer 114.

Before the semiconductor layer 114 is formed, plasma treatment may be performed on a surface over which the semiconductor layer 114 is to be formed (e.g., surfaces of the conductive layers 106a and 106b and, in the case where the base film is formed, a surface of the base film). With the plasma treatment, dust attached to the surface over which the semiconductor layer 114 is to be formed can be removed. Moreover, by forming the semiconductor layer 114 without exposure to air after the plasma treatment is performed, the conductive layers 106a and 106b can be electrically connected to the semiconductor layer 114 in a favorable manner. In other words, the object of increasing the yield and the reliability of the semiconductor device can be achieved.

Next, the resist mask 116a and the resist mask 116b are formed over the semiconductor layer 114, and the semiconductor layer 114 is selectively etched using the resist masks 116a and 116b, so that the semiconductor layer 118a and the semiconductor layer 118b are formed (see FIGS. 14A1 and 14A2). It is possible to refer to Embodiment 1 for the details of this step.

After that, heat treatment at 200° C. to 600° C., typically 300° C. to 500° C., is preferably performed. Here, heat treatment is performed at 350° C. for an hour in a nitrogen atmosphere. With the heat treatment, semiconductor characteristics of the semiconductor layers 118*a* and 118*b* can be improved. Note that there is no particular limitation on the timing of the heat treatment as long as the heat treatment is performed after the semiconductor layers 118*a* and 118*b* are formed.

Next, the gate insulating layer 120 is formed so as to cover the semiconductor layers 118*a* and 118*b* (see FIGS. 14B1 and 14B2). It is possible to refer to Embodiment 1 for the details of the gate insulating layer 120.

Then, the conductive layer 122 and the conductive layer 128 are sequentially stacked over the gate insulating layer 120 (see FIGS. 14C1 and 14C2). It is possible to refer to Embodiment 1 for the details of the conductive layers 122 and 128.

Although not illustrated, a base film is preferably provided over the substrate 100 having the insulating surface. It is possible to refer to Embodiment 1 for the details of the base film.

Next, a resist mask 117*a* and a resist mask 117*b* are formed over the conductive layer 128, and the conductive layers 122 and 128 are selectively etched using the resist masks 117*a* and 117*b*, so that the conductive layers 126*a* and 126*b* and conductive layers 129*a* and 129*b* are formed (see FIGS. 15A1 and 15A2).

One of the differences between the method for manufacturing the semiconductor device according to this embodiment and that according to Embodiment 1 is an etching step of the conductive layer 122 and the conductive layer 128. In this embodiment, the resist masks 117*a* and 117*b* used in the etching step are formed using a multi-tone mask. It is possible to refer to the description of the resist masks 105*a* and 105*b* for the details of the multi-tone mask and the like.

Light exposure and development are performed using the multi-tone mask; whereby the resist mask 117*a* having regions with different thicknesses can be formed.

Wet etching or dry etching may be used for etching of the conductive layers 122 and 128. Note that at this stage, both the conductive layer 122 and the conductive layer 128 need to be etched. This etching determines the shape of the conductive layer 126*a*, which functions as the gate electrode of the transistor, and the conductive layer 126*b*, which functions as the electrode of the storage capacitor.

Next, the resist mask 117*a* is recessed to form a resist mask 131 and the resist mask 117*b* is removed, and the conductive layer 129*a* is selectively etched using the resist mask 131 to form the conductive layers 132*a* and 132*b* and the conductive layer 129*b* is removed (see FIGS. 15B1 and 15B2, refer to FIG. 12A for the conductive layer 132*b*). It is possible to refer to the description of the method for recessing the resist mask 105*a* (and the method for removing the resist mask 105*b*) and the description of etching of the conductive layer 109*a* (removal of the conductive layer 109*b*) for the details of a method for recessing the resist mask 117*a* (and a method for removing the resist mask 117*b*) and etching of the conductive layer 129*a* (removal of the conductive layer 129*b*). Note that at this stage, etching is performed in a condition that high selectivity of the conductive layer 129*a* (the conductive layer 129*b*) to the conductive layer 126*a* (the conductive layer 126*b*) is obtained. In other words, it is important that the shape of the conductive layers 126*a* and 126*b* be not changes much by the etching. This etching determines the shape of the conductive layer 132*a*, which functions as the gate wiring of the transistor, and the conductive layer 132*b*, which functions as a wiring of the storage capacitor. Here, since the conductive layer 132*a* is formed using a material with a light-shielding property, the conductive layer 132*a* has a function of shielding light.

Note that the resist mask 131 is removed after the etching. In order to improve the coverage of the above conductive layers with an insulating layer and the like which are formed later and prevent disconnection, it is preferable to form the conductive layers with their end portions tapered. By forming the conductive layers to be tapered in such a manner, the object of increasing the yield of the semiconductor device can be achieved.

Note that the area of a region where the conductive layer 106*b* and the conductive layer 126*b* overlap with each other can be changed as appropriate. Since the conductive layers 106*b* and 126*b* are formed using a light-transmitting material as shown in this embodiment, the aperture ratio is not reduced even when the area of the region where the conductive layers overlap with each other is increased to increase the capacitance value. That is, the object of increasing the capacitance value can be achieved without reduction in aperture ratio.

In this embodiment, the conductive layers 106*a*, 106*b*, and 126*b* are formed so that the conductive layer 106*a* functioning as the source electrode and the conductive layer 106*b* functioning as the drain electrode overlap with part of the conductive layer 126*a* functioning as the gate electrode. Alternatively, in the case where the conductivity of part of the semiconductor layer 118*a* can be increased, a structure may be employed in which the conductive layer 106*a* or the conductive layer 106*b* does not overlap with the conductive layer 126*a* (which corresponds to FIGS. 9A and 9B in Embodiment 1). It is possible to refer to Embodiment 1 for the details. With the structure in which the conductive layer 106*a* or the conductive layer 106*b* does not overlap with the conductive layer 126*a* in such a manner, the storage capacitance caused by the overlap between the conductive layer 106*a* (or the conductive layer 106*b*) and the conductive layer 126*a* can be reduced. In other words, the object of improving the characteristics of the semiconductor layer can be achieved.

Alternatively, the conductive layer 132*b* may be formed so as to remain over the conductive layer 126*b* (which corresponds to FIGS. 11A and 11B in Embodiment 1). By forming the conductive layer 132*b* in such a manner, the wiring resistance of the capacitor wiring can be reduced. Note that it is preferable that the width of the conductive layer 132*b* over the conductive layer 126*b* be sufficiently smaller than that of the conductive layer 126*b*. By forming the conductive layer 132*b* in this manner, the object of reducing the wiring resistance of the capacitor wiring can be achieved without substantial reduction in aperture ratio.

Next, the insulating layer 134 is formed so as to cover the gate insulating layer 120, the conductive layers 126*a* and 126*b*, and the conductive layers 132*a* and 132*b* (see FIGS. 15C1 and 15C2). It is possible to refer to Embodiment 1 for the details of the insulating layer 134.

Note that in the case where great inconvenience is not caused without the insulating layer 134, a structure in which the insulating layer 134 is not formed can be employed. In that case, there is an advantage in that a process can be simplified.

After that, the contact hole 136 which reaches the conductive layer 106*b* is formed in the insulating layer 134, and part of the surface of the conductive layer 106*b* is exposed (see FIGS. 16A1 and 16A2).

Then, the conductive layer 138 is formed so as to cover the insulating layer 134 (see FIGS. 16B1 and 16B2). Since the contact hole is formed in the insulating layer 134, the conductive layer 106*b* and the conductive layer 138 are electrically connected to each other. It is possible to refer to Embodiment 1 for the details of the conductive layer 138.

Next, a resist mask is formed over the conductive layer 138, and the conductive layer 138 is selectively etched using the resist mask, so that the conductive layer 140 is formed (see FIGS. 16C1 and 16C2). Here, the conductive layer 140 functions as the pixel electrode. It is possible to refer to Embodiment 1 for the details of the conductive layer 140 and the like.

Thus, a semiconductor device including the transistor 150 with a light-transmitting property and the storage capacitor 152 with a light-transmitting property can be formed (see FIGS. 16C1 and 16C2).

Note that in this embodiment, the wirings and the electrodes are formed using a multi-tone mask; however, one embodiment of the disclosed invention is not construed as being limited thereto. A multi-tone mask may be used in either one of the step of forming the conductive layers 106a and 112 and the step of forming the conductive layers 126a and 132a.

In this embodiment, a resist mask is formed using a multi-tone mask to perform etching. Accordingly, the number of photomasks to be used can be reduced, and the number of steps can be reduced. That is, the object of reducing manufacturing costs of the semiconductor device can be achieved.

This embodiment can be implemented in combination with any of the other embodiments as appropriate.

Embodiment 3

In this embodiment, another example of a semiconductor device will be described with reference to FIGS. 18A and 18B, FIGS. 19A and 19B, FIGS. 20A and 20B, and FIGS. 21A and 21B. Note that the semiconductor device according to this embodiment has a lot in common with the semiconductor device according to Embodiment 1. Therefore, in the following description, the description of the same structures, the same reference numerals, and the like are not repeated.

Figure 18A:
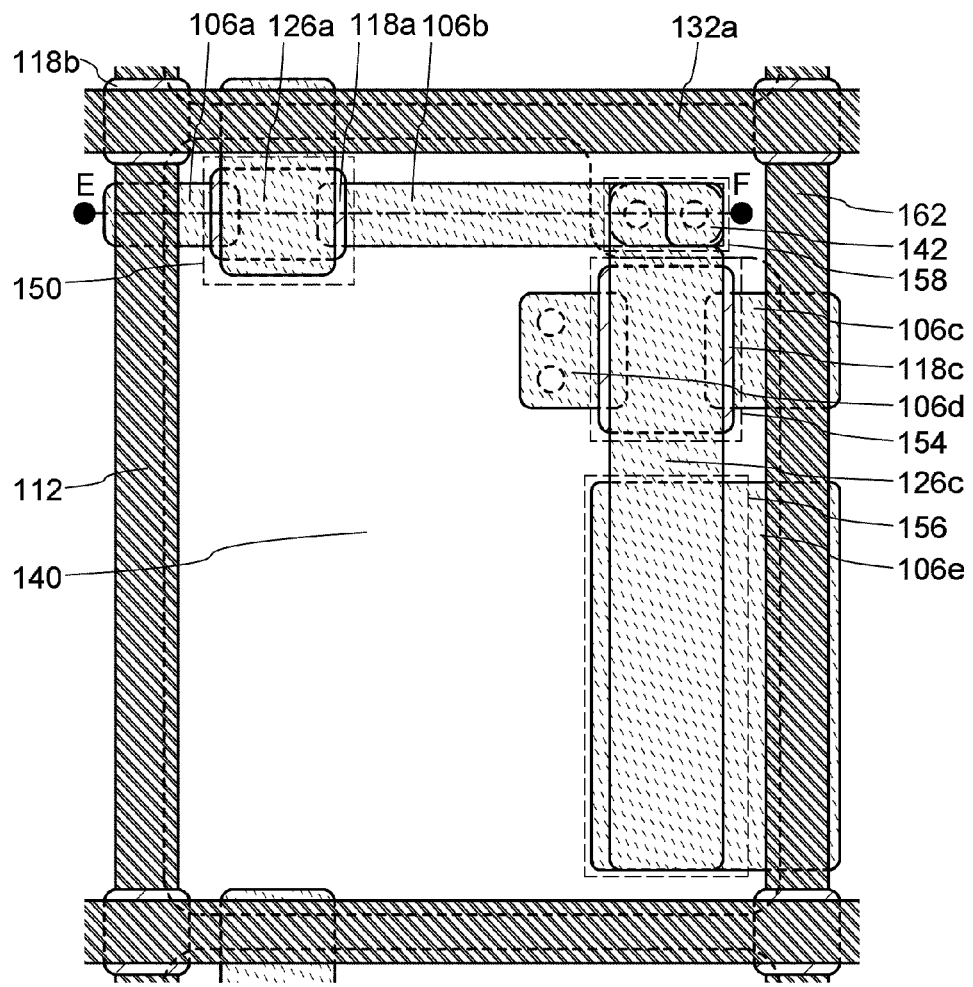
FIG. 18A is a plan view and FIG. 18B is a cross-sectional view of a semiconductor device.
Figure 18B:
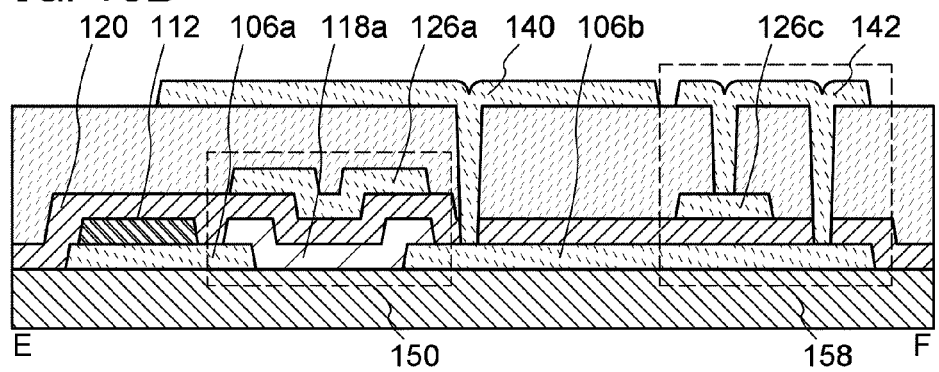

FIGS. 18A and 18B illustrate an example of a structure of a semiconductor device according to this embodiment. The structure is preferably used particularly for an electroluminescent display device (an EL display device); however, the disclosed invention is not limited thereto. FIG. 18A is a plan view, and FIG. 18B is a cross-sectional view along E-F in FIG. 18A.

The semiconductor device illustrated in FIG. 18A includes a pixel portion including the conductive layer 112 functioning as a source wiring; a conductive layer 162 which is formed in a manner similar to that of the conductive layer 112 and functions as a power supply wiring; the conductive layer 132a which intersects the conductive layer 112 and the conductive layer 162, and functions as a gate wiring; the transistor 150 near the intersection of the conductive layer 132a and the conductive layer 112; a transistor 154 electrically connected to the conductive layer 162; and a storage capacitor 156 electrically connected to the conductive layer 162 (see FIGS. 18A and 18B). Note that in FIG. 18A, the conductive layer 112 and the conductive layer 162 intersect the conductive layer 132a at 90°; however, the disclosed invention is not limited to this structure.

The transistor 150 is a so-called top-gate transistor including the conductive layer 106a functioning as a source electrode, the conductive layer 106b functioning as a drain electrode, the semiconductor layer 118a, the gate insulating layer 120, and the conductive layer 126a functioning as a gate electrode (see FIGS. 18A and 18B). Similarly, the transistor 154 includes a conductive layer 106c functioning as a source electrode, a conductive layer 106d functioning as a drain electrode, a semiconductor layer 118c, the gate insulating layer 120, and a conductive layer 126c functioning as a gate electrode. The storage capacitor 156 includes a conductive layer 106e, the gate insulating layer 120, and the conductive layer 126c. Note that in the above description, the terms "source electrode" and "drain electrode" are used only for convenience.

Here, the conductive layer 112 and the conductive layer 106a are electrically connected to each other, and in a connection portion 158, the conductive layer 106b and the conductive layer 126c are electrically connected through a conductive layer 142 (see FIGS. 18A and 18B). Moreover, the conductive layer 162 and the conductive layer 106c are electrically connected to each other; the conductive layer 106d and the conductive layer 140 are electrically connected to each other; and the conductive layer 162 and the conductive layer 106e are electrically connected to each other. Note that the conductive layer 140 functioning as a pixel electrode and the conductive layer 142 can be formed through the same step. Further, a contact hole for connecting the conductive layer 106d and the conductive layer 140, a contact hole for connecting the conductive layer 106b and the conductive layer 142, and a contact hole for connecting the conductive layer 126c and the conductive layer 142 can be formed through the same step.

The conductive layer 106a, the conductive layer 106b, the semiconductor layer 118a, and the conductive layer 126a which are included in the transistor 150; the conductive layer 106c, the conductive layer 106d, the semiconductor layer 118c, and the conductive layer 126c which are included in the transistor 154; and the conductive layer 106e included in the storage capacitor 156 are formed using a light-transmitting material. Accordingly, the aperture ratio of a pixel can be increased.

The conductive layer 112, the conductive layer 132a, and the conductive layer 162 are formed using a low resistance material. Accordingly, wiring resistance can be reduced, and power consumption can be reduced. Moreover, the conductive layer 112, the conductive layer 132a, and the conductive layer 162 are formed using a material with a light-shielding property. Thus, a portion between pixels can be shielded from light.

Note that the above is the description of the case where one pixel includes two transistors; however, the disclosed invention is not limited thereto. Three or more transistors can be provided in one pixel.

Figure 19A:
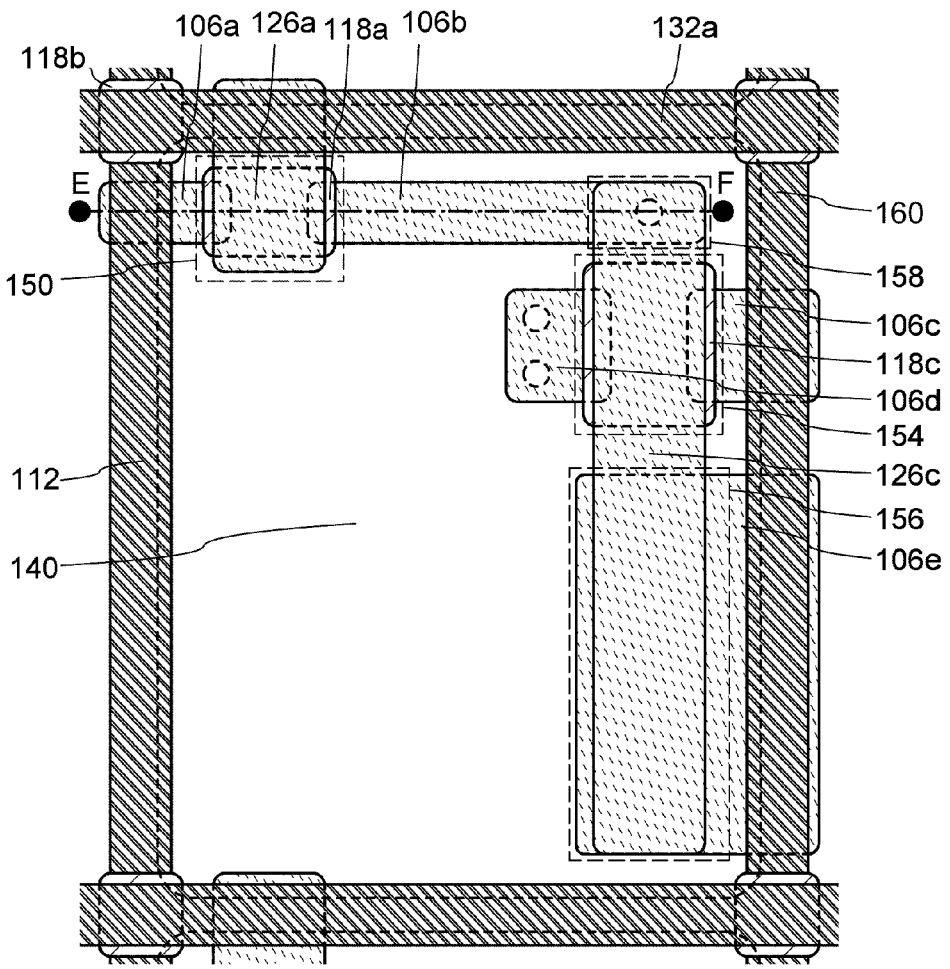
FIG. 19A is a plan view and FIG. 19B is a cross-sectional view of a semiconductor device.
Figure 19B:
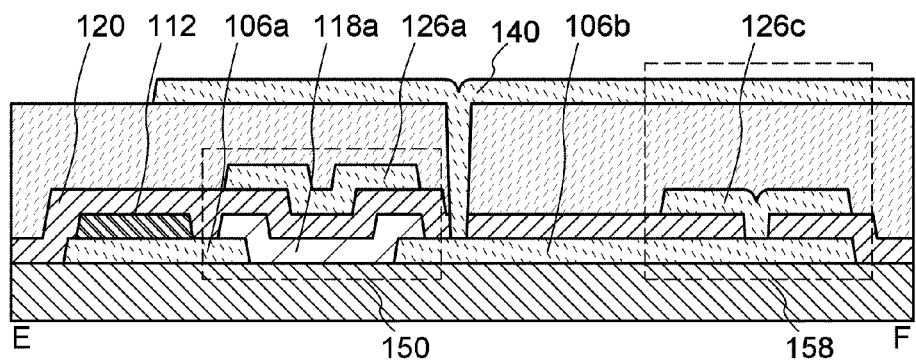

FIGS. 19A and 19B illustrate another example of a structure of the semiconductor device according to this embodiment. The structure is preferably used particularly for an electroluminescent display device (an EL display device); however, the disclosed invention is not limited thereto. FIG. 19A is a plan view, and FIG. 19B is a cross-sectional view along E-F in FIG. 19A.

Basically, the structure illustrated in FIGS. 19A and 19B is similar to the structure illustrated in FIGS. 18A and 18B. The difference between the structure in FIGS. 19A and 19B and the structure in FIGS. 18A and 18B is the connection portion 158. The conductive layer 106b and the conductive layer 126c are connected through the conductive layer 142 in FIGS. 18A and 18B, whereas the conductive layer 106b and the conductive layer 126c are directly connected to each other in FIGS. 19A and 19B. Since the conductive layer 142 is not necessary in that case, the size of the conductive layer 140 functioning as the pixel electrode can be further increased; thus, the aperture ratio can be increased as compared to that in the structure illustrated in FIGS. 18A and 18B. In order to realize electrical connection between the conductive layer 106b and the conductive layer 126c, a contact hole needs to be formed in the gate insulating layer 120 before the conductive layer 126c is formed.

Figure 20A:
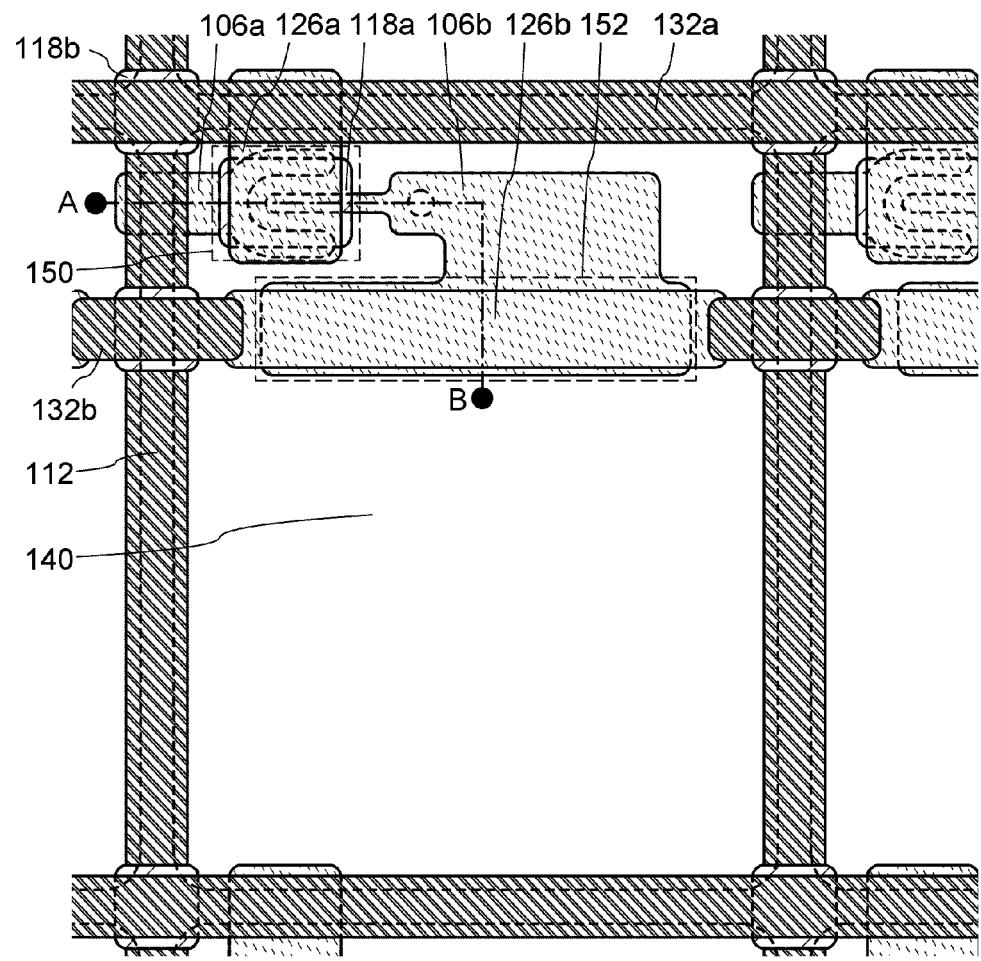
FIG. 20A is a plan view and FIG. 20B is a cross-sectional view of a semiconductor device.
Figure 20B:
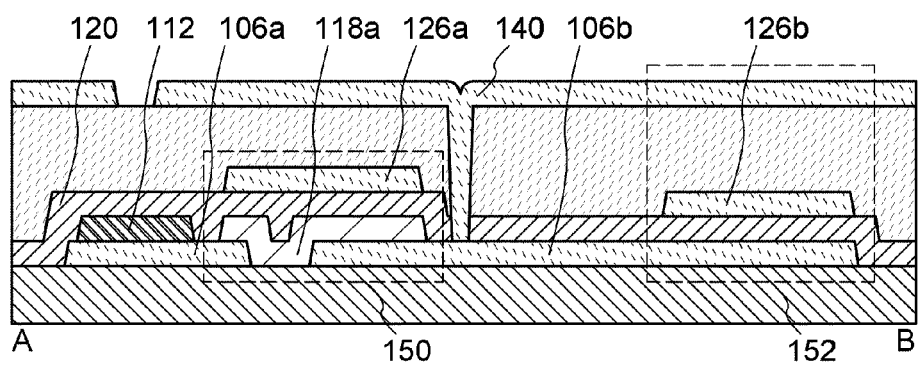

FIGS. 20A and 20B illustrate another example of a structure of the semiconductor device according to this embodiment. The structure is preferably used for a display device; however, the disclosed invention is not limited thereto. FIG. 20A is a plan view, and FIG. 20B is a cross-sectional view along A-B in FIG. 20A.

Basically, the structure illustrated in FIGS. 20A and 20B is similar to the structure illustrated in FIGS. 1A and 1B. The difference between the structure in FIGS. 20A and 20B and the structure in FIGS. 1A and 1B is the shape of the conductive layer 106a functioning as the source electrode and the conductive layer 106b functioning as the drain electrode. Specifically, in the structure illustrated in FIGS. 20A and 20B, the conductive layers 106a and 106b are formed so that a channel formation region is U-shaped. Accordingly, the channel width (W) can be increased even when a transistor with the same area is formed. Note that the shape of a channel formation region is not limited to a U-shape and can be changed as appropriate depending on desired channel width.

Figure 21A:
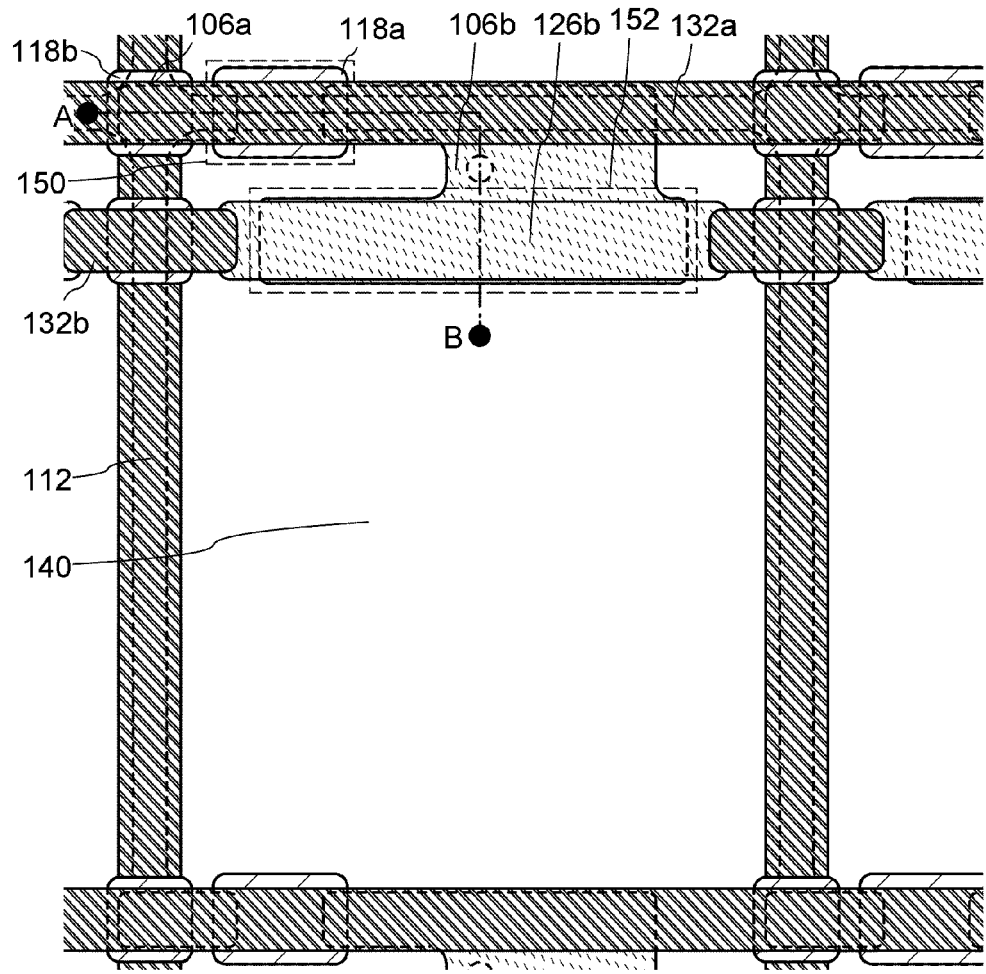
FIG. 21A is a plan view and FIG. 21B is a cross-sectional view of a semiconductor device.
Figure 21B:
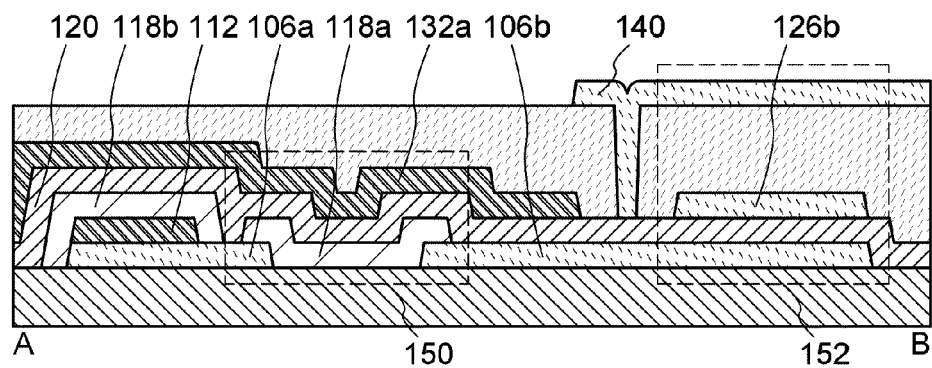

FIGS. 21A and 21B illustrate another example of a structure of the semiconductor device according to this embodiment. The structure is preferably used for a display device; however, the disclosed invention is not limited thereto. FIG. 21A is a plan view, and FIG. 21B is a cross-sectional view along A-B in FIG. 21A.

The structure illustrated in FIGS. 21A and 21B is similar to the structure illustrated in FIGS. 1A and 1B. The structure in FIGS. 21A and 21B is different from the structure in FIGS. 1A and 1B in that the conductive layer 132a functioning as the gate wiring also serves as the gate electrode (see FIGS. 21A and 21B). That is, a conductive layer corresponding to the conductive layer 126a is not provided in FIGS. 21A and 21B. Since the conductive layer 132a can be formed using a low resistance material, electric fields applied to the semiconductor layer 118a can be more uniform than that of the case where the conductive layer 126a (a conductive layer formed using a light-transmitting material) is used for the gate electrode. Accordingly, element characteristics of the transistor 150 can be improved.

Note that in FIGS. 21A and 21B, although a structure in which the conductive layer 126a is not provided is employed, the disclosed invention is not limited to this structure. The conductive layer 126a electrically connected to the conductive layer 132a may be provided. Further, the conductive layer 106a is formed in FIGS. 21A and 21B; alternatively, the conductive layer 112 may also serve as the conductive layer 106a without the formation of the conductive layer 106a. This is because the conductive layer having a function of the source electrode is formed below the conductive layer functioning as the gate wiring, so that the need for formation of the conductive layer functioning as the source electrode by using a light-transmitting material is reduced. In that case, at least the conductive layer 106b and the conductive layer 126b are formed using a light-transmitting material.

In addition, it is needless to say that the structure according to this embodiment can be employed in the case where a multi-tone mask is used. When a multi-tone mask is used, the conductive layer 126a is formed below the conductive layer 132a.

This embodiment can be implemented in combination with any of the other embodiments as appropriate.

Embodiment 4

In this embodiment, the case where a thin film transistor is formed and used in a pixel portion and a peripheral circuit portion (e.g., a driver circuit) to manufacture a semiconductor device (a display device) having a display function will be described. When part of or all the peripheral circuit portion is formed over a substrate where the pixel portion is formed, a system-on-panel can be realized.

A display device includes a display element. As the display element, a liquid crystal element (also referred to as a liquid crystal display element), a light-emitting element (also referred to as a light-emitting display element), or the like can be used. The light-emitting element includes, in its category, an element whose luminance is controlled by current or voltage, and specifically includes, in its category, an inorganic electroluminescent (EL) element, an organic EL element, and the like. Further, a display medium whose contrast is changed by an electric effect, such as electronic ink, may be used.

In addition, the display device includes a panel in which a display element is sealed, and a module in which an IC including a controller or the like is mounted on the panel. Moreover, an element substrate which forms a display device is provided with a means for supplying current to the display element in each of pixels. Specifically, the element substrate may be in a state after only a pixel electrode of the display element is formed, or in a state after a conductive layer to be a pixel electrode is formed and before the conductive layer is etched.

In this embodiment, an example of a liquid crystal display device is described below. FIGS. 22A1 and 22A2 are plan views and FIG. 22B is a cross-sectional view of a panel in which thin film transistors 4010 and 4011 and a liquid crystal element 4013 that are formed over a first substrate 4001 are sealed by a second substrate 4006 and a sealing material 4005. Here, each of FIGS. 22A1 and 22A2 is a plan view, and FIG. 22B is a cross-sectional view taken along M-N of FIGS. 22A1 and 22A2.

The sealing material 4005 is provided so as to surround a pixel portion 4002 and a scan line driver circuit 4004 which are provided over the first substrate 4001. The second substrate 4006 is provided over the pixel portion 4002 and the scan line driver circuit 4004. In other words, the pixel portion 4002 and the scan line driver circuit 4004 are sealed together with a liquid crystal layer 4008, by the first substrate 4001, the sealing material 4005, and the second substrate 4006. Further, a signal line driver circuit 4003 that is formed using a single crystal semiconductor or a polycrystalline semiconductor over a substrate separately prepared is mounted in a region different from the region surrounded by the sealing material 4005 over the first substrate 4001.

Note that there is no particular limitation on the connection method of the driver circuit which is separately formed, and a COG method, a wire bonding method, a TAB method, or the like can be used as appropriate. FIG. 22A1 illustrates an example where the signal line driver circuit 4003 is mounted by a COG method. FIG. 22A2 illustrates an example where the signal line driver circuit 4003 is mounted by a TAB method.

In addition, the pixel portion 4002 and the scan line driver circuit 4004, which are provided over the first substrate 4001, each include a plurality of thin film transistors. FIG. 22B illustrates the thin film transistor 4010 included in the pixel portion 4002 and the thin film transistor 4011 included in the scan line driver circuit 4004. An insulating layer 4020 is provided over the thin film transistors 4010 and 4011.

As the thin film transistors 4010 and 4011, the thin film transistors which are described in the foregoing Embodiments or the like can be employed. Note that in this embodiment, the thin film transistors 4010 and 4011 are n-channel transistors.

A pixel electrode layer 4030 included in the liquid crystal element 4013 is electrically connected to the thin film transistor 4010. A counter electrode layer 4031 of the liquid crystal element 4013 is formed on the second substrate 4006. The liquid crystal element 4013 is formed using the pixel electrode layer 4030, the counter electrode layer 4031, and the liquid crystal layer 4008. Note that the pixel electrode layer 4030 and the counter electrode layer 4031 are provided with an insulating layer 4032 and an insulating layer 4033, respectively, each of which functions as an alignment film. The liquid crystal layer 4008 is sandwiched between the pixel electrode layer 4030 and the counter electrode layer 4031 with the insulating layers 4032 and 4033 therebetween.

Note that for the first substrate 4001 and the second substrate 4006, glass, metal (typically, stainless steel), ceramic, plastics, or the like can be used. As plastics, an FRP (fiber-glass-reinforced plastics) substrate, a PVF (polyvinyl fluoride) film, a polyester film, an acrylic resin film, or the like can be used. Moreover, a sheet in which aluminum foil is sandwiched between PVF films or polyester films can also be used.

A columnar spacer 4035 is provided in order to control the distance (a cell gap) between the pixel electrode layer 4030 and the counter electrode layer 4031. The columnar spacer 4035 can be obtained by selective etching of an insulating film. Note that a spherical spacer may be used instead of a columnar spacer. The counter electrode layer 4031 is electrically connected to a common potential line provided over the substrate where the thin film transistor 4010 is formed. For example, the counter electrode layer 4031 can be electrically connected to the common potential line through conductive particles provided between the pair of substrates. Note that the conductive particles are preferably contained in the sealing material 4005.

Alternatively, a liquid crystal showing a blue phase for which an alignment film is unnecessary may be used. A blue phase is one of the liquid crystal phases, which is generated just before a cholesteric phase changes into an isotropic phase while temperature of cholesteric liquid crystal is increased. Since the blue phase is only generated within a narrow range of temperatures, a liquid crystal composition containing a chiral agent of 5 wt % or more is preferably used. Thus, the temperature range can be improved. The liquid crystal composition which includes a liquid crystal showing a blue phase and a chiral agent has a small response time of 10 μs to 100 μs, has optical isotropy, which makes the alignment process unneeded, and has small viewing angle dependence.

Although an example of a transmissive liquid crystal display device is described in this embodiment, this embodiment is not limited thereto, and a reflective liquid crystal display device or a transflective liquid crystal display device may be used.

As the example of the liquid crystal display device described in this embodiment, a polarizing plate is provided on the outer surface of the substrate (on the viewer side) and a coloring layer and an electrode layer used for a display element are provided on the inner surface of the substrate; however, the polarizing plate may be provided on the inner surface of the substrate. Moreover, the layered structure of the polarizing plate and the coloring layer is not limited to that described in this embodiment and may be set as appropriate depending on materials or conditions of manufacturing steps of the polarizing plate and the coloring layer. Further, a black mask (a black matrix) may be provided as a light-shielding film.

In this embodiment, the thin film transistor obtained in the foregoing Embodiments is covered with the insulating layer 4020 in order to reduce the surface roughness of the thin film transistor; however, the disclosed invention is not limited to this structure.

For the insulating layer 4020, an organic material having heat resistance, such as polyimide, acrylic, benzocyclobutene, polyamide, or epoxy, can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4020 may be formed by stacking a plurality of insulating films formed of these materials.

Here, the siloxane-based resin corresponds to a resin including a Si—O—Si bond which is formed using a siloxane-based material as a starting material. As a substituent, an organic group (e.g., an alkyl group or an aryl group) or a fluoro group may be used. The organic group may include a fluoro group.

There is no particular limitation on the method for forming the insulating layer 4020. The insulating layer 4020 can be formed, depending on the material, by sputtering, SOG, spin coating, dipping, spray coating, droplet discharging (e.g., ink-jet, screen printing, or offset printing), doctor knife, roll coater, curtain coater, knife coater, or the like.

For the pixel electrode layer 4030 and the counter electrode layer 4031, the following light-transmitting conductive material can be used, for example: indium oxide containing tungsten oxide, indium zinc oxide containing tungsten oxide, indium oxide containing titanium oxide, indium tin oxide containing titanium oxide, indium tin oxide (also referred to as ITO), indium zinc oxide, or indium tin oxide to which silicon oxide is added.

A conductive composition containing a conductive high molecule (also referred to as a conductive polymer) may be used for the pixel electrode layer 4030 and the counter electrode layer 4031. The pixel electrode formed using the conductive composition preferably has a sheet resistance of $1.0 \times 10^4$ ohm/square or less and a light transmittance of 70% or more at a wavelength of 550 nm. Furthermore, the resistivity of the conductive high molecule contained in the conductive composition is preferably $0.1$ Ω·cm or less.

As the conductive high molecule, a so-called π-electron conjugated conductive polymer can be used. Examples of the conductive high molecule are polyaniline and its derivatives, polypyrrole and its derivatives, polythiophene and its derivatives, and copolymers of two or more kinds of these materials.

A variety of signals are supplied from an FPC 4018 to the signal line driver circuit 4003, the scan line driver circuit 4004, the pixel portion 4002, or the like.

A connection terminal electrode 4015 is formed from the same conductive film as the pixel electrode layer 4030 included in the liquid crystal element 4013. A terminal electrode 4016 is formed from the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 22A1, 22A2, and 22B illustrate the example in which the signal line driver circuit 4003 is formed separately and mounted on the first substrate 4001; however, this embodiment is not limited to this structure. The scan line driver circuit may be formed separately and then mounted, or only part of the signal line driver circuit or part of the scan line driver circuit may be formed separately and then mounted.

Figure 23:
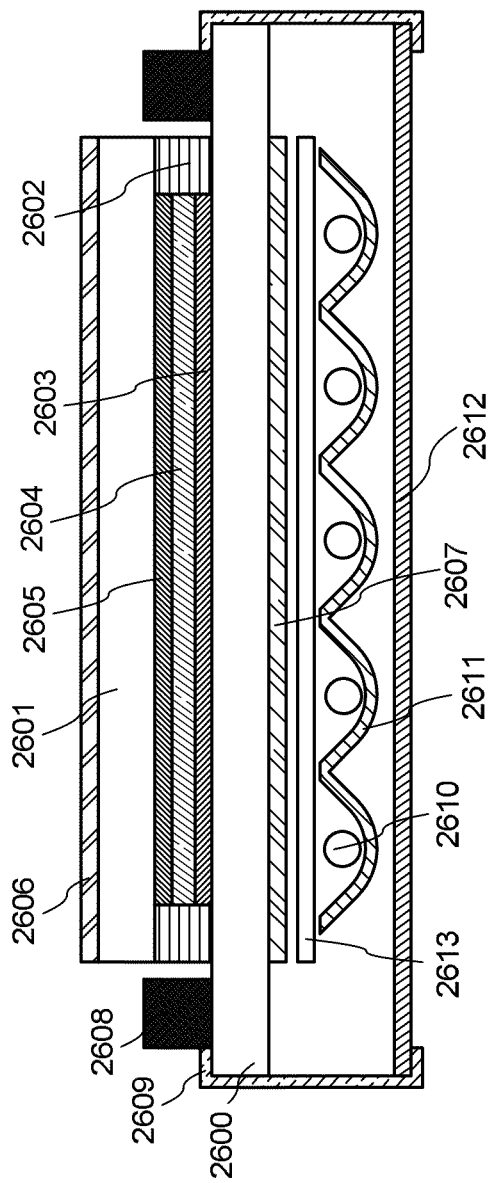
FIG. 23 illustrates a semiconductor device.

FIG. 23 illustrates an example in which a TFT substrate 2600 is used for a liquid crystal display module which is one embodiment of the semiconductor device.

In FIG. 23, the TFT substrate 2600 and a counter substrate 2601 are bonded to each other by a sealing material 2602; and an element layer 2603 including a TFT and the like, a liquid crystal layer 2604 including an alignment film and a liquid crystal, a coloring layer 2605, and the like are provided between the TFT substrate 2600 and the counter substrate 2601, whereby a display region is formed. The coloring layer 2605 is necessary for color display. In the case of the RGB system, coloring layers corresponding to colors of red, green, and blue are provided for respective pixels. A polarizing plate 2606, a polarizing plate 2607, and a diffuser plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 through a flexible wiring board 2609. Accordingly, an external circuit such as a control circuit or a power source circuit is included in a liquid crystal module. Moreover, a retardation plate may be provided between the polarizing plate and the liquid crystal layer.

For a method for driving a liquid crystal, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, or the like can be used.

Through the above steps, a high-performance liquid crystal display device can be manufactured. This embodiment can be implemented in combination with any of the other embodiments as appropriate.

Embodiment 5

In this embodiment, active matrix electronic paper which is an example of a semiconductor device will be described with reference to FIG. 24. A thin film transistor 650 used for the semiconductor device can be manufactured in a manner similar to that of the thin film transistor described in the foregoing Embodiments.

Figure 24:
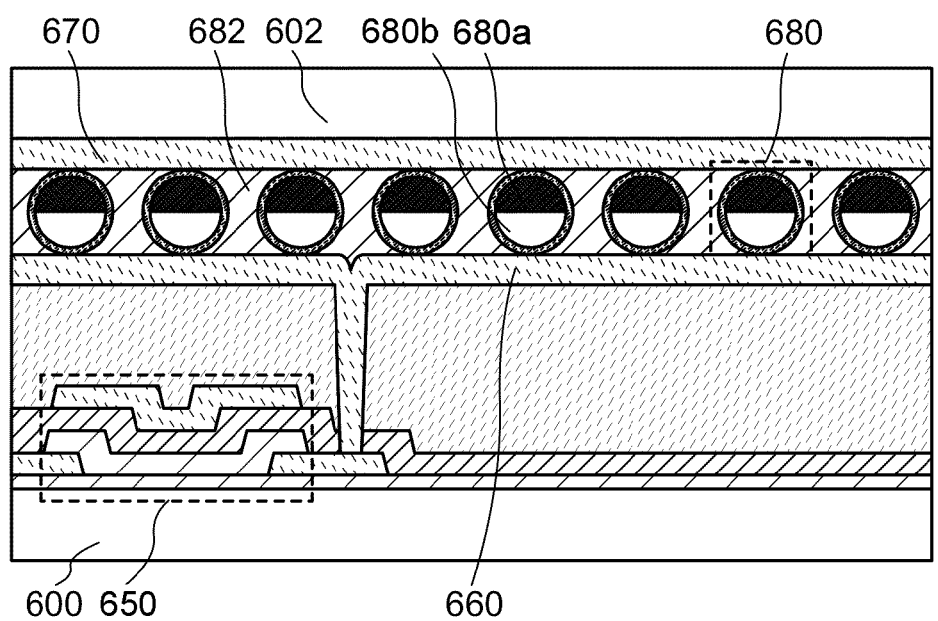
FIG. 24 is a cross-sectional view illustrating a semiconductor device.

FIG. 24 illustrates an example of electronic paper using a twisting ball display system. The twisting ball display system refers to a method in which spherical particles each colored in black and white are arranged between a first electrode layer and a second electrode layer, and a potential difference is generated between the first electrode layer and the second electrode layer, whereby orientation of the spherical particles is controlled so that display is performed.

The thin film transistor 650 provided over the substrate 600 is a thin film transistor of the disclosed invention and has a structure in which a semiconductor layer is sandwiched between a gate electrode layer which is above the semiconductor layer and the source electrode layer or the drain electrode layer which is below the semiconductor layer. Note that the source electrode layer or the drain electrode layer is electrically connected to a first electrode layer 660 through a contact hole formed in an insulating layer. A substrate 602 is provided with a second electrode layer 670. Spherical particles 680 each having a black region 680a and a white region 680b are provided between the first electrode layer 660 and the second electrode layer 670. A space around the spherical particles 680 is filled with a filler 682 such as a resin (see FIG. 24). In FIG. 24, the first electrode layer 660 corresponds to a pixel electrode, and the second electrode layer 670 corresponds to a common electrode. The second electrode layer 670 is electrically connected to a common potential line provided over the substrate where the thin film transistor 650 is formed.

Instead of the twisting ball, an electrophoretic display element can also be used. In that case, a microcapsule having a diameter of approximately 10 μm to 200 μm in which transparent liquid, positively-charged white microparticles, and negatively-charged black microparticles are encapsulated is used, for example. When an electric field is applied by the first electrode layer and the second electrode layer, the white microparticles and the black microparticles move in directions opposite to each other, so that white or black is displayed. The electrophoretic display element has higher reflectivity than a liquid crystal display element, so that an auxiliary light is unnecessary and a display portion can be recognized in a place where brightness is not sufficient. In addition, there is an advantage that even when power is not supplied to the display portion, an image which has been displayed once can be maintained.

Accordingly, high-performance electronic paper can be manufactured using the disclosed invention. Note that this embodiment can be implemented in combination with any of the other embodiments as appropriate.

Embodiment 6

In this embodiment, an example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, voltage is applied to the light-emitting element, so that electrons and holes are separately injected from a pair of electrodes into a layer containing a light-emitting organic compound, and current flows. Then, the carriers (electrons and holes) are recombined, so that light is emitted. Owing to such a mechanism, the light-emitting element is called a current-excitation light-emitting element.

Inorganic EL elements are classified in a dispersive inorganic EL element and a thin-film inorganic EL element according to their element structures. A dispersive inorganic EL element includes a light-emitting layer in which particles of a light-emitting material are dispersed in a binder, and light emission mechanism thereof is donor-acceptor recombination light emission utilizing a donor level and an acceptor level. In a thin film inorganic EL element, a light-emitting layer is sandwiched between dielectric layers, and the dielectric layers are sandwiched between electrodes. Light emission mechanism of the thin film inorganic EL element is local light emission utilizing inner-shell electron transition of a metal ion. Note that here, an organic EL element is used as a light-emitting element.

A structure of a light-emitting element is described with reference to FIGS. 25A to 25C. A cross-sectional structure of a pixel including an n-channel driving TFT is described as an example. TFTs 701, 711, and 721 used for semiconductor devices illustrated in FIGS. 25A to 25C can be manufactured in a manner similar to that of the thin film transistors described in the foregoing Embodiments.

In order to extract light from a light-emitting element, at least one of an anode and a cathode is transparent. Here, the term "transparent" means that at least transmittance at the wavelength of emitted light is sufficiently high. As a method for extracting light, there are a top emission method (a top extraction method) by which light is extracted from a side opposite to a substrate where a thin film transistor and a light-emitting element are formed, a bottom emission method (a bottom extraction method) by which light is extracted from the substrate side, a dual emission method (a dual extraction method) by which light is extracted from both the substrate side and the side opposite to the substrate, and the like.

A light-emitting element with a top emission method is described with reference to FIG. 25A.

Figure 25A:
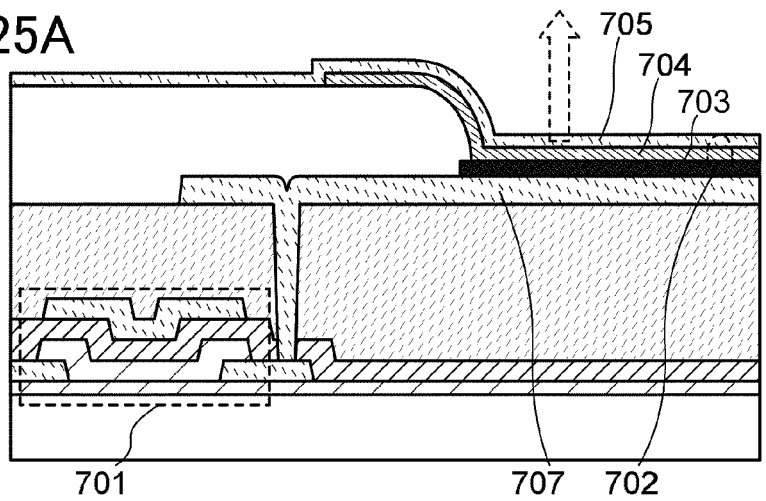
FIGS. 25A to 25C are cross-sectional views each illustrating a semiconductor device.

FIG. 25A is a cross-sectional view of a pixel in the case where light is emitted from a light-emitting element 702 to an anode 705 side. Here, the light-emitting element 702 is formed over a light-transmitting conductive layer 707 which is electrically connected to the driving TFT 701, and a light-emitting layer 704 and the anode 705 are stacked in this order over a cathode 703. As the cathode 703, a conductive film which has a low work function and reflects light can be used. For example, the cathode 703 is preferably formed using a material such as Ca, Al, MgAg, or AlLi. The light-emitting layer 704 may be formed using a single layer or a plurality of layers stacked. When the light-emitting layer 704 is formed using a plurality of layers, an electron-injecting layer, an electron-transporting layer, a light-emitting layer, a hole-transporting layer, and a hole-injecting layer are preferably stacked in this order over the cathode 703; however, it is needless to say that it is not necessary to form all of these layers. The anode 705 is formed using a light-transmitting conductive material. For example, the following light-transmitting conductive material may be used: indium oxide containing tungsten oxide, indium zinc oxide containing tungsten oxide, indium oxide containing titanium oxide, indium tin oxide containing titanium oxide, indium tin oxide (also referred to as ITO), indium zinc oxide, or indium tin oxide to which silicon oxide is added.

A structure in which the light-emitting layer 704 is sandwiched between the cathode 703 and the anode 705 can be called the light-emitting element 702. In the case of the pixel illustrated in FIG. 25A, light is emitted from the light-emitting element 702 to the anode 705 side as indicated by an arrow. The structure of the light-emitting element 702 may be a microcavity structure. Accordingly, it is possible to select a wavelength to be extracted, so that the color purity can be improved. Note that in that case, the thickness of layers included in the light-emitting element 702 is set depending on the wavelength to be extracted. Moreover, an electrode is preferably formed using a material with a predetermined reflectivity.

An insulating layer containing silicon nitride, silicon oxide, or the like may be formed over the anode 705. Accordingly, deterioration of the light-emitting element can be suppressed.

Next, a light-emitting element with a bottom emission method is described with reference to FIG. 25B.

Figure 25B:
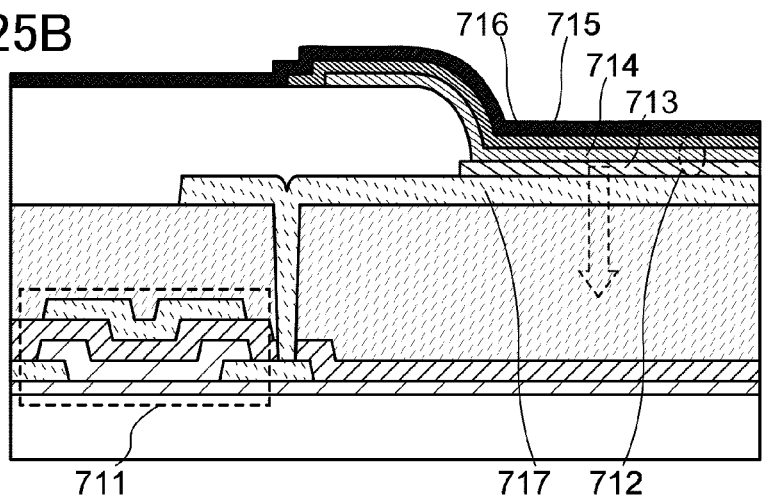

FIG. 25B is a cross-sectional view of a pixel in the case where light is emitted from a light-emitting element 712 to a cathode 713 side. Here, the cathode 713 of the light-emitting element 712 is formed over a light-transmitting conductive film 717 which is electrically connected to the driving TFT 711, and a light-emitting layer 714 and an anode 715 are stacked in this order over the cathode 713. Note that when the anode 715 has a light-transmitting property, a light-shielding film 716 may be provided so as to cover the anode 715. For the cathode 713, a conductive material having a low work function can be used as in FIG. 25A. Note that the cathode 713 has a thickness that can transmit light (preferably approximately 5 nm to 30 nm). For example, an aluminum film with a thickness of approximately 20 nm can be used as the cathode 713. As in FIG. 25A, the light-emitting layer 714 may be formed using a single layer or a plurality of layers stacked. The anode 715 does not necessarily transmit light, but may be formed using a light-transmitting conductive material as in FIG. 25A. The light-shielding film 716 can be formed using a metal which reflects light or the like; however, this embodiment is not limited thereto. Note that when the light-shielding film 716 has a function of reflecting light, light extraction efficiency can be improved.

A structure in which the light-emitting layer 714 is sandwiched between the cathode 713 and the anode 715 can be called the light-emitting element 712. In the case of the pixel illustrated in FIG. 25B, light is emitted from the light-emitting element 712 to the cathode 713 side as indicated by an arrow. The structure of the light-emitting element 712 may be a microcavity structure. Moreover, an insulating layer may be formed over the anode 715.

Next, a light-emitting element with a dual emission method is described with reference to FIG. 25C.

Figure 25C:
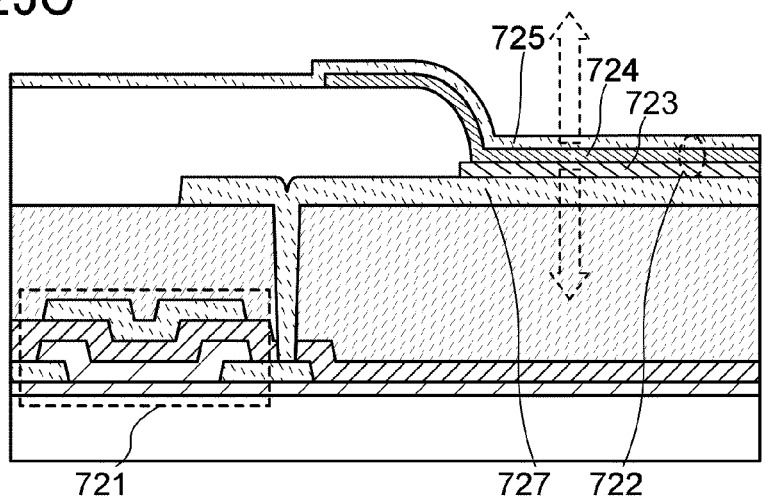

In FIG. 25C, a cathode 723 of a light-emitting element 722 is formed over a light-transmitting conductive film 727 which is electrically connected to the driving TFT 721, and a light-emitting layer 724 and an anode 725 are stacked in this order over the cathode 723. For the cathode 723, a conductive material having a low work function can be used as in FIG. 25A. Note that the cathode 723 has a thickness that can transmit light. For example, a 20-nm-thick aluminum film can be used as the cathode 723. As in FIG. 25A, the light-emitting layer 724 may be formed using a single layer or a plurality of layers stacked. As in FIG. 25A, the anode 725 can be formed using a light-transmitting conductive material.

A structure where the cathode 723, the light-emitting layer 724, and the anode 725 overlap with each another can be called the light-emitting element 722. In the case of the pixel illustrated in FIG. 25C, light is emitted from the light-emitting element 722 to both the anode 725 side and the cathode 723 side as indicated by arrows. The structure of the light-emitting element 722 may be a microcavity structure. Moreover, an insulating layer may be formed over the anode 725.

The organic EL element is described here as the light-emitting element; alternatively, it is possible to provide an inorganic EL element as the light-emitting element. In addition, the example is shown here in which the thin film transistor (the driving TFT) for controlling driving of the light-emitting element is electrically connected to the light-emitting element; alternatively, a structure may be employed in which a TFT for current control is connected between the driving TFT and the light-emitting element.

Note that the semiconductor device described in this embodiment is not limited to have the structures illustrated in FIGS. 25A to 25C, and can be modified in various ways.

Figure 26A:
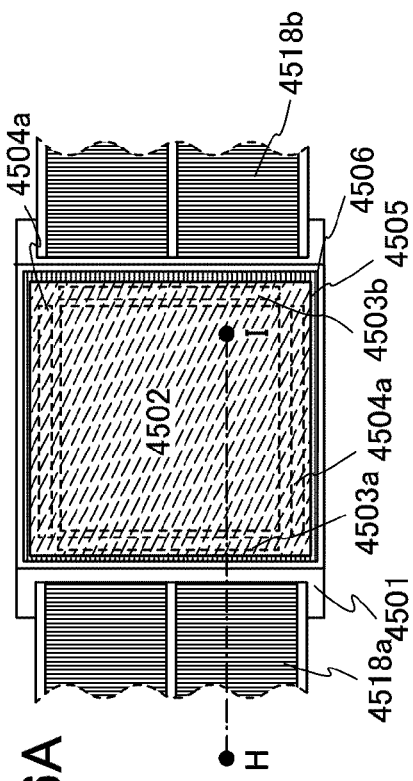
FIG. 26A is a plan view and FIG. 26B is a cross-sectional view of a semiconductor device.
Figure 26B:
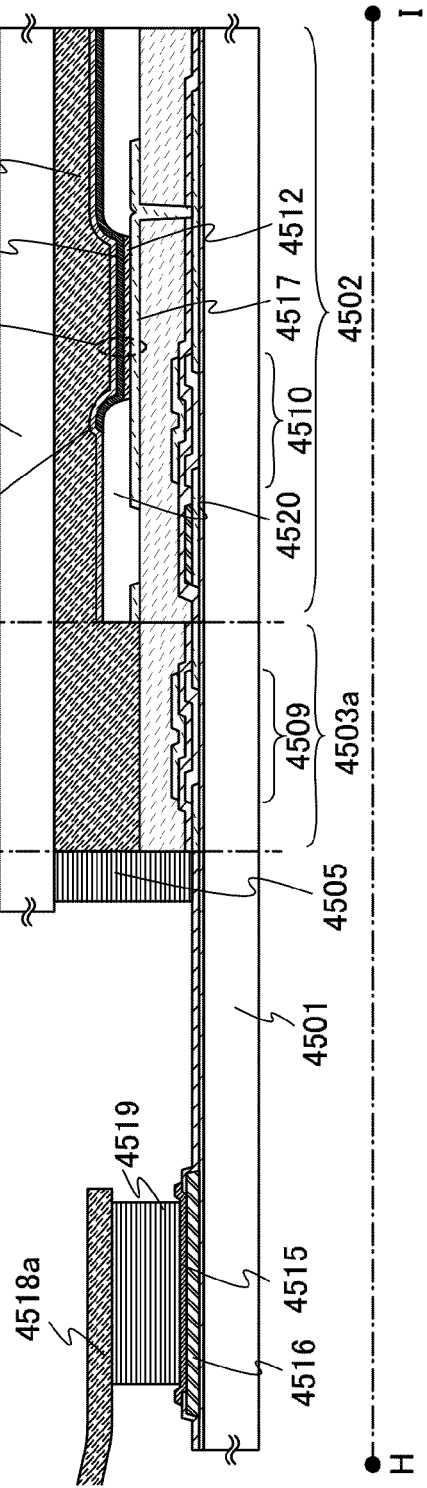

Next, the appearance and a cross section of a light-emitting display panel (also referred to as a light-emitting panel), which corresponds to one embodiment of the semiconductor device, are described with reference to FIGS. 26A and 26B. FIG. 26A is a plan view and FIG. 26B is a cross-sectional view of a panel in which thin film transistors 4509 and 4510 and a light-emitting element 4511 that are formed over a first substrate 4501 are sealed by a second substrate 4506 and a sealing material 4505. Here, FIG. 26A is a plan view, and FIG. 26B is a cross-sectional view taken along H-I of FIG. 26A.

The sealing material 4505 is provided so as to surround a pixel portion 4502, signal line driver circuits 4503a and 4503b, and scan line driver circuits 4504a and 4504b, which are provided over the first substrate 4501. Moreover, a second substrate 4506 is provided over the pixel portion 4502, the signal line driver circuits 4503a and 4503b, and the scan line driver circuits 4504a and 4504b. In other words, the pixel portion 4502, the signal line driver circuits 4503a and 4503b, and the scan line driver circuits 4504a and 4504b are sealed together with a filler 4507, by the first substrate 4501, the sealing material 4505, and the second substrate 4506. In such a manner, packaging (sealing) is preferably performed using a protective film (e.g., a bonding film or an ultraviolet curable resin film), a cover material, or the like with high air-tightness and little degasification.

The pixel portion 4502, the signal line driver circuits 4503a and 4503b, and the scan line driver circuits 4504a and 4504b, which are formed over the first substrate 4501, each include a plurality of thin film transistors. FIG. 26B illustrates the thin film transistor 4510 included in the pixel portion 4502 and the thin film transistor 4509 included in the signal line driver circuit 4503a.

As the thin film transistors 4509 and 4510, the thin film transistors described in the foregoing Embodiments can be employed. Note that in this embodiment, the thin film transistors 4509 and 4510 are n-channel transistors.

Reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is not limited to the layered structure shown in this embodiment, which includes the first electrode layer 4517, a second electrode 4512, an electroluminescent layer 4513, and a third electrode layer 4514. The structure of the light-emitting element 4511 can be changed as appropriate depending on the direction in which light is extracted from the light-emitting element 4511, or the like.

A partition 4520 is formed using an organic resin film, an inorganic insulating film, organic polysiloxane, or the like. It is particularly preferable that the partition 4520 be formed using a photosensitive material to have an opening over the first electrode layer 4517 so that a sidewall of the opening is formed as an inclined surface with continuous curvature.

The electroluminescent layer 4513 may be formed using a single layer or a plurality of layers stacked.

In order to prevent oxygen, hydrogen, moisture, carbon dioxide, or the like from entering the light-emitting element 4511, a protective film may be formed over the third electrode layer 4514 and the partition 4520. As the protective film, a silicon nitride film, a silicon nitride oxide film, a DLC film, or the like can be formed.

A variety of signals are supplied from FPCs 4518a and 4518b to the signal line driver circuits 4503a and 4503b, the scan line driver circuits 4504a and 4504b, the pixel portion 4502, or the like.

In this embodiment, an example is described in which a connection terminal electrode 4515 is formed from the same conductive film as the first electrode layer 4517 of the light-emitting element 4511, and a terminal electrode 4516 is formed from the same conductive film as the source and drain electrode layers of the thin film transistors 4509 and 4510.

The connection terminal electrode 4515 is electrically connected to a terminal of the FPC 4518a through an anisotropic conductive film 4519.

The substrate located in the direction in which light is extracted from the light-emitting element 4511 should have a light-transmitting property. Examples of a substrate having a light-transmitting property are a glass plate, a plastic plate, a polyester film, and an acrylic film.

As the filler 4507, an ultraviolet curable resin, a thermosetting resin, or the like can be used, in addition to an inert gas such as nitrogen or argon. For example, polyvinyl chloride (PVC), acrylic, polyimide, an epoxy resin, a silicone resin, polyvinyl butyral (PVB), ethylene vinyl acetate (EVA), or the like can be used. This embodiment shows an example where nitrogen is used for the filler.

If needed, a polarizing plate, a circularly polarizing plate (including an elliptically polarizing plate), a retardation plate (a quarter-wave plate or a half-wave plate), or an optical film such as a color filter may be provided on a light-emitting surface of the light-emitting element. Further, an antireflection treatment may be performed on a surface. For example, anti-glare treatment may be performed by which reflected light can be diffused by projections and depressions on the surface so that the glare can be reduced.

The signal line driver circuits 4503a and 4503b and the scan line driver circuits 4504a and 4504b may be formed using a single crystal semiconductor or a polycrystalline semiconductor over a substrate separately prepared. Alternatively, only the signal line driver circuits or part thereof or only the scan line driver circuits or part thereof may be separately formed and mounted. This embodiment is not limited to the structure illustrated in FIGS. 26A and 26B.

Through the above steps, a high-performance light-emitting display device (display panel) can be manufactured.

Figure 39A:
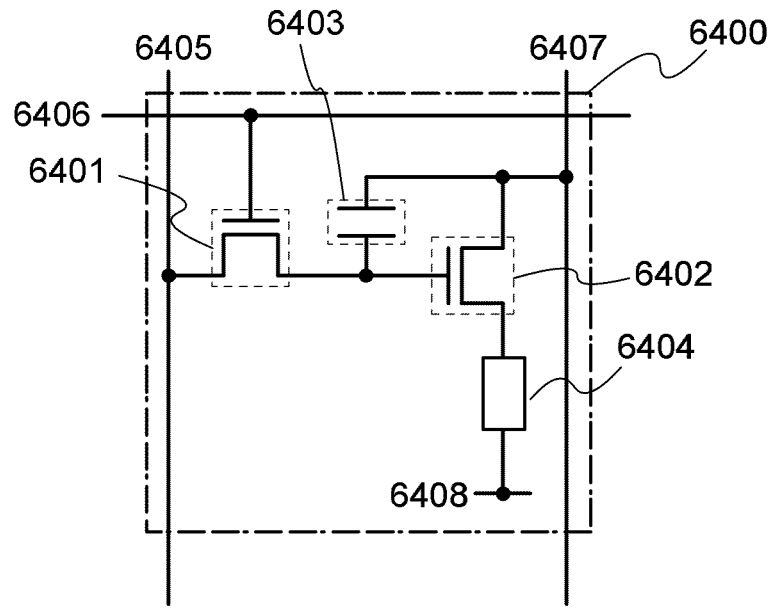
FIGS. 39A and 39B each illustrate a semiconductor device.
Figure 39B:
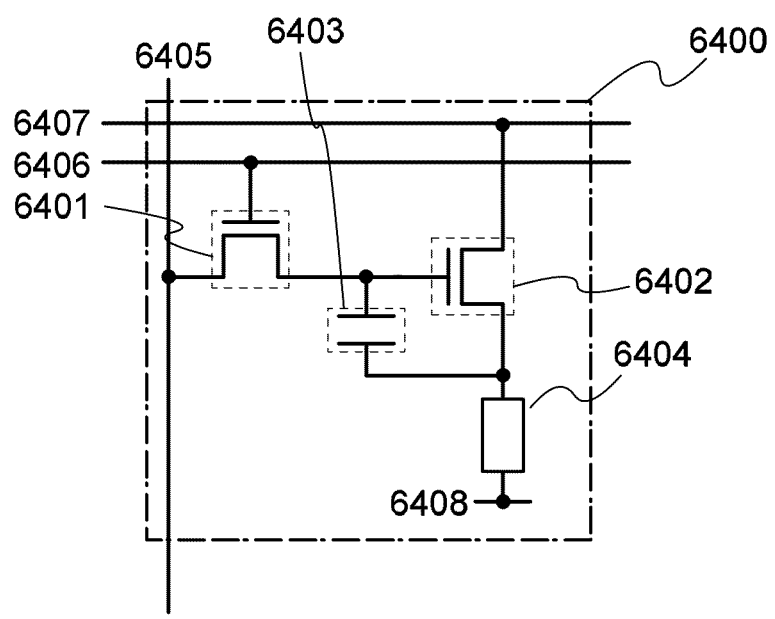

Next, a structure and an operation of a pixel to which digital time ratio grayscale driving can be applied are described. FIGS. 39A and 39B each illustrate an example of a pixel structure to which digital time ratio grayscale driving can be applied. Here, an example is described in which one pixel includes two n-channel transistors in which an oxide semiconductor layer (an In—Ga—Zn—O-based non-single-crystal film) is used in a channel formation region.

In FIG. 39A, a pixel 6400 includes a switching transistor 6401, a driving transistor 6402, a light-emitting element 6404, and a capacitor 6403. A gate of the switching transistor 6401 is connected to a scan line 6406. A first electrode (one of a source electrode and a drain electrode) of the switching transistor 6401 is connected to a signal line 6405. A second electrode (the other of the source electrode and the drain electrode) of the switching transistor 6401 is connected to a gate of the driving transistor 6402. The gate of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408.

Note that as for the relation of potentials of the second electrode (on the common electrode 6408 side) and the first electrode (on the power supply line 6407 side) of the light-emitting element 6404, one of the potentials can be set higher than the other. In the light-emitting display device, the potential difference between a high potential and a low potential is applied to the light-emitting element 6404 and current generated by the potential difference makes the light-emitting element 6404 emit light; therefore, the potentials are set so that the potential difference between the high potential and the low potential is equal to or higher than the threshold voltage of the light-emitting element 6404.

Note that gate capacitance of the driving transistor 6402 may be used as a substitute for the capacitor 6403, so that the capacitor 6403 can be omitted. The gate capacitance of the driver transistor 6402 may be formed between the channel region and the gate electrode.

In the case of using a voltage-input voltage-driving method, a video signal which turns the driving transistor 6402 on or off is input to the gate of the driving transistor 6402. That is, the driving transistor 6402 operates in a linear region.

In addition, by making input signals vary, analog grayscale driving can be realized using the pixel structure illustrated in FIG. 39A. For example, when an analog video signal is used, it is possible to supply current corresponding to the video signal to the light-emitting element 6404 and perform analog grayscale driving. The video signal is preferably a signal with which the driving transistor 6402 operates in a saturation region.

Further, the potential of the power supply line 6407 may be changed in a pulse manner. In this case, it is preferable to employ a structure illustrated in FIG. 39B.

Furthermore, in the structure in FIG. 39A, the potential of the second electrode of the light-emitting element 6404 in a given pixel is often the same as the potential of the second electrode in another pixel (the potential of the common electrode 6408); alternatively, cathodes may be patterned for each pixel and connected to their respective driving transistors.

Note that one embodiment of the disclosed invention is not construed as being limited to the pixel structures illustrated in FIGS. 39A and 39B. For example, a switch, a resistor, a capacitor, a transistor, a logic circuit, or the like may be added to the pixel illustrated in FIGS. 39A and 39B.

Note that this embodiment can be implemented in combination with any of the other embodiments as appropriate.

Embodiment 7

In this embodiment, an example in which at least part of a driver circuit and a thin film transistor provided in a pixel portion are formed over one substrate in a display device will be described below.

Figure 27A:
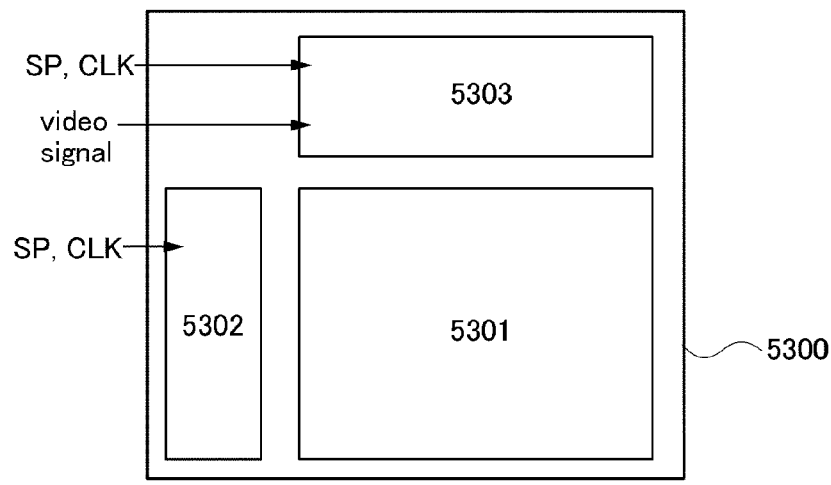
FIGS. 27A and 27B each illustrate a semiconductor device.

FIG. 27A illustrates an example of a block diagram of an active matrix display device, which is one example of the display device. The display device illustrated in FIG. 27A includes, over a substrate 5300, a pixel portion 5301 including a plurality of pixels each provided with a display element, a scan line driver circuit 5302 for selecting a pixel, and a signal line driver circuit 5303 for controlling input of a video signal to a selected pixel.

Figure 27B:
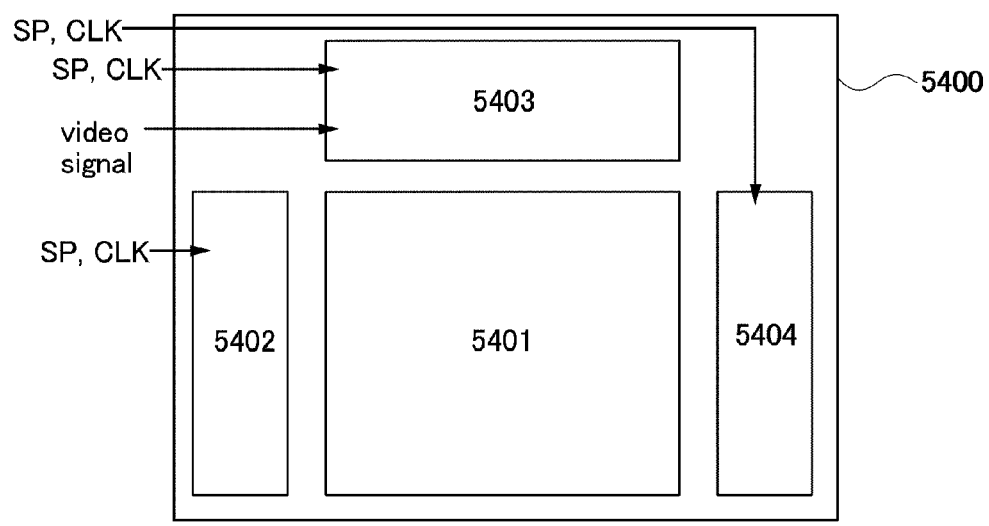

FIG. 27B illustrates another example of a block diagram of an active matrix display device, which is one example of the display device. The display device illustrated in FIG. 27B includes, over a substrate 5400, a pixel portion 5401 including a plurality of pixels each provided with a display element, a first scan line driver circuit 5402 and a second scan line driver circuit 5404 for selecting a pixel, and a signal line driver circuit 5403 for controlling input of a video signal to a selected pixel.

When a video signal input to a pixel of the display device in FIG. 27B is a digital signal, the luminance of a pixel is controlled by switching on/off of a transistor. In that case, display can be performed by an area ratio grayscale method or a time ratio grayscale method, for example. The area ratio grayscale method refers to a driving method by which one pixel is divided into a plurality of subpixels and the subpixels are driven independently so that gray levels are expressed. The time ratio grayscale method refers to a driving method by which a period during which a transistor is on (or off) is controlled by dividing one frame period into a plurality of sub-frames, for example, so that gray levels are expressed.

Since the response time of light-emitting elements is shorter than that of liquid crystal elements or the like, the light-emitting elements are suitable for the time ratio grayscale method.

As an example, in the display device illustrated in FIG. 27B, two switching TFTs are provided in one pixel; a signal input to a first scan line which is a gate wiring of one of the switching TFTs is generated in the first scan line driver circuit 5402; and a signal input to a second scan line which is a gate wiring of the other switching TFT is generated in the second scan line driver circuit 5404. Note that one embodiment of the disclosed invention is not limited to this structure, and a signal input to the first scan line and a signal input to the second scan line may be generated by one scan line driver circuit. Further, the number of scan lines used for controlling operation of switching elements is sometimes increased depending on the number of switching TFTs included in one pixel; in that case also, signals input to a plurality of scan lines may be generated by one scan line driver circuit or by a plurality of scan line driver circuits.

The thin film transistors arranged in the pixel portion of the display device can be formed according to the foregoing Embodiments. Moreover, some or all of the thin film transistors used in the driver circuit can be formed over the substrate where the thin film transistors in the pixel portion are formed.

Note that a transistor with a light-transmitting property is not necessarily formed in a peripheral driver circuit portion such as a protective circuit, a gate driver, and a source driver. Accordingly, a structure may be employed in which light is transmitted through the pixel portion and light is not transmitted through the peripheral driver circuit portion.

Figure 28A:
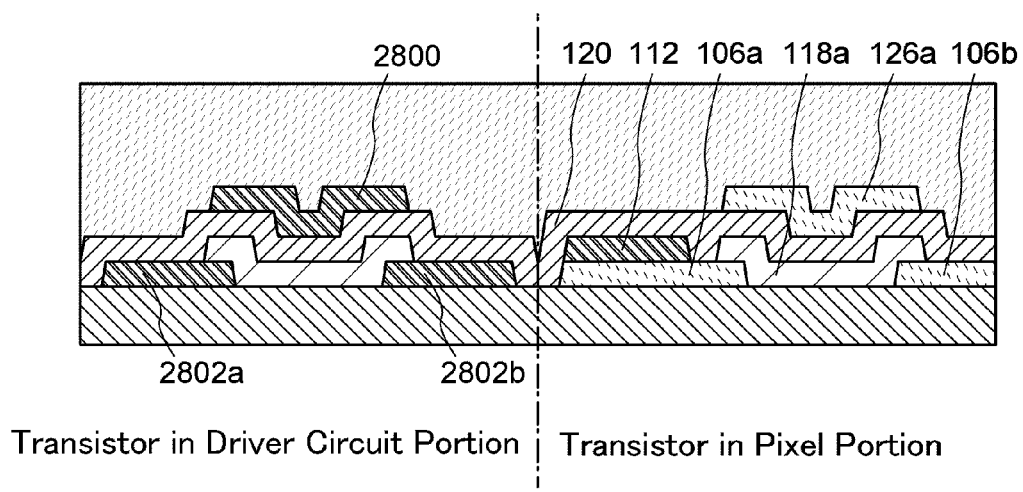
FIGS. 28A and 28B are cross-sectional views each illustrating a semiconductor device.
Figure 28B:
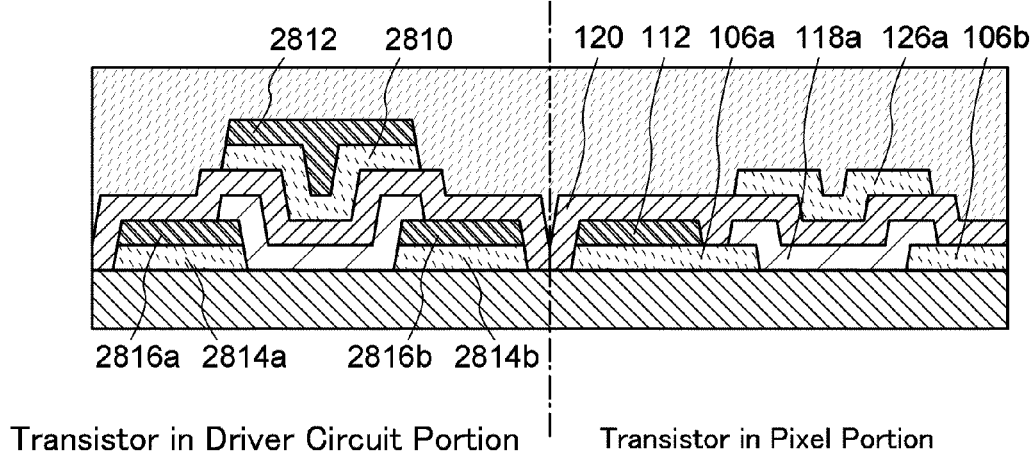

FIGS. 28A and 28B each illustrate the thin film transistors. FIG. 28A illustrates the case where the thin film transistors are formed without using a multi-tone mask. FIG. 28B illustrates the case where the thin film transistors are formed using a multi-tone mask. In the drawing, the left portion indicates the transistor in the driver circuit portion, and the right portion indicates the transistor in the pixel portion.

In the case where the thin film transistor in the driver circuit portion is formed without using a multi-tone mask, a conductive layer 2800 functioning as a gate electrode is formed when the conductive layer 132a functioning as a gate wiring is formed, and conductive layers 2802a and 2802b functioning as a source electrode and a drain electrode are formed when the conductive layer 112 functioning as a source wiring is formed (see FIG. 28A, FIGS. 1A and 1B, and the like). In that case, it is not necessary to provide layers corresponding to the conductive layer 126a functioning as a gate electrode, the conductive layer 106a functioning as a source electrode, and the conductive layer 106b functioning as a drain electrode of the transistor in the pixel portion; however, one embodiment of the disclosed invention is not limited to this structure. Note that the source wiring and the source electrode (the drain wiring and the drain electrode) may be formed as a single part. In this specification, the distinction between a wiring and an electrode is made only for convenience; therefore, if possible in terms of the structure, the wiring and the electrode may be formed as a single part or may be separately formed.

When the thin film transistor is formed using a multi-tone mask, a wiring or an electrode has a layered structure of a conductive layer formed using a light-transmitting material and a conductive layer formed using a low resistance material. For example, the gate electrode has a layered structure of a conductive layer 2810 formed using a light-transmitting material and a conductive layer 2812 formed using a low resistance material (see FIG. 28B). Moreover, the source electrode or the drain electrode has a layered structure of a conductive layer 2814*a* (or a conductive layer 2814*b*) formed using a light-transmitting material and a conductive layer 2816*a* (or a conductive layer 2816*b*) formed using a low resistance material (see FIG. 28B). Note that since a low resistance material often has a light-shielding property, a thin film transistor to be formed does not transmit light, but does not need to have a complete light-shielding property (e.g., the light transmittance may be 10% or less).

The thin film transistor with a structure where light is not transmitted through the peripheral circuit portion is formed in such a manner, whereby resistance due to an electrode or the like can be reduced and characteristics of the thin film transistor can be improved. Accordingly, a semiconductor device in which the aperture ratio of a pixel portion is improved and performance of a peripheral circuit is improved can be provided. In other words, the object of improving the characteristics of the semiconductor device can be achieved.

This embodiment can be implemented in combination with any of the other embodiments as appropriate.

Embodiment 8

The semiconductor device can be applied as electronic paper. Electronic paper can be used for electronic devices of a variety of fields for displaying data. For example, electronic paper can be used for electronic book readers (e-book readers), posters, advertisement in vehicles such as trains, display portions in a variety of cards such as credit cards, and the like. Examples of the electronic devices are illustrated in FIGS. 29A and 29B and FIG. 30.

Figure 29A:
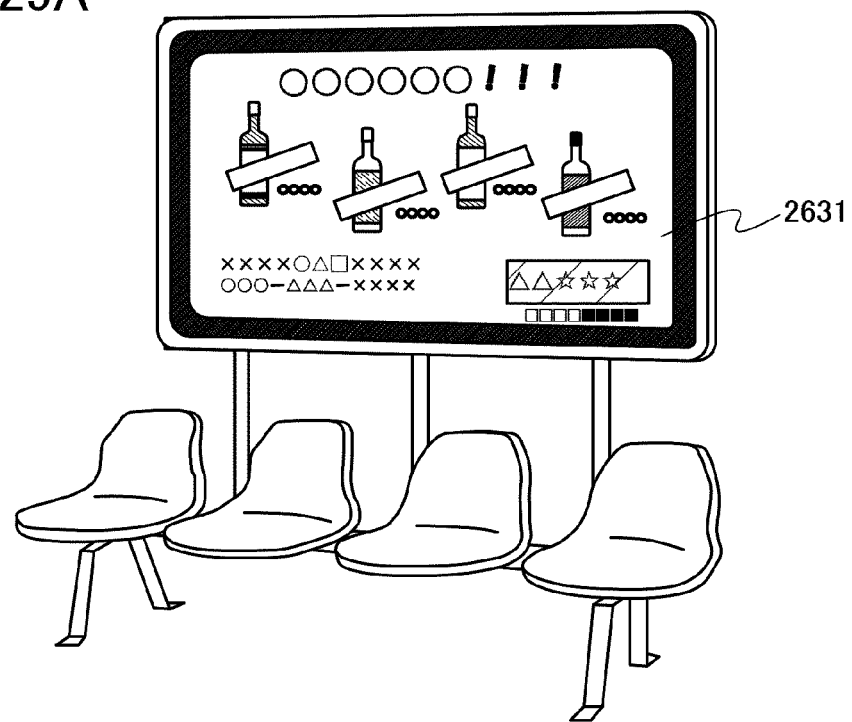
FIGS. 29A and 29B each illustrate an example of application of electronic paper.

FIG. 29A illustrates a poster 2631 formed using electronic paper. When an advertising medium is printed paper, the advertisement is replaced by hands; when electronic paper is used, the advertising display can be changed in a short time. Moreover, stable images can be obtained without display deterioration. Note that the poster may have a structure capable of wirelessly transmitting and receiving data.

Figure 29B:
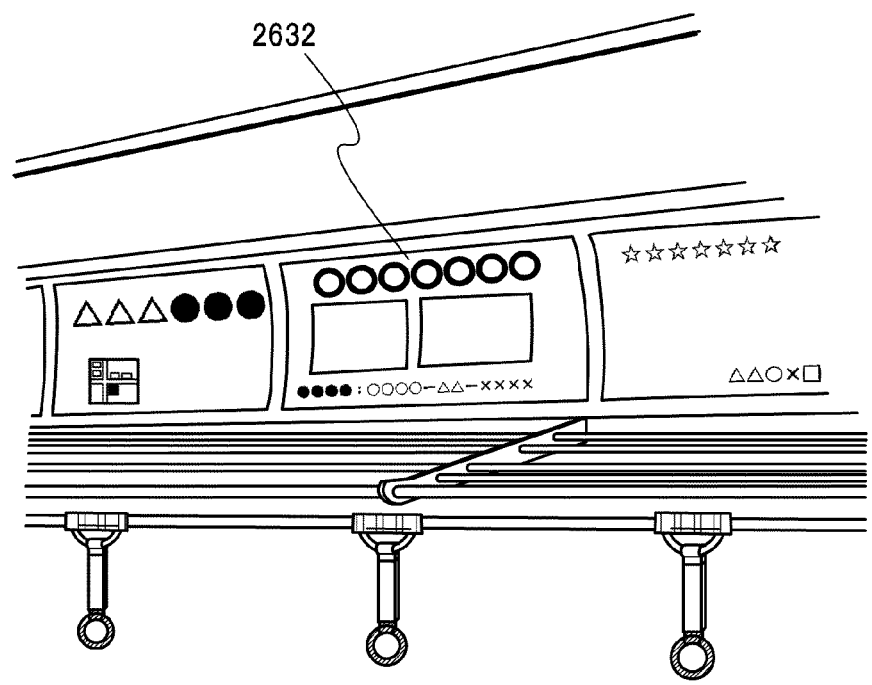

FIG. 29B illustrates an advertisement 2632 in a vehicle such as a train. When an advertising medium is printed paper, the advertisement is replaced by hands; when electronic paper is used, the advertising display can be changed in a short time without much manpower. Further, stable images can be obtained without display deterioration. Note that the poster may have a structure capable of wirelessly transmitting and receiving data.

Figure 30:
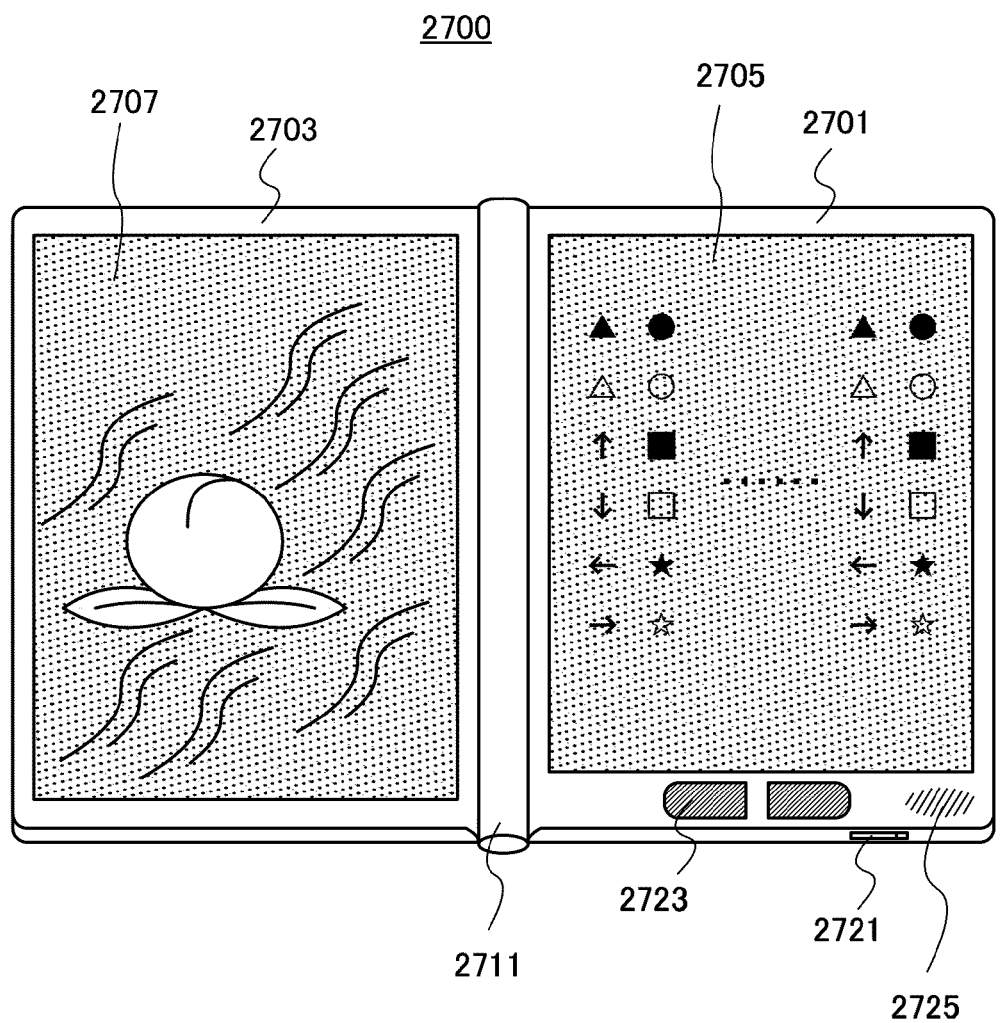
FIG. 30 is an external view illustrating an example of an electronic book reader.

FIG. 30 illustrates an example of an e-book reader 2700. For example, the e-book reader 2700 includes two housings: a housing 2701 and a housing 2703. The housing 2701 and the housing 2703 are connected with a hinge 2711 so that the e-book reader 2700 can be opened and closed with the hinge 2711 as an axis. With such a structure, the e-book reader 2700 can operate like a paper book.

A display portion 2705 is incorporated in the housing 2701, and a display portion 2707 is incorporated in the housing 2703. The display portions 2705 and 2707 may display one image or different images. When the display portions 2705 and 2707 display different images, for example, a display portion on the right side (the display portion 2705 in FIG. 30) can display text and a display portion on the left side (the display portion 2707 in FIG. 30) can display graphics.

FIG. 30 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, or the like may be provided on the same surface as the display portion of the housing. Further, an external connection terminal (e.g., an earphone terminal, a USB terminal, or a terminal that can be connected to various cables such as an AC adapter and a USB cable), a recording medium insertion portion, or the like may be provided on the back surface or the side surface of the housing. Moreover, the e-book reader 2700 may have a function of an electronic dictionary.

The e-book reader 2700 may have a structure capable of wirelessly transmitting and receiving data. Through wireless communication, desired book data or the like can be purchased and downloaded from an electronic book server.

This embodiment can be implemented in combination with any of the other embodiments as appropriate.

Embodiment 9

In this embodiment, a structure and operation of a pixel which can be applied to a liquid crystal display device will be described. As an operation mode of a liquid crystal element in this embodiment, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, or the like can be used.

Figure 40A:
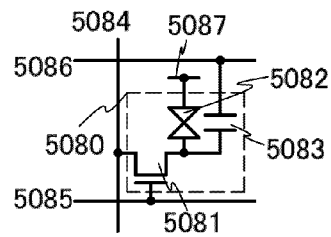
FIGS. 40A to 40G each illustrate a semiconductor device.

FIG. 40A shows an example of a pixel structure which can be applied to a liquid crystal display device. A pixel 5080 includes a transistor 5081, a liquid crystal element 5082, and a capacitor 5083. A gate of the transistor 5081 is electrically connected to a wiring 5085. A first terminal of the transistor 5081 is electrically connected to a wiring 5084. A second terminal of the transistor 5081 is electrically connected to a first terminal of the liquid crystal element 5082. A second terminal of the liquid crystal element 5082 is electrically connected to a wiring 5087. A first terminal of the capacitor 5083 is electrically connected to the first terminal of the liquid crystal element 5082. A second terminal of the capacitor 5083 is electrically connected to a wiring 5086. Note that a first terminal of a transistor refers to one of a source and a drain, and a second terminal of the transistor refers to the other of the source and the drain. That is, when the first terminal of the transistor is the source, the second terminal of the transistor is the drain. Similarly, when the first terminal of the transistor is the drain, the second terminal of the transistor is the source.

The wiring 5084 can function as a signal line. The signal line is a wiring for transmitting a signal voltage, which is input from the outside of the pixel, to the pixel 5080. The wiring 5085 can function as a scan line. The scan line is a wiring for controlling on and off of the transistor 5081. The wiring 5086 can function as a capacitor line. The capacitor line is a wiring for applying a predetermined voltage to the second terminal of the capacitor 5083. The transistor 5081 can function as a switch. The capacitor 5083 can function as a storage capacitor. The storage capacitor is a capacitor with which the signal voltage continues to be applied to the liquid crystal element 5082 even when the switch is off. The wiring 5087 can function as a counter electrode. The counter electrode is a wiring for applying a predetermined voltage to the second terminal of the liquid crystal element 5082. Note that a function of each wiring is not limited thereto, and each wiring can have a variety of functions. For example, by changing a voltage applied to the capacitor line, a voltage applied to the liquid crystal element can be adjusted. Note that the transistor 5081 can be a p-channel transistor or an n-channel transistor because the transistor 5081 merely functions as a switch.

Figure 40B:
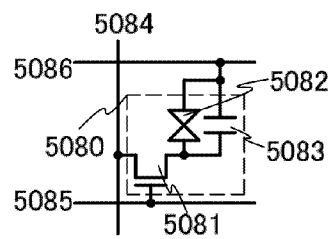

FIG. 40B illustrates an example of a pixel structure which can be applied to a liquid crystal display device. The example of the pixel structure illustrated in FIG. 40B is the same as that in FIG. 40A, except that the wiring 5087 is eliminated and the second terminal of the liquid crystal element 5082 and the second terminal of the capacitor 5083 are electrically connected to each other. The example of the pixel structure in FIG. 40B can be particularly applied to the case of using a liquid crystal element with a horizontal electric field mode (including an IPS mode and FFS mode). This is because in the horizontal electric field mode liquid crystal element, the second terminal of the liquid crystal element 5082 and the second terminal of the capacitor 5083 can be formed over one substrate; thus, it is easy to electrically connect the second terminal of the liquid crystal element 5082 and the second terminal of the capacitor 5083. With the pixel structure illustrated in FIG. 40B, the wiring 5087 can be eliminated, so that a manufacturing process can be simplified and manufacturing costs can be reduced.

Figure 40C:
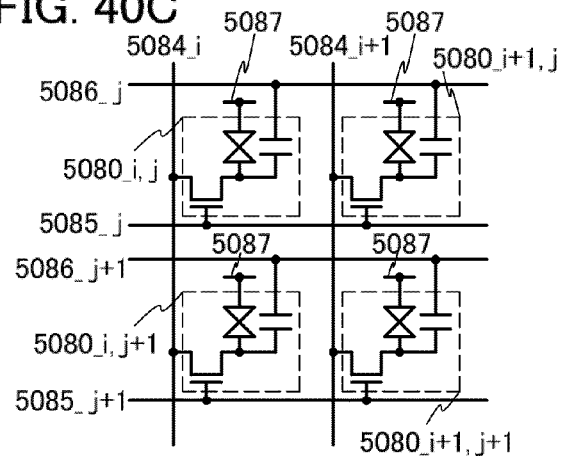

A plurality of pixel structures illustrated in FIG. 40A or FIG. 40B can be arranged in matrix. Accordingly, a display portion of a liquid crystal display device is formed, so that a variety of images can be displayed. FIG. 40C illustrates a circuit configuration in the case where a plurality of pixel structures illustrated in FIG. 40A are arranged in matrix. FIG. 40C is a circuit diagram illustrating four pixels among a plurality of pixels included in the display portion. A pixel arranged in an i-th column and a j-th row (each of i and j is a natural number) is represented as a pixel 5080_$i, j$, and a wiring 5084_$i$, a wiring 5085_$j$, and a wiring 5086_$j$ are electrically connected to the pixel 5080_$i, j$. Similarly, a pixel 5080_$j+1, j$ is electrically connected to a wiring 5084_$i+1$, the wiring 5085_$j$, and the wiring 5086_$j$. Similarly, a pixel 5080_$i, j+1$ is electrically connected to the wiring 5084_$i$, a wiring 5085_$j+1$, and a wiring 5086_$j+1$. Similarly, a pixel 5080_$i+1, j+1$ is electrically connected to the wiring 5084_$i+1$, the wiring 5085_$j+1$, and the wiring 5086_$j+1$. Note that each wiring can be used in common with a plurality of pixels in the same column or the same row. In the pixel structure illustrated in FIG. 40C, the wiring 5087 is a counter electrode, which is used by all the pixels in common; therefore, the wiring 5087 is not indicated by the natural number i or j. Further, since the pixel structure in FIG. 40B can also be used, the wiring 5087 is not essential even in a structure where the wiring 5087 is described, and the wiring 5087 can be eliminated when another wiring functions as the wiring 5087, for example.

Figure 40D:
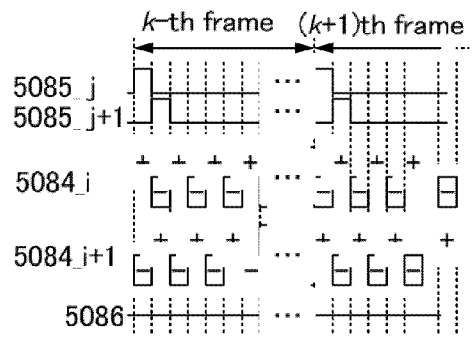

The pixel structure in FIG. 40C can be driven by a variety of driving methods. In particular, when the pixels are driven by a method called alternating-current driving, degradation (burn-in) of the liquid crystal element can be suppressed. FIG. 40D is a timing chart of voltages applied to each wiring in the pixel structure in FIG. 40C in the case where dot inversion driving which is a kind of alternating-current driving is performed. By the dot inversion driving, flickers seen when the alternating-current driving is performed can be suppressed.

In the pixel structure in FIG. 40C, a switch in a pixel electrically connected to the wiring 5085_$j$ is brought into a selection state (an on state) in a j-th gate selection period in one frame period, and brought into a non-selection state (an off state) in the other periods. Then, after the j-th gate selection period, a (j+1)th gate selection period is provided. By performing sequential scanning in this manner, all the pixels are sequentially selected in one frame period. In the timing chart in FIG. 40D, when the voltage is set to high level, the switch in the pixel is brought into a selection state; when the voltage is set to low level, the switch is brought into a non-selection state. Note that this is the case where the transistors in the pixels are n-channel transistors. In the case of using p-channel transistors, the relation between the voltage and the selection state is opposite to that in the case of using n-channel transistors.

In the timing chart illustrated in FIG. 40D, in the j-th gate selection period in a k-th frame (k is a natural number), a positive signal voltage is applied to the wiring 5084_$i$ used as a signal line, and a negative signal voltage, is applied to the wiring 5084_$i+1$. Then, in the (j+1)th gate selection period in the k-th frame, a negative signal voltage is applied to the wiring 5084_$i$, and a positive signal voltage is applied to the wiring 5084_$i+1$. After that, signals whose polarity is reversed in each gate selection period are alternately supplied to each of the signal lines. Thus, in the k-th frame, the positive signal voltage is applied to the pixel 5080_$i, j$ and the pixel 5080_$i+1, j+1$, and the negative signal voltage is applied to the pixel 5080_$i+1, j$ and the pixel 5080_$i, j+1$. Then, in a (k+1)th frame, a signal voltage whose polarity is opposite to that of the signal voltage written in the k-th frame is written to each pixel. Thus, in the (k+1)th frame, the positive signal voltage is applied to the pixel 5080_$i+1, j$ and the pixel 5080_$i, j+1$, and the negative signal voltage is applied to the pixel 5080_$i, j$ and the pixel 5080_$i+1, j+1$. The dot inversion driving is a driving method in which signal voltages whose polarity is different between adjacent pixels are applied in one frame and the polarity of the voltage signal for one pixel is reversed in each frame as described above. By the dot inversion driving, flickers seen when the entire or part of an image to be displayed is uniform can be suppressed while degradation of the liquid crystal element is suppressed. Note that voltages applied to all the wirings 5086 including the wiring 5086_$j$ and the wiring 5086_$j+1$ can be a constant voltage. Moreover, although only the polarity of the signal voltages for the wirings 5084 is shown in the timing chart, the signal voltages can actually have a variety of values in the polarity shown. Here, the case where the polarity is reversed per dot (per pixel) is described; however, this embodiment is not limited thereto, and the polarity can be reversed per a plurality of pixels. For example, when the polarity of signal voltages to be written is reversed per two gate selection periods, power consumed by writing the signal voltages can be reduced. Alternatively, the polarity may be reversed per column (source line inversion) or per row (gate line inversion).

Figure 40E:
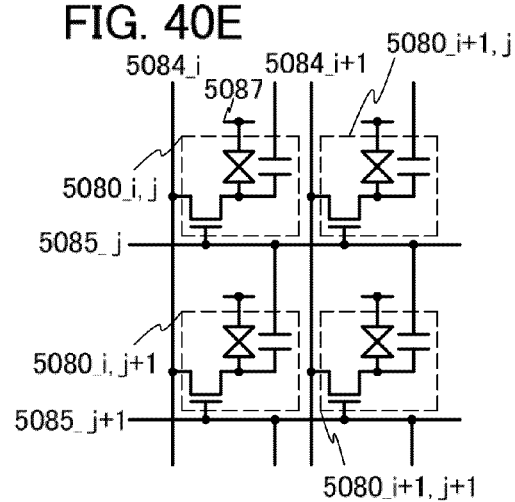

Note that a constant voltage may be applied to the second terminal of the capacitor 5083 in the pixel 5080 in one frame period. Here, a voltage applied to the wiring 5085 used as a scan line is at low level in most of one frame period, which means that a substantially constant voltage is applied to the wiring 5085; therefore, the second terminal of the capacitor 5083 in the pixel 5080 may be connected to the wiring 5085. FIG. 40E illustrates an example of a pixel structure which can be applied to a liquid crystal display device. Compared to the pixel structure in FIG. 40C, features of the pixel structure in FIG. 40E are that the wiring 5086 is eliminated and the second terminal of the capacitor 5083 in the pixel 5080 and the wiring 5085 in the previous row are electrically connected to each other. Specifically, in the range illustrated in FIG. 40E, the second terminals of the capacitors 5083 in the pixel 5080_$i, j+1$ and the pixel 5080_$i+1, j+1$ are electrically connected to the wiring 5085_$j$. The wiring 5086 can be eliminated when the second terminals of the capacitors 5083 in the pixels 5080 and the wiring 5085 in the previous row are electrically connected to each other in such a manner, so that the aperture ratio of the pixel can be increased. Note that the second terminal of the capacitor 5083 may be connected to the wiring 5085 in another row instead of the wiring 5085 in the previous row. Further, the pixel structure in FIG. 40E can be driven by a driving method similar to that in the pixel structure in FIG. 40C.

Figure 40F:
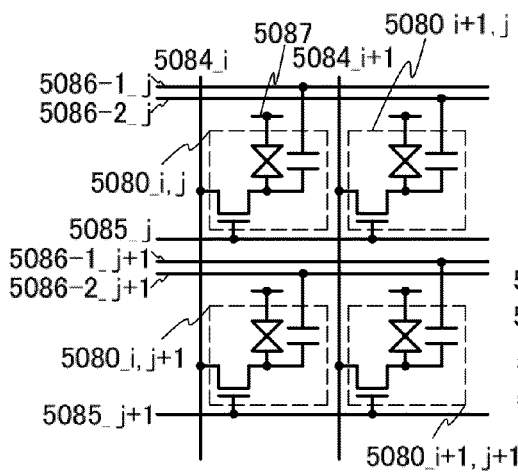

Note that a voltage applied to the wiring 5084 used as a signal line can be made lower by using the capacitor 5083 and the wiring electrically connected to the second terminal of the capacitor 5083. A structure and a driving method of a pixel in that case are described with reference to FIGS. 40F and 40G. Compared to the pixel structure in FIG. 40A, features of the pixel structure in FIG. 40F are that two wirings 5086 are provided per pixel row, and in adjacent pixels, one wiring is electrically connected to every other second terminal of the capacitors 5083 and the other wiring is electrically connected to the remaining every other second terminal of the capacitors 5083. Two wirings 5086 are referred to as a wiring 5086-1 and a wiring 5086-2. Specifically, in the range illustrated in FIG. 40F, the second terminal of the capacitor 5083 in the pixel 5080_$i, j$ is electrically connected to a wiring 5086-1_$j$; the second terminal of the capacitor 5083 in the pixel 5080_$i+1, j$ is electrically connected to a wiring 5086-2_$j$; the second terminal of the capacitor 5083 in the pixel 5080_$i, j+1$ is electrically connected to a wiring 5086-2_$j+1$; and the second terminal of the capacitor 5083 in the pixel 5080_$i+1, j+1$ is electrically connected to a wiring 5086-1_$j+1$.

Figure 40G:
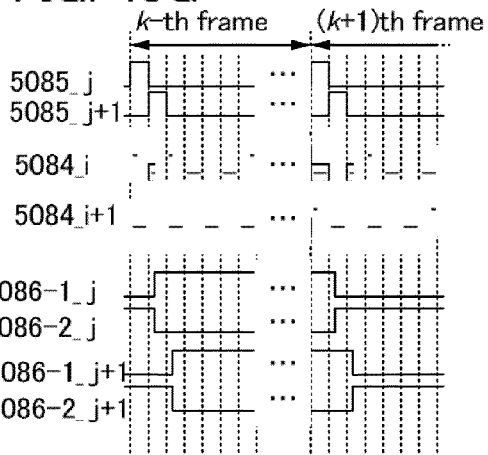

For example, as illustrated in FIG. 40G, when a positive signal voltage is written to the pixel 5080_$i, j$ in the k-th frame, the wiring 5086-1_$j$ is set to low level in the j-th gate selection period and is changed to high level after the j-th gate selection period. Then, the wiring 5086-1_$j$ is kept at high level in one frame period, and after a negative signal voltage is written in the j-th gate selection period in the (k+1)th frame, the wiring 5086-1_$j$ is changed to low level. In such a manner, a voltage of the wiring which is electrically connected to the second terminal of the capacitor 5083 is changed in the positive direction after a positive signal voltage is written to the pixel, whereby a voltage applied to the liquid crystal element can be changed in the positive direction by a predetermined amount. That is, a signal voltage written to the pixel can be reduced accordingly, so that power consumed by signal writing can be reduced. Note that when a negative signal voltage is written in the j-th gate selection period, a voltage of the wiring which is electrically connected to the second terminal of the capacitor 5083 is changed in the negative direction after a negative signal voltage is written to the pixel. Accordingly, a voltage applied to the liquid crystal element can be changed in the negative direction by a predetermined amount, so that the signal voltage written to the pixel can be reduced as in the case of the positive polarity. In other words, as for the wiring which is electrically connected to the second terminal of the capacitor 5083, different wirings are preferably used for a pixel to which a positive signal voltage is applied and a pixel to which a negative signal voltage is applied in the same row in one frame. FIG. 40F illustrates the example in which the wiring 5086-1 is electrically connected to the pixels to which a positive signal voltage is applied in the k-th frame, and the wiring 5086-2 is electrically connected to the pixels to which a negative signal voltage is applied in the k-th frame. Note that this is just an example, and for example, in the case of using a driving method in which pixels to which a positive signal voltage is applied and pixels to which a negative signal voltage is applied are arranged every two pixels, the wirings 5086-1 and 5086-2 are preferably electrically connected to every alternate two pixels accordingly.

Furthermore, in the case where signal voltages of the same polarity are written in all the pixels in one row (gate line inversion), one wiring 5086 is provided per row. In other words, the pixel structure in FIG. 40C can employ the driving method where a signal voltage written to a pixel is reduced as described with reference to FIGS. 40F and 40G.

Figure 41A:
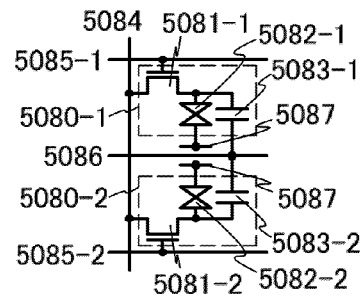
FIGS. 41A to 41H each illustrate a semiconductor device.
Figure 41B:
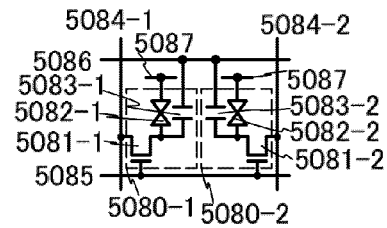

Next, a pixel structure and a driving method are described which are preferably used particularly by a liquid crystal element with a vertical alignment (VA) mode typified by an MVA mode or a PVA mode. The VA mode has advantages that a rubbing process is not necessary in manufacturing, the amount of light leakage is small in displaying black images, and the level of drive voltage is low; however, the VA mode has a problem in that the quality of images deteriorates when a screen is viewed from an angle (the viewing angle is small). In order to increase the viewing angle in the VA mode, a pixel structure where one pixel includes a plurality of subpixels as illustrated in FIGS. 41A and 41B is effective. Pixel structures illustrated in FIGS. 41A and 41B are examples of the case where the pixel 5080 includes two subpixels (a subpixel 5080-1 and a subpixel 5080-2). Note that the number of subpixels in one pixel is not limited to two and can be other numbers. As the number of subpixels becomes larger, the viewing angle can be further increased. A plurality of subpixels can have the same circuit configuration. Here, the case is described in which all the subpixels have the same circuit configuration as that in FIG. 40A. The first subpixel 5080-1 includes a transistor 5081-1, a liquid crystal element 5082-1, and a capacitor 5083-1. The connection relation is the same as that in the circuit configuration in FIG. 40A. Similarly, the second subpixel 5080-2 includes a transistor 5081-2, a liquid crystal element 5082-2, and a capacitor 5083-2. The connection relation is the same as that in the circuit configuration in FIG. 40A.

The pixel structure in FIG. 41A includes, for two subpixels included in one pixel, two wirings 5085 (a wiring 5085-1 and a wiring 5085-2) used as scan lines, one wiring 5084 used as a signal line, and one wiring 5086 used as a capacitor line. When the signal line and the capacitor line are shared with two subpixels in such a manner, the aperture ratio can be increased. Further, a signal line driver circuit can be simplified, so that manufacturing costs can be reduced. Moreover, the number of connections between a liquid crystal panel and a driver circuit IC can be reduced, so that the yield can be increased. The pixel structure in FIG. 41B includes, for two subpixels included in one pixel, one wiring 5085 used as a scan line, two wirings 5084 (a wiring 5084-1 and a wiring 5084-2) used as signal lines, and one wiring 5086 used as a capacitor line. When the scan line and the capacitor line are shared with two subpixels in such a manner, the aperture ratio can be increased. Further, the total number of scan lines can be reduced, so that one gate line selection period can be sufficiently long even in a high-definition liquid crystal panel, and an appropriate signal voltage can be written in each pixel.

Figure 41C:
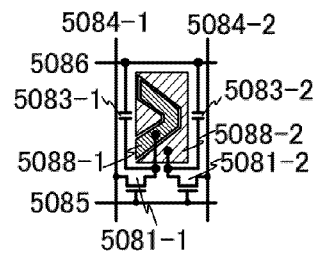
Figure 41D:
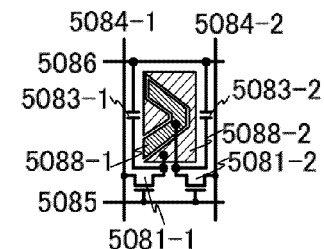

FIGS. 41C and 41D each schematically illustrate an example of electrical connections of elements in the case where the liquid crystal element in the pixel structure in FIG. 41B is replaced with the shape of a pixel electrode. In FIGS. 41C and 41D, an electrode 5088-1 represents a first pixel electrode, and an electrode 5088-2 represents a second pixel electrode. In FIG. 41C, the first pixel electrode 5088-1 corresponds to a first terminal of the liquid crystal element 5082-1 in FIG. 41B, and the second pixel electrode 5088-2 corresponds to a first terminal of the liquid crystal element 5082-2 in FIG. 41B. That is, the first pixel electrode 5088-1 is electrically connected to one of a source and a drain of the transistor 5081-1, and the second pixel electrode 5088-2 is electrically connected to one of a source and a drain of the transistor 5081-2. In FIG. 41D, the connection relation between the pixel electrode and the transistor is opposite to that in FIG. 41C. That is, the first pixel electrode 5088-1 is electrically connected to one of the source and the drain of the transistor 5081-2, and the second pixel electrode 5088-2 is electrically connected to one of the source and the drain of the transistor 5081-1.

Figure 41E:
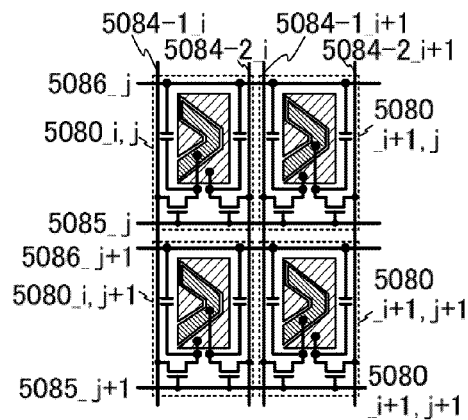
Figure 41F:
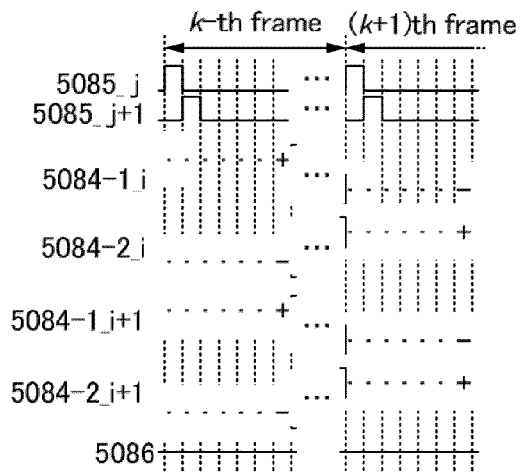

By alternately arranging a plurality of pixel structures illustrated in FIGS. 41C and 41D in matrix, special advantageous effects can be obtained. FIGS. 41E and 41F illustrate an example of such a pixel structure and driving method. In the pixel structure in FIG. 41E, portions corresponding to the pixel 5080_$i, j$ and the pixel 5080_$i+1, j+1$ have the structure illustrated in FIG. 41C, and portions corresponding to the pixel 5080_$i+1, j$ and the pixel 5080_$i, j+1$ have the structure illustrated in FIG. 41D. When the pixels with this structure are driven as the timing chart illustrated in FIG. 41F, in the j-th gate selection period in the k-th frame, a positive signal voltage is written to the first pixel electrode in the pixel 5080_$i, j$ and the second pixel electrode in the pixel 5080_$i+1, j$, and a negative signal voltage is written to the second pixel electrode in the pixel 5080_$i, j$ and the first pixel electrode in the pixel 5080_$i+1, j$. Then, in the (j+1)th gate selection period in the k-th frame, a positive signal voltage is written to the second pixel electrode in the pixel 5080_$i, j+1$ and the first pixel electrode in the pixel 5080_$i+1, j+1$, and a negative signal voltage is written to the first pixel electrode in the pixel 5080_$i, j+1$ and the second pixel electrode in the pixel 5080_$i+1, j+1$. In the (k+1)th frame, the polarity of the signal voltage is reversed in each pixel. Accordingly, the polarity of the voltage applied to the signal line can be the same in one frame period while driving corresponding to dot inversion driving is realized in the pixel structure including subpixels, whereby power consumed by writing the signal voltages to the pixels can be drastically reduced. Note that voltages applied to all the wirings 5086 including the wiring 5086_$j$ and the wiring 5086_$j+1$ can be a constant voltage.

Figure 41G:
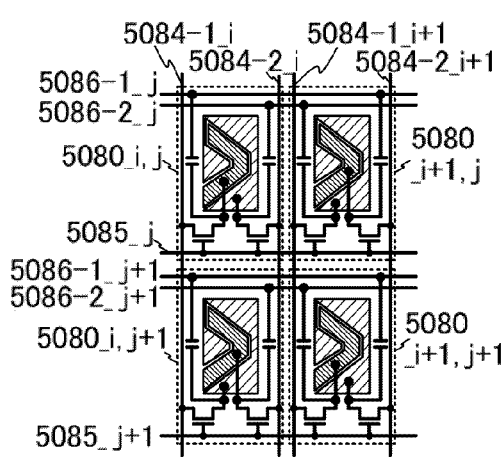
Figure 41H:
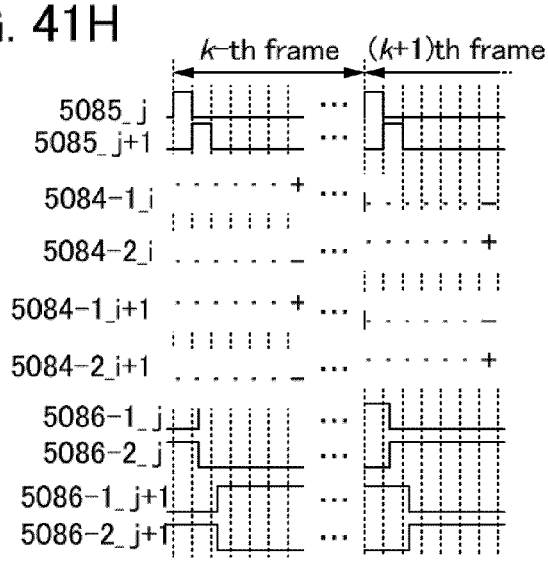

Further, with a pixel structure and a driving method illustrated in FIGS. 41G and 41H, the level of the signal voltage written to a pixel can be reduced. In the structure, capacitor lines which are electrically connected to a plurality of subpixels included in each pixel are different between the subpixels. That is, with the pixel structure and the driving method illustrated in FIGS. 41G and 41H, one capacitor line is shared with subpixels in one row, to which signal voltages of the same polarity are written in one frame; and subpixels to which signal voltages of the different polarities are written in one frame use different capacitor lines in one row. Then, when writing in each row is finished, voltages of the capacitor lines are changed in the positive direction in the subpixels to which a positive signal voltage is written, and changed in the negative direction in the subpixels to which a negative signal voltage is written; thus, the level of the signal voltage written to the pixel can be reduced. Specifically, two wirings 5086 (the wirings 5086-1 and 5086-2) used as capacitor lines are provided per row. The first pixel electrode in the pixel 5080_$i, j$ and the wiring 5086-1_$j$ are electrically connected through the capacitor. The second pixel electrode in the pixel 5080_$i, j$ and the wiring 5086-2_$j$ are electrically connected through the capacitor. The first pixel electrode in the pixel 5080_$i+1, j$ and the wiring 5086-2_$j$ are electrically connected through the capacitor. The second pixel electrode in the pixel 5080_$i+1, j$ and the wiring 5086-1_$j$ are electrically connected through the capacitor. The first pixel electrode in the pixel 5080_$i, j+1$ and the wiring 5086-2_$j+1$ are electrically connected through the capacitor. The second pixel electrode in the pixel 5080_$i, j+1$ and the wiring 5086-1_$j+1$ are electrically connected through the capacitor. The first pixel electrode in the pixel 5080_$i+1, j+1$ and the wiring 5086-1_$j+1$ are electrically connected through the capacitor. The second pixel electrode in the pixel 5080_$i+1, j+1$ and the wiring 5086-2_$j+1$ are electrically connected through the capacitor. Note that this is just an example, and for example, in the case of using a driving method in which pixels to which a positive signal voltage is applied and pixels to which a negative signal voltage is applied are arranged every two pixels, the wirings 5086-1 and 5086-2 are preferably electrically connected to every alternate two pixels accordingly. Furthermore, in the case where signal voltages of the same polarity are written in all the pixels in one row (gate line inversion), one wiring 5086 is provided per row. In other words, the pixel structure in FIG. 41E can employ the driving method where a signal voltage written to a pixel is reduced as described with reference to FIGS. 41G and 41H.

Embodiment 10

Next, another structure example and a driving method of a display device will be described. In this embodiment, a display device including a display element whose luminance response with respect to signal writing is slow (whose response time is long) will be described. In this embodiment, a liquid crystal element is described as an example of the display element with long response time; however, a display element in this embodiment is not limited the liquid crystal element, and a variety of display elements whose luminance response with respect to signal writing is slow can be used.

In a general liquid crystal display device, luminance response with respect to signal writing is slow, and it sometimes takes more than one frame period to complete the response even when a signal voltage continues to be applied to a liquid crystal element. Moving images cannot be precisely displayed by such a display element. Further, in the case of employing active matrix driving, the time for signal writing to one liquid crystal element is usually only a period (one scan line selection period) obtained by dividing a signal writing cycle (one frame period or one subframe period) by the number of scan lines, and the liquid crystal element cannot respond in such a short time in many cases. Accordingly, most of the response of the liquid crystal element is performed in a period during which signal writing is not performed. Here, the dielectric constant of the liquid crystal element is changed in accordance with the transmittance of the liquid crystal element, and the response of the liquid crystal element in a period during which signal writing is not performed means that the dielectric constant of the liquid crystal element is changed when electric charge is not exchanged with the outside of the liquid crystal element (in a constant charge state). In other words, in the formula where charge=(capacitance)·(voltage), the capacitance is changed when the charge is constant. Accordingly, a voltage applied to the liquid crystal element is changed from a voltage at the time of signal writing, in accordance with the response of the liquid crystal element. Therefore, when the liquid crystal element whose luminance response with respect to signal writing is slow is driven by an active matrix mode, a voltage applied to the liquid crystal element cannot theoretically reach the voltage at the time of signal writing.

In a display device in this embodiment, the signal level at the time of signal writing is corrected in advance (a correction signal is used) so that a display element can reach desired luminance within a signal writing cycle, whereby the above problem can be solved. Further, since the response time of the liquid crystal element is shorter as the signal level becomes higher, the response time of the liquid crystal element can also be reduced by writing a correction signal. A driving method by which such a correction signal is added is referred to as overdriving. By overdriving in this embodiment, even when a signal writing cycle is shorter than a cycle (an input image signal cycle $T_{in}$) for an image signal input to the display device, the signal level is corrected in accordance with the signal writing cycle, whereby the display element can reach desired luminance within the signal writing cycle. An example of the case where the signal writing cycle is shorter than the input image signal cycle $T_{in}$ is the case where one original image is divided into a plurality of subimages and the plurality of subimages are sequentially displayed in one frame period.

Figure 42A:
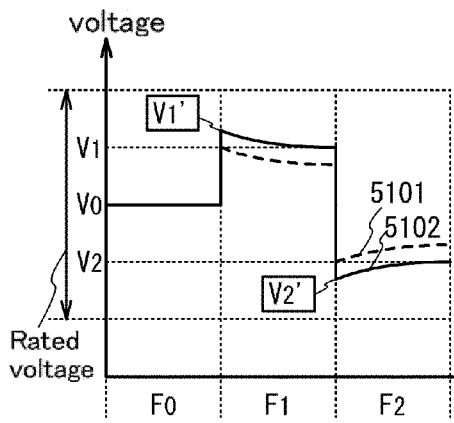
FIGS. 42A to 42F each illustrate a semiconductor device.
Figure 42B:
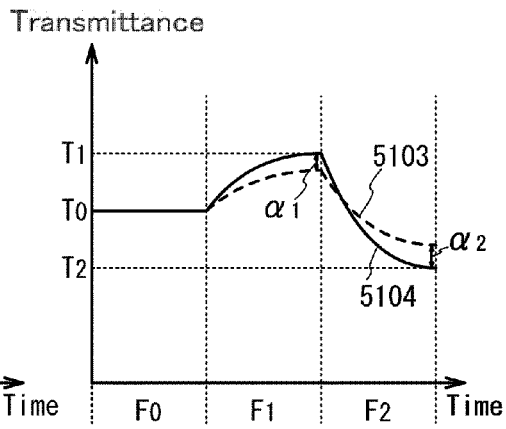

Next, an example of a method for correcting the signal level at the time of signal writing in an active matrix display device is described with reference to FIGS. 42A and 42B. FIG. 42A is a graph schematically illustrating change over time in signal level at the time of signal writing in one display element, with the time as the horizontal axis and the signal level at the time of signal writing as the vertical axis. FIG. 42B is a graph schematically illustrating change over time in display level in one display element, with the time as the horizontal axis and the display level as the vertical axis. Note that when the display element is a liquid crystal element, the signal level at the time of signal writing can be the voltage, and the display level can be the transmittance of the liquid crystal element. In the following description, the vertical axis in FIG. 42A represents voltage, and the vertical axis in FIG. 42B represents transmittance. Note that in the overdriving in this embodiment, the signal level may be other than voltage (may be the duty ratio or current, for example). Moreover, in the overdriving in this embodiment, the display level may be other than transmittance (may be luminance or current, for example). Liquid crystal elements are classified into two modes: a normally black mode in which black is displayed when a voltage is 0 (e.g., a VA mode and an IPS mode), and a normally white mode in which white is displayed when a voltage is 0 (e.g., a TN mode and an OCB mode). The graph in FIG. 42B can correspond to both modes; the transmittance increases in the upper part of the graph in the normally black mode, whereas the transmittance increases in the lower part of the graph in the normally white mode. That is, a liquid crystal mode in this embodiment may be a normally black mode or a normally white mode. Note that the timing of signal writing is represented on the time axis by dotted lines, and a period after signal writing is performed until the next signal writing is performed is referred to as a retention period $F_i$. In this embodiment, i is an integer and an index for representing each retention period. In FIGS. 42A and 42B, i is 0 to 2; however, i can be an integer other than 0 to 2 (only the case where i is 0 to 2 is illustrated). Note that in the retention period $F_i$, the transmittance for realizing luminance corresponding to an image signal is denoted by $T_i$, and the voltage for providing the transmittance $T_i$ in a constant state is denoted by $V_i$. In FIG. 42A, a dashed line 5101 represents change over time in voltage applied to the liquid crystal element in the case where overdriving is not performed, and a solid line 5102 represents change over time in voltage applied to the liquid crystal element in the case where the overdriving in this embodiment is performed. Similarly, in FIG. 42B, a dashed line 5103 represents change over time in transmittance of the liquid crystal element when overdriving is not performed, and a solid line 5104 represents change over time in transmittance of the liquid crystal element when the overdriving in this embodiment is performed. Note that the difference between the desired transmittance $T_i$ and the actual transmittance at the end of the retention period $F_i$ is referred to as an error $\alpha_i$.

It is assumed that, in the graph illustrated in FIG. 42A, both the dashed line 5101 and the solid line 5102 represent the case where a desired voltage $V_0$ is applied in a retention period $F_0$; and in the graph illustrated in FIG. 42B, both the dashed line 5103 and the solid line 5104 represent the case where desired transmittance $T_0$ is obtained. When overdriving is not performed, a desired voltage $V_1$ is applied at the beginning of a retention period $F_1$ as shown by the dashed line 5101. As has been described above, a period for signal writing is extremely shorter than a retention period, and the liquid crystal element is in a constant charge state in most of the retention period. Accordingly, a voltage applied to the liquid crystal element in the retention period is changed along with the change in transmittance and becomes greatly different from the desired voltage $V_1$ at the end of the retention period $F_1$. In this case, the dashed line 5103 in the graph of FIG. 42B is also greatly different from desired transmittance $T_1$. Thus, accurate display of an image signal cannot be performed, and the image quality is degraded. On the other hand, when the overdriving in this embodiment is performed, a voltage $V_1'$ which is higher than the desired voltage $V_1$ is applied to the liquid crystal element at the beginning of the retention period $F_1$ as shown by the solid line 5102. That is, the voltage $V_1'$ which is corrected from the desired voltage $V_1$ is applied to the liquid crystal element at the beginning of the retention period $F_1$ so that the voltage applied to the liquid crystal element at the end of the retention period $F_1$ is close to the desired voltage $V_1$ in anticipation of gradual change in voltage applied to the liquid crystal element in the retention period $F_1$. Accordingly, the desired voltage $V_1$ can be accurately applied to the liquid crystal element. At that time, as shown by the solid line 5104 in the graph of FIG. 42B, the desired transmittance $T_1$ can be obtained at the end of the retention period $F_1$. In other words, the response of the liquid crystal element within the signal writing cycle can be realized, despite the fact that the liquid crystal element is in a constant charge state in most of the retention period. Then, in a retention period $F_2$, the case where a desired voltage $V_2$ is lower than $V_1$ is shown. In that case also, as in the retention period $F_1$, a voltage $V_2'$ which is corrected from the desired voltage $V_2$ may be applied to the liquid crystal element at the beginning of the retention period $F_2$ so that the voltage applied to the liquid crystal element at the end of the retention period $F_2$ is close to the desired voltage $V_2$ in anticipation of gradual change in voltage applied to the liquid crystal element in the retention period $F_2$. Accordingly, as shown by the solid line 5104 in the graph of FIG. 42B, desired transmittance $T_2$ can be obtained at the end of the retention period $F_2$. Note that when $V_i$ is higher than $V_{i-1}$ as in the retention period $F_1$, the corrected voltage $V_i'$ is preferably corrected to be higher than a desired voltage $V_i$. Further, when $V_i$ is lower than $V_{i-1}$ as in the retention period $F_2$, the corrected voltage $V_i'$ is preferably corrected to be lower than the desired voltage $V_i$. A specific correction value can be derived by measuring response characteristics of the liquid crystal element in advance. As a method for realizing the overdriving in the device, a method in which a correction formula is formulated and included in a logic circuit, a method in which a correction value is stored in a memory as a lookup table and read as necessary, or the like can be used.

Figure 42C:
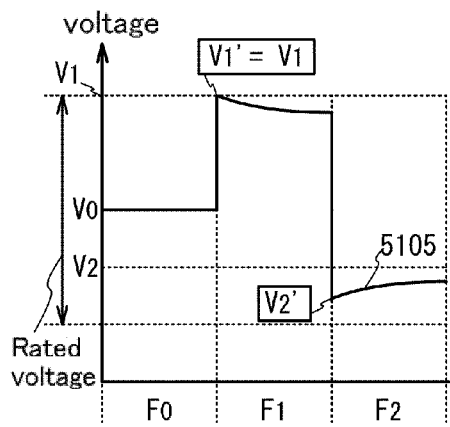
Figure 42D:
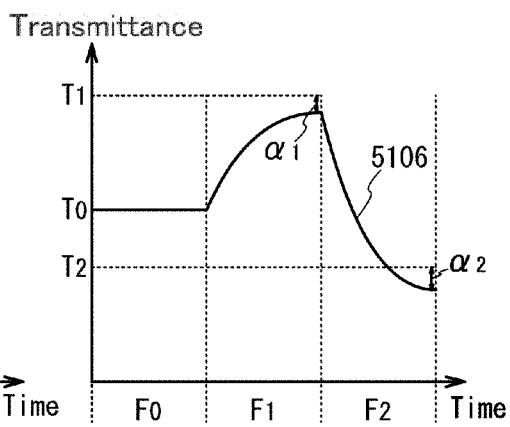
Figure 42E:
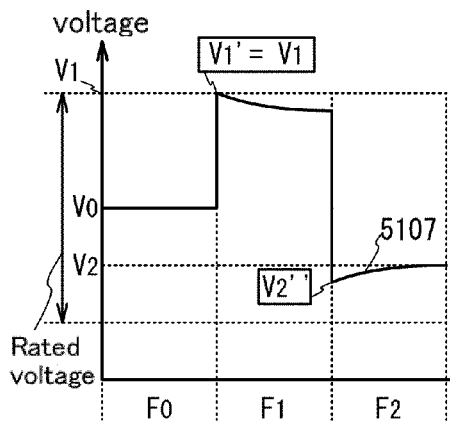
Figure 42F:
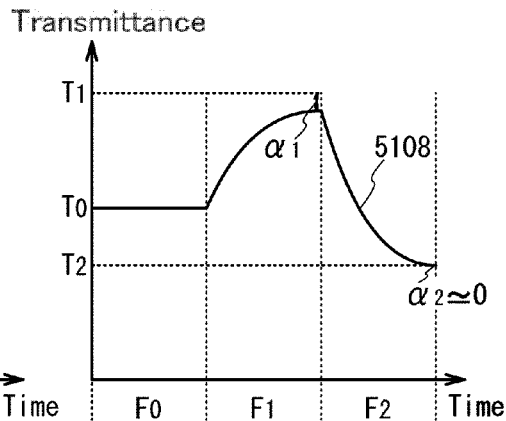

Note that there are several limitations on the actual realization of the overdriving in this embodiment as a device. For example, voltage correction should be performed in the range of the rated voltage of a source driver. That is, if a desired voltage is originally high and an ideal correction voltage exceeds the rated voltage of the source driver, complete correction cannot be performed. Problems in such a case are described with reference to FIGS. 42C and 42D. As in FIG. 42A, FIG. 42C is a graph in which change over time in voltage in one liquid crystal element is schematically illustrated as a solid line 5105 with the time as the horizontal axis and the voltage as the vertical axis. As in FIG. 42B, FIG. 42D is a graph in which change over time in transmittance of one liquid crystal element is schematically illustrated as a solid line 5106 with the time as the horizontal axis and the transmittance as the vertical axis. Note that other references are similar to those in FIGS. 42A and 42B; therefore, the description is not repeated. FIGS. 42C and 42D illustrate a state where sufficient correction is not performed because the correction voltage $V_1'$ for realizing the desired transmittance $T_1$ in the retention period $F_1$ exceeds the rated voltage of the source driver, and thus $V_1'=V_1$ has to be given. At that time, the transmittance at the end of the retention period $F_1$ is deviated from the desired transmittance $T_1$ by the error $\alpha_1$. Note that the error $\alpha_1$ is increased only when the desired voltage is originally high; therefore, degradation of image quality due to occurrence of the error $\alpha_1$ is often in the allowable range. However, as the error $\alpha_1$ is increased, an error in the algorithm for voltage correction is also increased. In other words, in the algorithm for voltage correction, when it is assumed that the desired transmittance is obtained at the end of the retention period, even though the error $\alpha_1$ is increased, the voltage correction is performed on the basis that the error $\alpha_1$ is small. Accordingly, the error is included in the correction in the next retention period $F_2$, and thus, an error $\alpha_2$ is also increased. Moreover, when the error $\alpha_2$ is increased, the following error $\alpha_3$ is further increased, and the error is increased in a chain reaction manner, resulting in significant degradation of image quality. In the overdriving in this embodiment, in order to prevent increase of errors in such a chain reaction manner, when the correction voltage $V_i'$ exceeds the rated voltage of the source driver in the retention period $F_i$, an error $\alpha_i$ at the end of the retention period $F_i$ is assumed, and the correction voltage in a retention period $F_{i+1}$ can be adjusted in consideration of the amount of the error $\alpha_i$. Accordingly, even when the error $\alpha_i$ is increased, the adverse effect of the error $\alpha_i$ on the error $\alpha_{i+1}$ can be minimized, whereby increase of errors in a chain reaction manner can be prevented. An example where the error $\alpha_2$ is minimized in the overdriving in this embodiment is described with reference to FIGS. 42E and 42F. In a graph of FIG. 42E, a solid line 5107 represents change over time in voltage in the case where the correction voltage $V_2'$ in the graph of FIG. 42C is further adjusted to be a correction voltage $V_2''$. A graph of FIG. 42F illustrates change over time in transmittance in the case where a voltage is corrected in accordance with the graph of FIG. 42E. The solid line 5106 in the graph of FIG. 42D indicates that excessive correction (i.e., correction in a situation where an error is large) is caused by the correction voltage $V_2'$. On the other hand, a solid line 5108 in the graph of FIG. 42F indicates that excessive correction is suppressed by the correction voltage $V_2''$, which is adjusted in consideration of the error $\alpha_1$, and the error $\alpha_2$ is minimized. A specific correction value can be derived by measuring response characteristics of the liquid crystal element in advance. As a method for realizing the overdriving in the device, a method in which a correction formula is formulated and included in a logic circuit, a method in which a correction value is stored in a memory as a lookup table and read as necessary, or the like can be used. Moreover, such a method can be added separately from a portion for calculating a correction voltage $V_i'$ or included in the portion for calculating the correction voltage $V_i'$. Note that the amount of correction of a correction voltage $V_i''$ which is adjusted in consideration of an error $\alpha_{i-1}$ (the difference with the desired voltage $V_i$) is preferably smaller than that of $V_i'$. That is, $|V_i''-V_i|<|V_i'-V_i|$ is preferable.

Note that the error $\alpha_i$ which is caused because an ideal correction voltage exceeds the rated voltage of the source driver is increased as a signal writing cycle is shorter. This is because the response time of the liquid crystal element needs to be shorter as the signal writing cycle is shorter, and thus, the higher correction voltage is necessary. Further, as a result of increasing the correction voltage needed, the correction voltage exceeds the rated voltage of the source driver more frequently, whereby large errors $\alpha_i$ occur more frequently. Accordingly, the overdriving in this embodiment is more effective in the case where the signal writing cycle is shorter. Specifically, the overdriving in this embodiment is significantly effective in the case of performing the following driving methods, for example: the case where one original image is divided into a plurality of subimages and the plurality of subimages are sequentially displayed in one frame period, the case where motion of a plurality of images is detected and an intermediate image of the plurality of images is generated and interpolated between the plurality of images (so-called motion compensation frame rate conversion), and the case where such driving methods are combined.

Note that a rated voltage of the source driver has the lower limit in addition to the upper limit described above. An example of the lower limit is the case where a voltage lower than the voltage 0 cannot be applied. At that time, since an ideal correction voltage cannot be applied as in the case of the upper limit described above, the error $\alpha_i$ is increased. However, in that case also, the error $\alpha_i$ at the end of the retention period $F_i$ is assumed, and the correction voltage in the retention period $F_{i+1}$ can be adjusted in consideration of the amount of the error $\alpha_i$ in a similar manner as the above method. Note that when a voltage (a negative voltage) lower than the voltage 0 can be applied as a rated voltage of the source driver, the negative voltage may be applied to the liquid crystal element as a correction voltage. Accordingly, the voltage applied to the liquid crystal element at the end of retention period $F_i$ can be adjusted to be close to the desired voltage $V_i$ in anticipation of change in potential due to a constant charge state.

In addition, in order to suppress degradation of the liquid crystal element, so-called inversion driving in which the polarity of a voltage applied to the liquid crystal element is periodically reversed can be performed in combination with the overdriving. That is, the overdriving in this embodiment includes, in its category, the case where the overdriving is performed at the same time as the inversion driving. For example, in the case where the length of the signal writing cycle is ½ of that of the input image signal cycle $T_{in}$, when the length of a cycle for reversing the polarity is approximately the same as that of the input image signal cycle $T_{in}$, two sets of writing of a positive signal and two sets of writing of a negative signal are alternately performed. The length of the cycle for reversing the polarity is made larger than that of the signal writing cycle in such a manner, whereby the frequency of charge and discharge of a pixel can be reduced, so that power consumption can be reduced. Note that when the cycle for reversing the polarity is made too long, a defect sometimes occurs in which luminance difference due to the difference of polarity is recognized as a flicker; therefore, it is preferable that the length of the cycle for reversing the polarity be substantially the same as or smaller than that of the input image signal cycle $T_{in}$.

Embodiment 11

Next, another structure example and a driving method of a display device will be described. In this embodiment, a method will be described by which an image that compensates motion of an image (an input image) which is input from the outside of a display device is generated inside the display device on the basis of a plurality of input images and the generated image (the generation image) and the input image are sequentially displayed. Note that when an image for interpolating motion of an input image is a generation image, motion of moving images can be made smooth, and decrease in quality of moving images because of afterimages or the like due to hold driving can be suppressed. Here, moving image interpolation is described below. Ideally, display of moving images is realized by controlling the luminance of each pixel in real time; however, individual control of pixels in real time has problems such as the enormous number of control circuits, space for wirings, and the enormous amount of input image data. Thus, it is difficult to realize the individual control of pixels. Therefore, for display of moving images by a display device, a plurality of still images are sequentially displayed in a certain cycle so that display appears to be moving images. The cycle (in this embodiment, referred to as an input image signal cycle and denoted by $T_{in}$) is standardized, and for example, $\frac{1}{60}$ second in NTSC and $\frac{1}{50}$ second in PAL. Such a cycle does not cause a problem of moving image display in a CRT, which is an impulsive display device. However, in a hold-type display device, when moving images conforming to these standards are displayed without change, a defect (hold blur) in which display is blurred because of afterimages or the like due to hold driving occurs. Since hold blur is recognized by discrepancy between unconscious motion interpolation due to human eye tracking and hold-type display, the hold blur can be reduced by making the input image signal cycle shorter than that in conventional standards (by making the control closer to individual control of pixels in real time). However, it is difficult to reduce the length of the input image signal cycle because the standard needs to be changed and the amount of data is increased. However, when an image for interpolating motion of an input image is generated inside the display device on the basis of a standardized input image signal and display is performed while the generation image interpolates the input image, hold blur can be reduced without change in the standard or increase in the amount of data. Operation such that an image signal is generated inside the display device on the basis of an input image signal to interpolate motion of the input image is referred to as moving image interpolation.

Figure 43A:
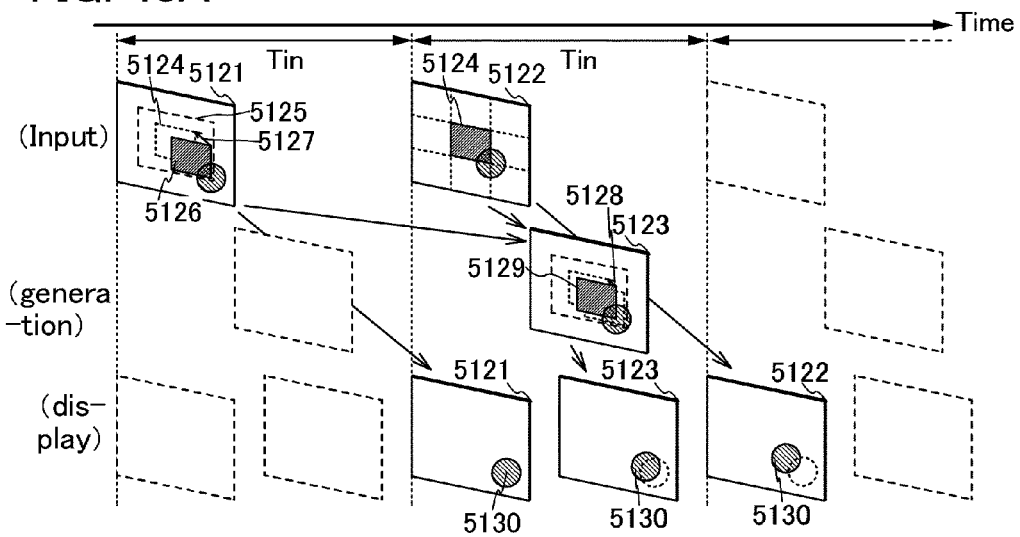
FIGS. 43A to 43C each illustrate a semiconductor device.
Figure 43B:
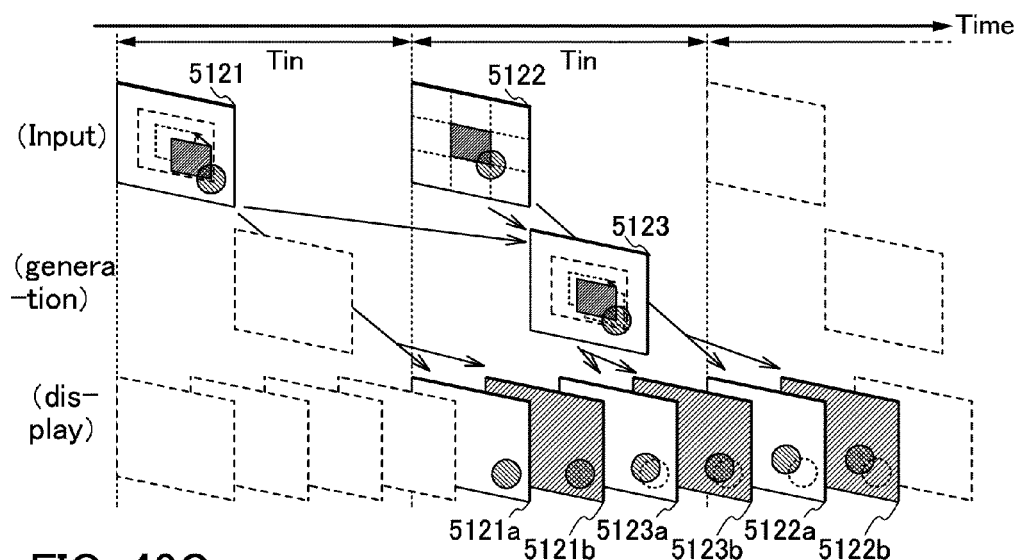

By a method for interpolating moving images in this embodiment, motion blur can be reduced. The method for interpolating moving images in this embodiment can include an image generation method and an image display method. Further, by using a different image generation method and/or a different image display method for motion with a specific pattern, motion blur can be effectively reduced. FIGS. 43A and 43B are schematic diagrams each illustrating an example of a method for interpolating moving images in this embodiment. FIGS. 43A and 43B each illustrate timing of treating each image by using the position of the horizontal direction, with the time as the horizontal axis. A portion represented as "input" indicates timing at which an input image signal is input. Here, images 5121 and 5122 are focused as two images that are temporally adjacent to each other. An input image is input at an interval of the cycle $T_{in}$. Note that the length of one cycle $T_{in}$ is referred to as one frame or one frame period in some cases. A portion represented as "generation" indicates timing at which a new image is generated from an input image signal. Here, an image 5123 which is a generation image generated on the basis of the images 5121 and 5122 is focused. A portion represented as "display" indicates timing at which an image is displayed in the display device. Note that images other than the focused images are only represented by dashed lines, and by treating such images in a manner similar to that of the focused images, the example of the method for interpolating moving images in this embodiment can be realized.

In the example of the method for interpolating moving images in this embodiment, as illustrated in FIG. 43A, a generation image which is generated on the basis of two input images that are temporally adjacent is displayed in a period after one image is displayed until the other image is displayed, so that moving image interpolation can be performed. In this case, a display cycle of a display image is preferably half of an input cycle of the input image. Note that the display cycle is not limited to this and can be a variety of display cycles. For example, when the length of the display cycle is smaller than half of that of the input cycle, moving images can be displayed more smoothly. Alternatively, when the length of the display cycle is larger than half of that of the input cycle, power consumption can be reduced. Note that here, an image is generated on the basis of two input images which are temporally adjacent; however, the number of input images to be used is not limited to two and can be other numbers. For example, when an image is generated on the basis of three (or more than three) input images which are temporally adjacent, a generation image with higher accuracy can be obtained as compared to the case where an image is generated on the basis of two input images. Note that the display timing of the image 5121 is the same as the input timing of the image 5122, that is, the display timing is one frame later than the input timing. However, the display timing in the method for interpolating moving images in this embodiment is not limited to this and can be a variety of display timings. For example, the display timing can be delayed with respect to the input timing by more than one frame. Thus, the display timing of the image 5123 which is the generation image can be delayed, which allows enough time to generate the image 5123 and leads to reduction in power consumption and manufacturing cost. Note that when the display timing is significantly delayed with respect to the input timing, a period for holding an input image becomes longer, and the memory capacity for holding the input image is increased. Therefore, the display timing is preferably delayed with respect to the input timing by approximately one to two frames.

Here, an example of a specific generation method of the image 5123, which is generated on the basis of the images 5121 and 5122, is described. It is necessary to detect motion of an input image in order to interpolate moving images. In this embodiment, a method called a block matching method can be used in order to detect motion of an input image. Note that this embodiment is not limited to this, and a variety of methods (e.g., a method for obtaining a difference of image data or a method using Fourier transformation) can be used. In the block matching method, first, image data for one input image (here, image data of the image 5121) is stored in a data storage means (e.g., a memory circuit such as a semiconductor memory or a RAM). Then, an image in the next frame (here, the image 5122) is divided into a plurality of regions. Note that the divided regions can have the same rectangular shapes as illustrated in FIG. 43A; however, the divided regions are not limited to them and can have a variety of shapes (e.g., the shape or size varies depending on images). After that, in each divided region, data is compared to the image data in the previous frame (here, the image data of the image 5121), which is stored in the data storage means, so that a region where the image data is similar to each other is searched. FIG. 43A illustrates an example in which the image 5121 is searched for a region where data is similar to that of a region 5124 in the image 5122, and a region 5126 is found. Note that a search range is preferably limited when the image 5121 is searched. In the example of FIG. 43A, a region 5125 which is approximately four times as large as the region 5124 is set as the search range. By making the search range larger than this, detection accuracy can be increased even in a moving image with high-speed motion. Note that search in an excessively wide range needs an enormous amount of time, which makes it difficult to realize detection of motion. Thus, the region 5125 is preferably approximately two to six times as large as the area of the region 5124. After that, a difference of the position between the searched region 5126 and the region 5124 in the image 5122 is obtained as a motion vector 5127. The motion vector 5127 represents motion of image data in the region 5124 in one frame period. Then, in order to generate an image showing the intermediate state of motion, an image generation vector 5128 obtained by changing the size of the motion vector without change in the direction thereof is generated, and image data included in the region 5126 of the image 5121 is moved in accordance with the image generation vector 5128, so that image data in a region 5129 of the image 5123 is generated. By performing a series of processings on the entire region of the image 5122, the image 5123 can be generated. Then, by sequentially displaying the input image 5121, the generation image 5123, and the input image 5122, moving images can be interpolated. Note that the position of an object 5130 in the image is different (i.e., the object is moved) between the images 5121 and 5122. In the generated image 5123, the object is located at the midpoint between the object in the image 5121 and the object in the image 5122. By displaying such images, motion of moving images can be made smooth, and blur of moving images due to afterimages or the like can be reduced.

Note that the size of the image generation vector 5128 can be determined in accordance with the display timing of the image 5123. In the example of FIG. 43A, since the display timing of the image 5123 is the midpoint ($\frac{1}{2}$) between the display timings of the images 5121 and 5122, the size of the image generation vector 5128 is half of that of the motion vector 5127. Alternatively, for example, when the display timing is $\frac{1}{3}$ between the display timings of the images 5121 and 5122, the size of the image generation vector 5128 can be $\frac{1}{3}$, and when the display timing is $\frac{2}{3}$ between the display timings of the images 5121 and 5122, the size of the image generation vector 5128 can be $\frac{2}{3}$.

Note that in the case where a new image is generated by moving a plurality of regions having different motion vectors in this manner, a portion where one region has already been moved to a region that is a destination for another region or a portion to which any region is not moved is generated in some cases (i.e., overlap or blank occurs in some cases). For such portions, data can be compensated. As a method for compensating an overlap portion, a method by which overlap data is averaged; a method by which data is arranged in order of priority according to the direction of motion vectors or the like, and high-priority data is used as data in a generation image; or a method by which one of color and brightness is arranged in order of priority and the other thereof is averaged can be used, for example. As a method for compensating a blank portion, a method by which image data of the portion of the image 5121 or the image 5122 is used as data in a generation image without modification, a method by which image data of the portion of the image 5121 or the image 5122 is averaged, or the like can be used. Then, the generated image 5123 is displayed at the timing in accordance with the size of the image generation vector 5128, so that motion of moving images can be made smooth, and the decrease in quality of moving images because of afterimages or the like due to hold driving can be suppressed.

In another example of the method for interpolating moving images in this embodiment, as illustrated in FIG. 43B, when a generation image which is generated on the basis of two input images that are temporally adjacent is displayed in a period after one image is displayed until the other image is displayed, each display image is divided into a plurality of subimages to be displayed. Thus, moving images can be interpolated. This case can have advantages of displaying a dark image at regular intervals (advantages of making a display method closer to impulsive display) in addition to advantages of a shorter image display cycle. In other words, blur of moving images due to afterimages or the like can be further reduced as compared to the case where the length of the image display cycle is just made to half of that of the image input cycle. In the example of FIG. 43B, "input" and "generation" can be similar to the processing in the example of FIG. 43A; therefore, the description thereof is not repeated. For "display" in the example of FIG. 43B, one input image and/or one generation image can be divided into a plurality of subimages to be displayed. Specifically, as illustrated in FIG. 43B, the image 5121 is divided into subimages 5121a and 5121b and the subimages 5121a and 5121b are sequentially displayed so as to make human eyes perceive that the image 5121 is displayed; the image 5123 is divided into subimages 5123a and 5123b and the subimages 5123a and 5123b are sequentially displayed so as to make human eyes perceive that the image 5123 is displayed; and the image 5122 is divided into subimages 5122a and 5122b and the subimages 5122a and 5122b are sequentially displayed so as to make human eyes perceive that the image 5122 is displayed. That is, the display method can be made closer to impulsive display while the images perceived by human eyes are similar to those in the example of FIG. 43A, so that blur of moving images due to afterimages or the like can be further reduced. Note that the number of division of subimages is two in FIG. 43B; however, the number of division of subimages is not limited to this and can be other numbers. Note that subimages are displayed at regular intervals ($\frac{1}{2}$) in FIG. 43B; however, timing of displaying subimages is not limited to this and can be a variety of timings. For example, when timing of displaying dark subimages (5121b, 5122b, and 5123b) is made earlier (specifically, timing at $\frac{1}{4}$ to $\frac{1}{2}$), the display method can be made much closer to impulsive display, so that blur of moving images due to afterimages or the like can be further reduced. Alternatively, when the timing of displaying the dark subimages is delayed (specifically, timing at $\frac{1}{2}$ to $\frac{3}{4}$), the length of a period for displaying a bright image can be increased, so that the display efficiency can be increased and power consumption can be reduced.

Figure 43C:
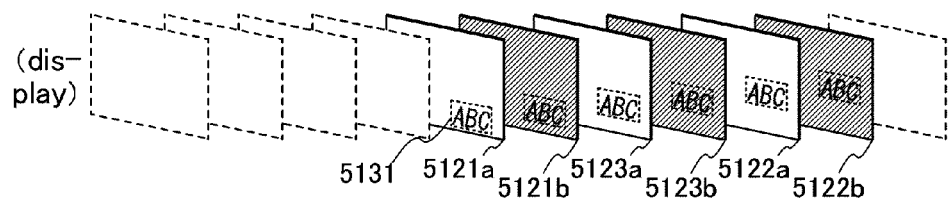

Another example of the method for interpolating moving images in this embodiment is an example in which the shape of an object which is moved in an image is detected and different processings are performed depending on the shape of the moving object. FIG. 43C shows display timing as in the example of FIG. 43B and illustrates the case where moving letters (also referred to as scrolling texts, subtitles, captions, or the like) are displayed. Note that since "input" and "generation" may be similar to those in FIG. 43B, they are not illustrated in FIG. 43C. The amount of blur of moving images by hold driving varies depending on properties of a moving object in some cases. In particular, blur is often recognized remarkably when letters are moved. This is because eyes track moving letters to read the letters, so that hold blur is likely to occur. Further, since letters often have clear outlines, blur due to hold blur is further emphasized in some cases. That is, determining whether an object which is moved in an image is a letter and performing special processing when the object is the letter are effective in reducing hold blur. Specifically, when edge detection, pattern detection, and/or the like are/is performed on an object which is moved in an image and the object is determined to be a letter, motion compensation is performed even on subimages generated by division of one image so that an intermediate state of motion is displayed. Thus, motion can be made smooth. In the case where the object is determined not to be a letter, when subimages are generated by division of one image as illustrated in FIG. 43B, the subimages can be displayed without change in the position of the moving object. FIG. 43C illustrates the example in which a region 5131 which is determined to be letters is moved upward, and the position of the region 5131 is different between the images 5121a and 5121b. Similarly, the position of the region 5131 is different between the images 5123a and 5123b, and between the images 5122a and 5122b. Accordingly, motion of letters for which hold blur is particularly easily recognized can be made smoother than that by normal motion compensation frame rate doubling, so that blur of moving images due to afterimages or the like can be further reduced.

Embodiment 12

The semiconductor device can be applied to a variety of electronic devices (including amusement machines). Examples of electronic devices are television devices (also referred to as televisions or television receivers), monitors for computers and the like, cameras such as digital cameras and digital video cameras, digital photo frames, mobile phone devices (also referred to as mobile phones or cellular phones), portable game machines, portable information terminals, sound reproducing devices, and large game machines such as pachinko machines.

Figure 31A:
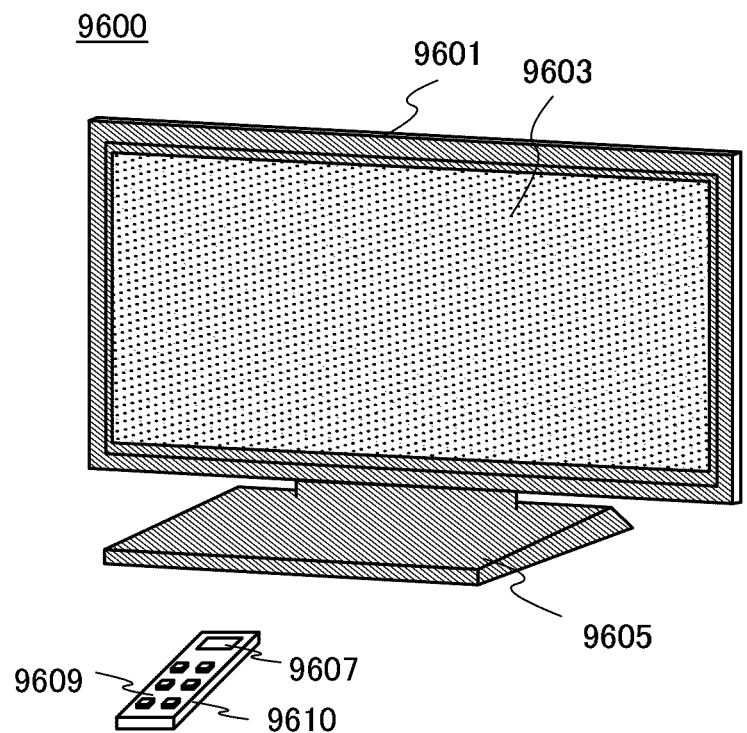
FIGS. 31A and 31B are external views of an example of a television device and a digital photo frame, respectively.

FIG. 31A illustrates an example of a television device 9600. In the television device 9600, a display portion 9603 is incorporated into a housing 9601. The display portion 9603 can display an image. Further, the housing 9601 is supported by a stand 9605 here.

The television device 9600 can be operated with an operation switch of the housing 9601 or a separate remote controller 9610. With an operation key 9609 of the remote controller 9610, channels and volume can be controlled and an image displayed on the display portion 9603 can be controlled. Further, the remote controller 9610 may be provided with a display portion 9607 for displaying data output from the remote controller 9610.

Note that the television device 9600 is provided with a receiver, a modem, and the like. With the receiver, general television broadcast can be received. Further, when the television device 9600 is connected to a communication network by wired or wireless connection via the modem, one-way (from a transmitter to a receiver) or two-way (between a transmitter and a receiver or between receivers) data communication can be performed.

Figure 31B:
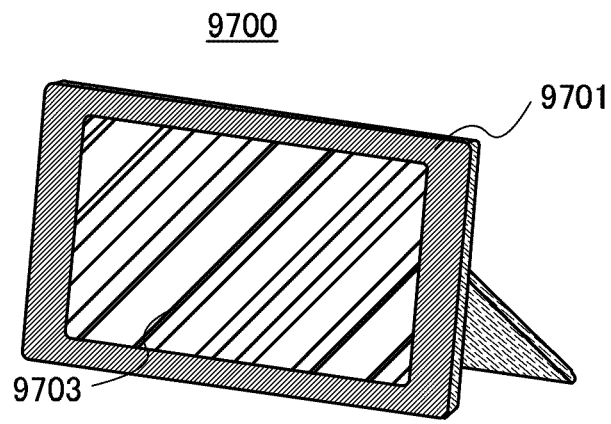

FIG. 31B illustrates an example of a digital photo frame 9700. For example, in the digital photo frame 9700, a display portion 9703 is incorporated into a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection portion (e.g., a USB terminal or a terminal which can be connected to various cables such as a USB cable), a recording medium insertion portion, and the like. Although these components may be provided on the surface on which the display portion is provided, it is preferable to provide them on the side surface or the rear surface for the design of the digital photo frame 9700. For example, a memory storing data of an image taken with a digital camera is inserted in the recording medium insertion portion of the digital photo frame, and the image data can be transferred and then displayed on the display portion 9703.

Further, the digital photo frame 9700 may be configured to transmit and receive data wirelessly. The structure may be employed in which desired image data is transferred wirelessly to be displayed.

Figure 32A:
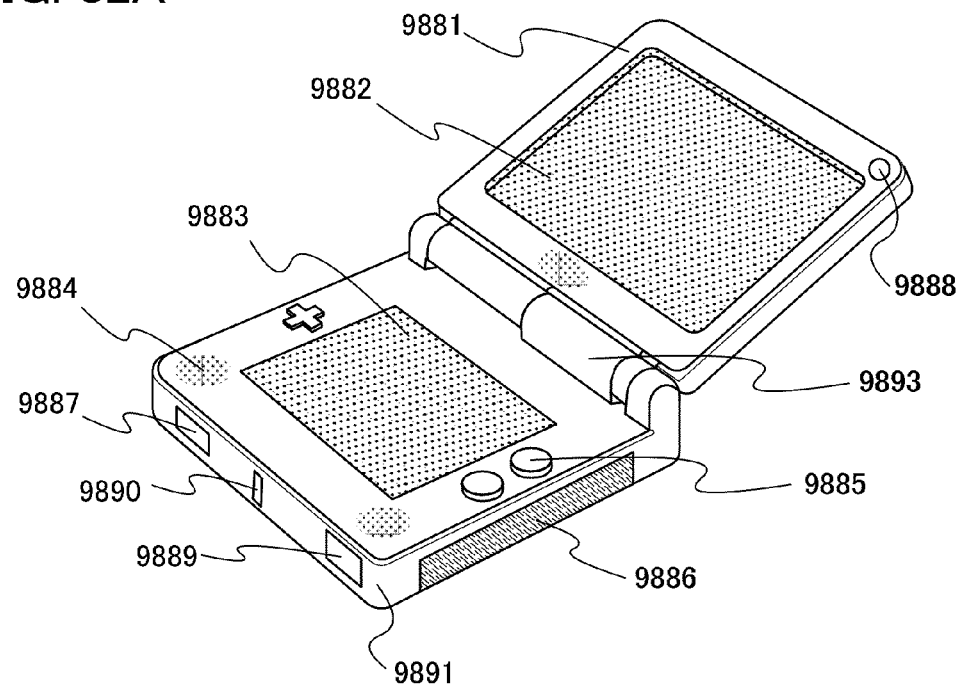
FIGS. 32A and 32B are external views each illustrating an example of an amusement machine.

FIG. 32A is a portable game machine including two housings of a housing 9881 and a housing 9891. The housings 9881 and 9891 are connected with a joint portion 9893 so that the portable game machine can be opened and folded. A display portion 9882 is incorporated into the housing 9881, and a display portion 9883 is incorporated into the housing 9891. Moreover, the portable game machine illustrated in FIG. 32A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game machine is not limited to that described above. The portable game machine can have a structure in which additional accessory equipment is provided as appropriate as long as at least the semiconductor device is provided. The portable game machine in FIG. 32A has a function of reading a program or data stored in a recording medium to display it on the display portion, and a function of sharing information with another portable game machine by wireless communication. Note that a function of the portable game machine in FIG. 32A is not limited to those described above, and the portable game machine can have a variety of functions.

Figure 32B:
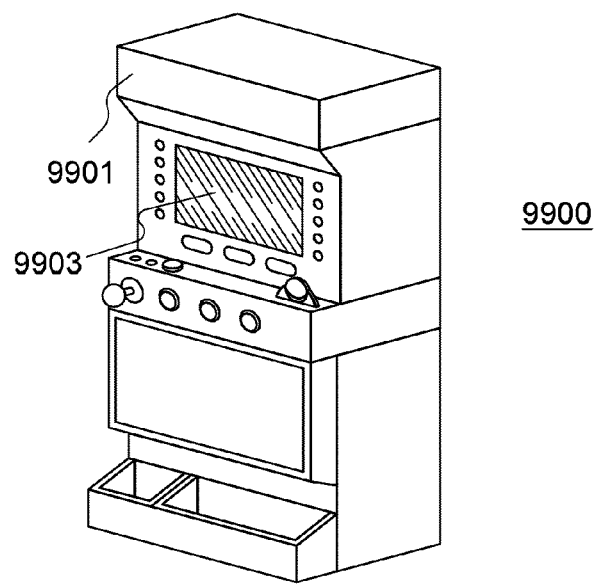

FIG. 32B illustrates an example of a slot machine 9900, which is a large amusement machine. In the slot machine 9900, a display portion 9903 is incorporated into a housing 9901. Moreover, the slot machine 9900 is provided with operation means such as a start lever and a stop switch, a coin slot, a speaker, and the like. Needless to say, the structure of the slot machine 9900 is not limited to the above structure. The slot machine can have a structure in which additional accessory equipment is provided as appropriate as long as at least the semiconductor device is provided.

Figure 33A:
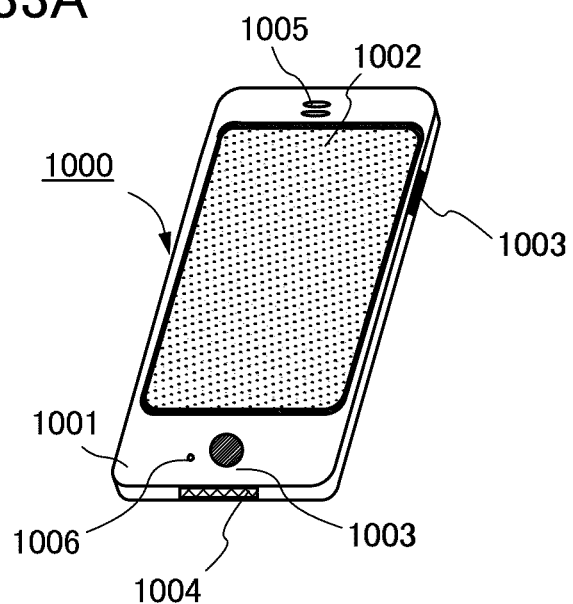
FIGS. 33A and 33B are external views each illustrating an example of a mobile phone.

FIG. 33A illustrates an example of a mobile phone 1000. The mobile phone 1000 is provided with a display portion 1002 incorporated into a housing 1001, an operation button 1003, an external connection port 1004, a speaker 1005, a microphone 1006, and the like.

When the display portion 1002 of the mobile phone 1000 illustrated in FIG. 33A is touched with a finger or the like, data can be input into the mobile phone 1000. Further, operation such as making calls and texting can be performed by touching the display portion 1002 with a finger or the like.

There are mainly three screen modes of the display portion 1002. The first mode is a display mode mainly for displaying an image. The second mode is an input mode mainly for inputting data such as text. The third mode is a display-and-input mode, which is a combination of the two modes, that is, a combination of the display mode and the input mode.

For example, in the case of making a call or texting, a text input mode mainly for inputting text is selected for the display portion 1002 so that letters displayed on a screen can be input. In that case, it is preferable to display a keyboard or number buttons on most of the screen of the display portion 1002.

When a detection device including a sensor for detecting inclination, such as a gyroscope or an acceleration sensor, is provided inside the mobile phone 1000, display on the screen of the display portion 1002 can be automatically changed by determining the orientation of the mobile phone 1000 (whether the mobile phone 1000 stands upright or is laid down on its side).

The screen modes are changed by touching the display portion 1002 or using the operation buttons 1003 of the housing 1001. Alternatively, the screen modes may be changed depending on the kind of image displayed on the display portion 1002. For example, when a signal of an image displayed on the display portion is data of moving images, the screen mode is changed to the display mode. When the signal is text data, the screen mode is changed to the input mode.

Further, in the input mode, when input by touching the display portion 1002 is not performed for a certain period while a signal detected by an optical sensor in the display portion 1002 is detected, the screen mode may be controlled so as to be changed from the input mode to the display mode.

The display portion 1002 can also function as an image sensor. For example, an image of a palm print, a fingerprint, or the like is taken when the display portion 1002 is touched with a palm or a finger, whereby personal identification can be performed. Further, when a backlight which emits near-infrared light or a sensing light source which emits near-infrared light is provided in the display portion, an image of a finger vein, a palm vein, or the like can be taken.

Figure 33B:
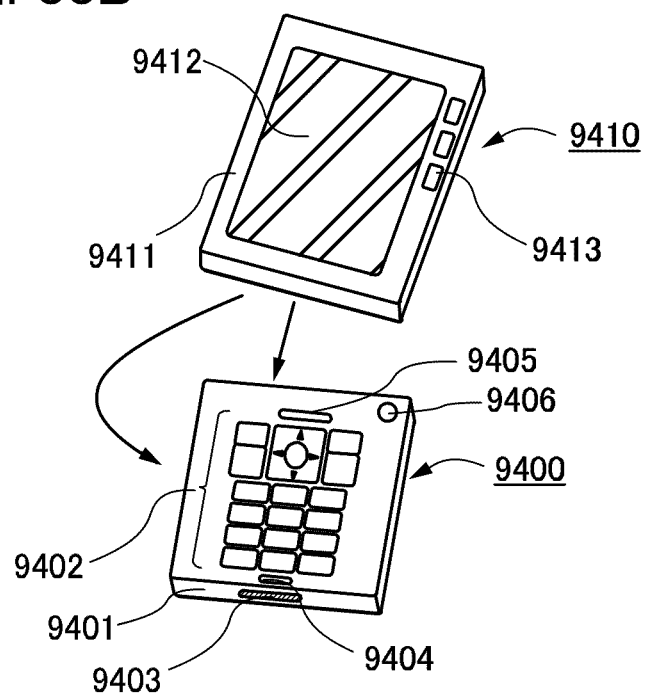

FIG. 33B illustrates another example of a mobile phone. The mobile phone in FIG. 33B includes a display device 9410 in a housing 9411, which includes a display portion 9412 and operation buttons 9413; and a communication device 9400 in a housing 9401, which includes manual operation buttons 9402, an external input terminal 9403, a microphone 9404, a speaker 9405, and a light-emitting portion 9406 that emits light when receiving a call. The display device 9410 having a display function can be detached from and attached to the communication device 9400 having a telephone function in two directions shown by arrows. Accordingly, short axes of the display device 9410 and the communication device 9400 can be attached to each other, or long axes of the display device 9410 and the communication device 9400 can be attached to each other. Further, when only a display function is necessary, the display device 9410 may be detached from the communication device 9400 so that the semiconductor device 9410 can be used by itself. The communication device 9400 and the display device 9410 can transmit and receive images or input information to/from each other by wireless communication or wired communication, and each of the communication device 9400 and the display device 9410 has a rechargeable battery.

Note that this embodiment can be implemented in combination with any of the other embodiments as appropriate.

This application is based on Japanese Patent Application serial no. 2009-051857 filed with Japan Patent Office on Mar. 5, 2009, the entire contents of which are hereby incorporated by reference.

What is claimed is:

1. A semiconductor device comprising:
a substrate having an insulating surface;
a first electrode that has a light-transmitting property and is provided over the substrate;
a second electrode that has a light-transmitting property and is provided over the substrate;
a semiconductor layer that has a light-transmitting property and is provided so as to be electrically connected to the first electrode and the second electrode;
a first wiring electrically connected to the first electrode;
an insulating layer provided so as to cover at least the semiconductor layer;
a third electrode that has a light-transmitting property over a portion of the insulating layer and overlapping the semiconductor layer; and
a second wiring electrically connected to the third electrode.

2. The semiconductor device according to claim 1, further comprising a fourth electrode that has a light-transmitting property and is electrically connected to the second electrode.

3. The semiconductor device according to claim 1, further comprising:
a fifth electrode provided so as to overlap with part of the second electrode with the insulating layer interposed between the fifth electrode and the part of the second electrode, and formed by using the same layer as the third electrode; and
a third wiring electrically connected to the fifth electrode and formed using the same layer as the second wiring.

4. A semiconductor device comprising:
a substrate having an insulating surface;
a first electrode that has a light-transmitting property and is provided over the substrate;
a second electrode that has a light-transmitting property and is provided over the substrate;
a semiconductor layer that has a light-transmitting property and is provided so as to be electrically connected to the first electrode and the second electrode;
a first wiring electrically connected to the first electrode;
an insulating layer provided so as to cover at least the semiconductor layer;
a third electrode that has a light-transmitting property over a portion of the insulating layer and overlapping the semiconductor layer; and
a second wiring electrically connected to the third electrode,
wherein the semiconductor layer comprises an oxide semiconductor containing indium, gallium, and zinc.

5. The semiconductor device according to claim 1, wherein each of the first electrode, the second electrode, and the third electrode is formed using any one of indium tin oxide, indium tin oxide containing silicon oxide, organoindium, organotin, zinc oxide, titanium nitride, indium zinc oxide containing zinc oxide, a material obtained by adding gallium to zinc oxide, tin oxide, indium oxide containing tungsten oxide, indium zinc oxide containing tungsten oxide, indium oxide containing titanium oxide, and indium tin oxide containing titanium oxide.

6. The semiconductor device according to claim 1, wherein the first wiring and the second wiring have a light-shielding property.

7. The semiconductor device according to claim 1, wherein a layer formed by using the same layer as the semiconductor layer is provided at an intersection of the first wiring and the second wiring.

8. The semiconductor device according to claim 4, further comprising a fourth electrode that has a light-transmitting property and is electrically connected to the second electrode.

9. The semiconductor device according to claim 4, further comprising:
- a fifth electrode provided so as to overlap with part of the second electrode with the insulating layer interposed between the fifth electrode and the part of the second electrode, and formed by using the same layer as the third electrode; and
- a third wiring electrically connected to the fifth electrode and formed using the same layer as the second wiring.

10. The semiconductor device according to claim 4, wherein each of the first electrode, the second electrode, and the third electrode is formed using any one of indium tin oxide, indium tin oxide containing silicon oxide, organoindium, organotin, zinc oxide, titanium nitride, indium zinc oxide containing zinc oxide, a material obtained by adding gallium to zinc oxide, tin oxide, indium oxide containing tungsten oxide, indium zinc oxide containing tungsten oxide, indium oxide containing titanium oxide, and indium tin oxide containing titanium oxide.

11. The semiconductor device according to claim 4, wherein the first wiring and the second wiring have a light-shielding property.

12. The semiconductor device according to claim 4, wherein a layer formed by using the same layer as the semiconductor layer is provided at an intersection of the first wiring and the second wiring.

13. A display device comprising:
- a substrate having an insulating surface;
- a first electrode that has a light-transmitting property and is provided over the substrate;
- a second electrode that has a light-transmitting property and is provided over the substrate;
- a semiconductor layer that has a light-transmitting property and is provided so as to be electrically connected to the first electrode and the second electrode;
- a first wiring electrically connected to the first electrode;
- an insulating layer provided so as to cover at least the semiconductor layer;
- a third electrode that has a light-transmitting property over a portion of the insulating layer and overlapping the semiconductor layer;
- a second wiring electrically connected to the third electrode; and
- a pixel electrode that has a light-transmitting property and is electrically connected to the second electrode.

14. The display device according to claim 13, wherein a layer formed by using the same layer as the semiconductor layer is provided at an intersection of the first wiring and the second wiring.

15. The display device according to claim 13, further comprising:
- a fifth electrode provided so as to overlap with part of the second electrode with the insulating layer interposed between the fifth electrode and the part of the second electrode, and formed by using the same layer as the third electrode; and
- a third wiring electrically connected to the fifth electrode and formed using the same layer as the second wiring.

16. The display device according to claim 13, wherein each of the first electrode, the second electrode, and the third electrode is formed using any one of indium tin oxide, indium tin oxide containing silicon oxide, organoindium, organotin, zinc oxide, titanium nitride, indium zinc oxide containing zinc oxide, a material obtained by adding gallium to zinc oxide, tin oxide, indium oxide containing tungsten oxide, indium zinc oxide containing tungsten oxide, indium oxide containing titanium oxide, and indium tin oxide containing titanium oxide.

17. The display device according to claim 13, wherein the first wiring and the second wiring have a light-shielding property.

* * * * *

UNITED STATES PATENT AND TRADEMARK OFFICE
CERTIFICATE OF CORRECTION

| | | |
|---|---|---|
| PATENT NO. | : 8,461,582 B2 | Page 1 of 1 |
| APPLICATION NO. | : 12/711674 | |
| DATED | : June 11, 2013 | |
| INVENTOR(S) | : Hajime Kimura | |

It is certified that error appears in the above-identified patent and that said Letters Patent is hereby corrected as shown below:

In the Specification

At column 35, line 37, "mask;" should be --mask,--;

At column 46, line 64, "FIG. 268" should be --FIG. 26B--;

At column 53, line 35, "$5080\_j+1$," should be --$5080\_i+1$,--;

At column 54, line 12, "voltage," should be --voltage--.

Signed and Sealed this

Eleventh Day of February, 2014

Michelle K. Lee
*Deputy Director of the United States Patent and Trademark Office*